(12) United States Patent
Shirley, Jr. et al.

(10) Patent No.: US 9,781,207 B2
(45) Date of Patent: Oct. 3, 2017

(54) DISPERSED STORAGE BASED ON ESTIMATED LIFE AND METHODS FOR USE THEREWITH

(71) Applicant: CLEVERSAFE, INC., Chicago, IL (US)

(72) Inventors: Thomas Franklin Shirley, Jr., Wauwatosa, WI (US); S. Christopher Gladwin, Chicago, IL (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 14/315,925

(22) Filed: Jun. 26, 2014

(65) Prior Publication Data

US 2015/0067101 A1 Mar. 5, 2015

Related U.S. Application Data

(60) Provisional application No. 61/871,649, filed on Aug. 29, 2013.

(51) Int. Cl.
| | |
|---|---|
| G06F 11/07 | (2006.01) |
| G06F 12/14 | (2006.01) |
| G06F 3/06 | (2006.01) |
| G08B 23/00 | (2006.01) |
| H04L 29/08 | (2006.01) |
| G06F 17/30 | (2006.01) |
| G06F 11/10 | (2006.01) |
| G11C 29/44 | (2006.01) |

(52) U.S. Cl.
CPC ...... *H04L 67/1097* (2013.01); *G06F 11/1096* (2013.01); *G06F 17/30091* (2013.01); *G06F 17/30864* (2013.01); *G11C 29/44* (2013.01); *H04L 67/32* (2013.01); *G06F 11/1076* (2013.01); *G06F 2211/1028* (2013.01); *G11C 2029/4402* (2013.01)

(58) Field of Classification Search
CPC .............. G06F 11/008; G06F 11/0727; G06F 11/3058; G06F 2209/5019
See application file for complete search history.

(56) References Cited

U.S. PATENT DOCUMENTS

| | | | |
|---|---|---|---|
| 4,092,732 | A | 5/1978 | Ouchi |
| 5,454,101 | A | 9/1995 | Mackay et al. |
| 5,485,474 | A | 1/1996 | Rabin |
| (Continued) | | | |

OTHER PUBLICATIONS

Shamir; How to Share a Secret; Communications of the ACM; vol. 22, No. 11; Nov. 1979; pp. 612-613.

(Continued)

*Primary Examiner* — Nicholas Taylor
*Assistant Examiner* — Ho Shiu
(74) *Attorney, Agent, or Firm* — Garlick & Markison; Timothy W. Markison; Shayne X. Short

(57) ABSTRACT

A dispersed storage and task (DST) processing unit receives a data access request. An estimated end of life is determined for a plurality of DST execution units. A subset of the plurality of DST execution units is selected, based on a threshold number associated with the data access request and further based on the estimated end of life for the subset of the plurality of DST execution units. The data access request is executed via the subset of the plurality of DST execution units.

20 Claims, 54 Drawing Sheets

(56) References Cited

U.S. PATENT DOCUMENTS

| | | | |
|---|---|---|---|
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0229069 A1 | 10/2005 | Hassner | |
| 2006/0047907 A1 | 3/2006 | Shiga et al. | |
| 2006/0080327 A1* | 4/2006 | Gramling | G06Q 10/10 |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters, III et al. | |
| 2008/0195365 A1* | 8/2008 | Ohkura | E02F 9/26 703/8 |
| 2009/0077398 A1* | 3/2009 | Bland | G06F 1/329 713/320 |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2011/0219118 A1* | 9/2011 | Cowan | G06F 11/3409 709/224 |
| 2013/0198588 A1* | 8/2013 | Resch | G06F 17/30106 714/763 |
| 2014/0145846 A1* | 5/2014 | Krishna | G06Q 10/0639 340/540 |
| 2014/0297926 A1* | 10/2014 | Ono | G06F 3/0688 711/103 |
| 2015/0205657 A1* | 7/2015 | Clark | G06F 11/008 714/47.3 |
| 2015/0281015 A1* | 10/2015 | Griffith | H04L 43/08 709/224 |
| 2015/0331621 A1* | 11/2015 | Slik | G06F 3/0619 711/114 |
| 2015/0331632 A1* | 11/2015 | Slik | G06F 3/0625 711/154 |
| 2015/0331774 A1* | 11/2015 | Slik | G06F 11/3034 714/6.23 |
| 2015/0331775 A1* | 11/2015 | Slik | G06F 11/3034 714/6.23 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

(56) References Cited

OTHER PUBLICATIONS

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner distributed computing system 10

| DST allocation info 242 | data partition info 320: data ID; No. of partitions; Addr. info for each partition; format conversion indication |
|---|---|

| | task execution info 322 | | | | intermediate result info 324 | | |
|---|---|---|---|---|---|---|---|
| task 326 | task ordering 328 | data partition 330 | set of DT EX mods 332 | Name 334 | interm. result processing 336 | scratch pad storage 338 | intermediate result storage 340 |
| 1_1 | none | 2_1 - 2_z | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4  2_5 - 2_z | 1_1, 2_1, 3_1, 4_1, & 5_1  1_2, 2_2, 3_2, 4_2, & 5_2 | R1-3 | DST unit 2 | DST unit 2 | DST units 2-6 |
| 1_4 | after 1_3 | R1-3_1 - R1-3_4  R1-3_5 - R1-3_z | 1_1, 2_1, 3_1, 4_1, & 5_1  1_2, 2_2, 6_1, 7_1, & 7_2 | R1_4 | DST unit 3 | DST unit 3 | DST units 3-7 |
| 1_5 | after 1_4 | R1-4_1 - R1-4_z &  2_1 - 2_z | 1_1, 2_1, 3_1, 4_1, & 5_1 | R1-5 | DST unit 1 | DST unit 1 | DST units 1-5 |
| 1_6 | after 1_1 &  1_5 | R1-1_1 - R1-1_z &  R1-5_1 - R1-5_z | 1_2, 2_2, 3_2, 4_2, & 5_2 | R1-6 | DST unit 2 | DST unit 2 | DST units 2-6 |
| 1_7 | after 1_2 &  1_5 | R1-2_1 - R1-2_z &  R1-5_1 - R1-5_z | 1_2, 2_2, 3_2, 4_2, & 5_2 | R1-7 | DST unit 3 | DST unit 3 | DST units 3-7 |
| 2 | none | 2_1 - 2_z | 3_1, 4_1, 5_1, 6_1, & 7_1 | R2 | DST unit 7 | DST unit 7 | DST units 7, 1-4 |
| 3_1 | none (same as 1_3) | use R1_3 | | R1-1 | | | |
| 3_2 | after 3_1 | R1-3_1 - R1-3_z | 1_2, 2_2, 3_2, 4_2, & 5_2 | R3-2 | DST unit 5 | DST unit 5 | DST units 5,6, 1-3 |

FIG. 32

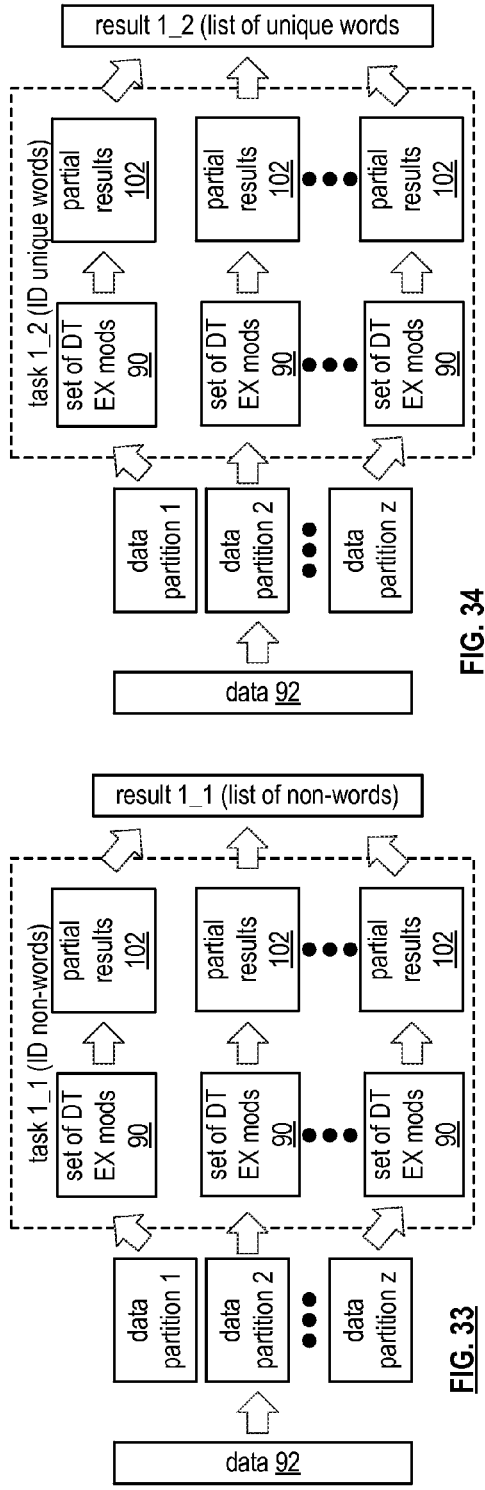
FIG. 34
FIG. 33
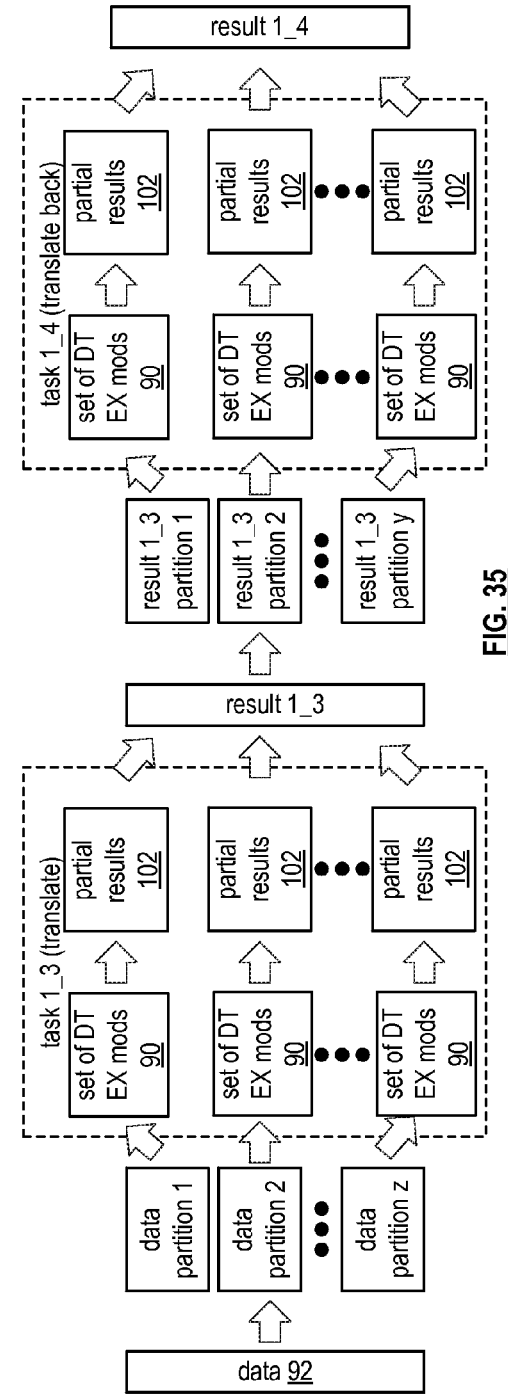
FIG. 35

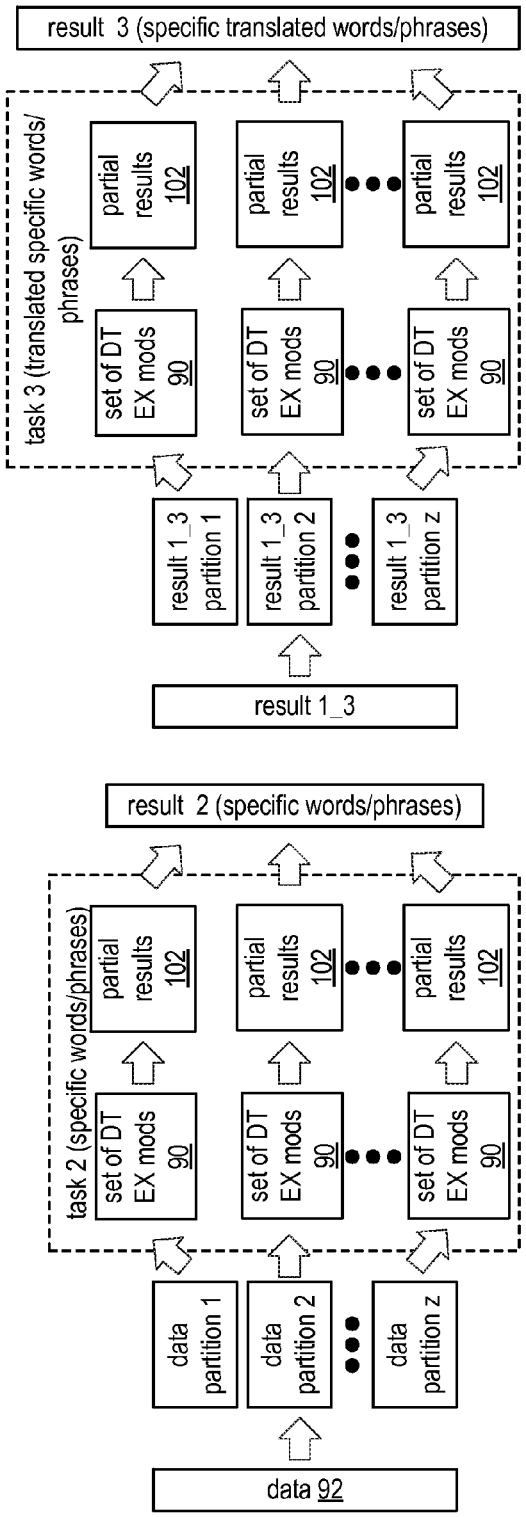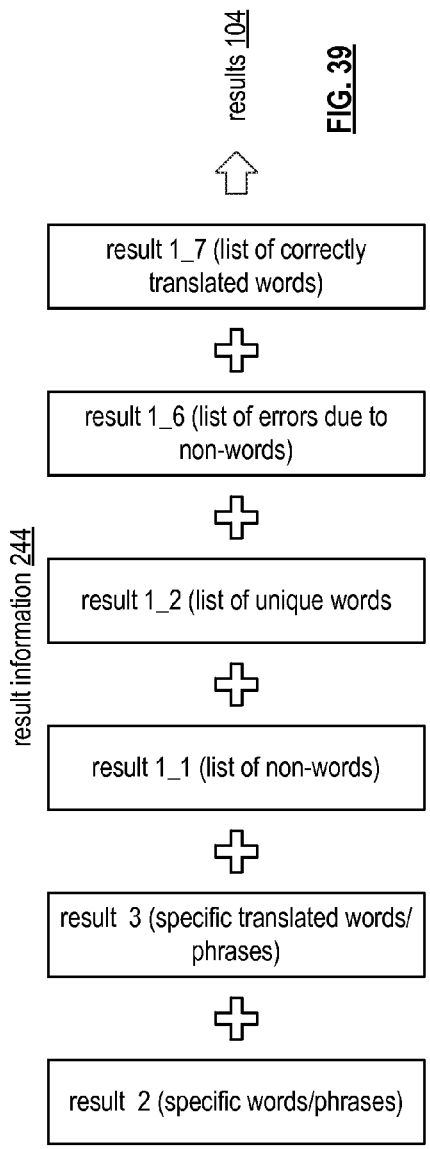

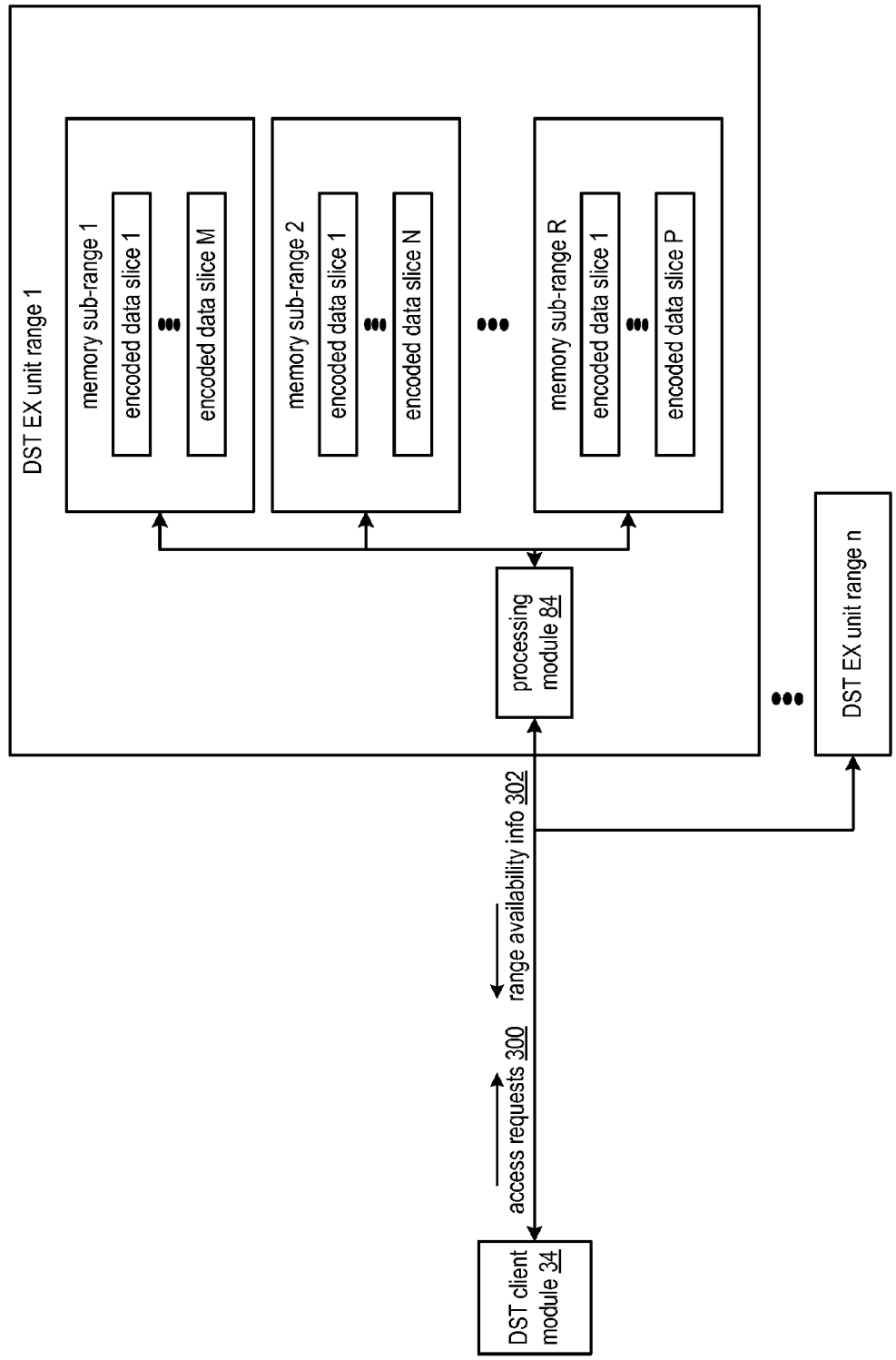

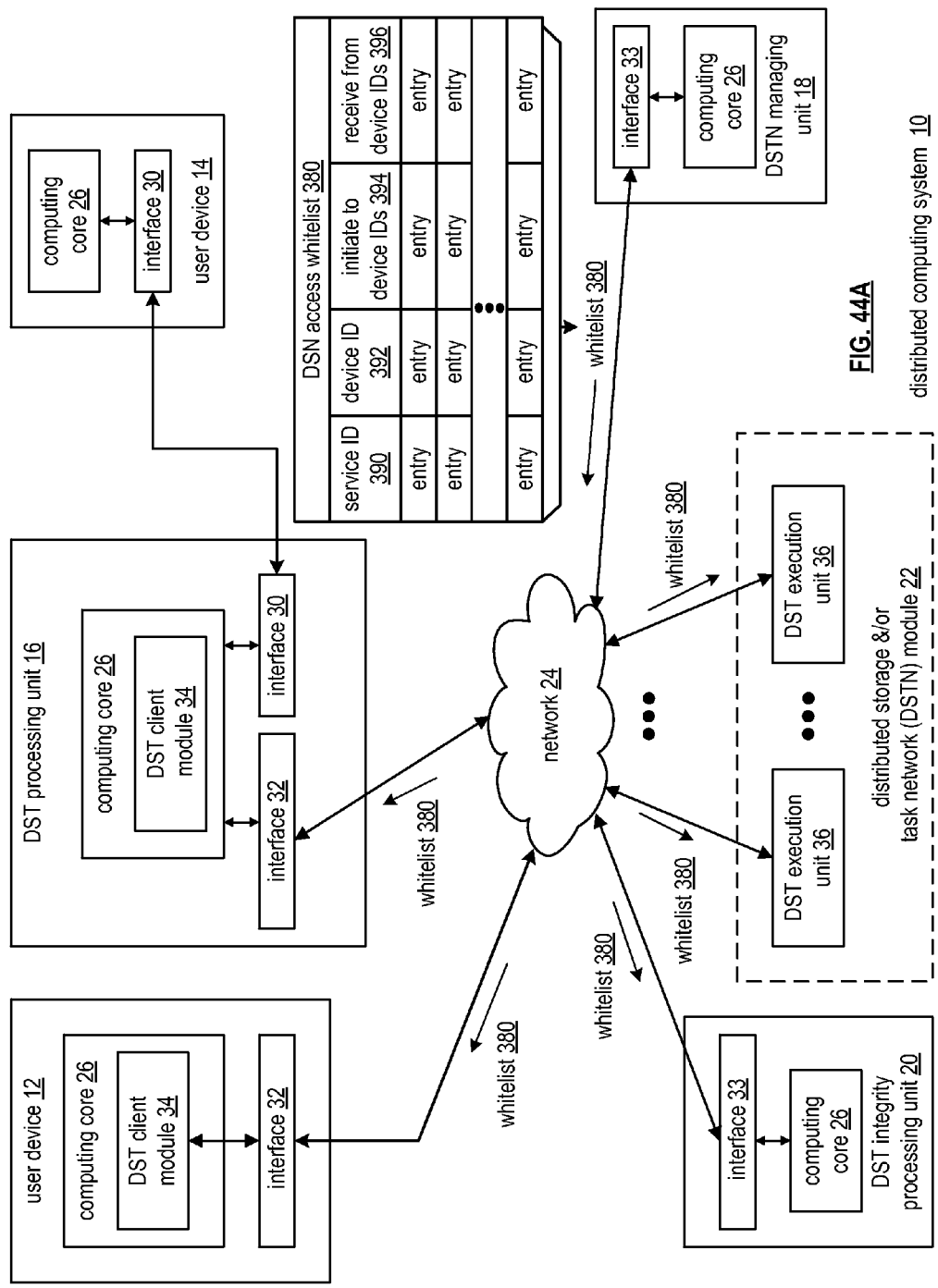

DISPERSED STORAGE BASED ON ESTIMATED LIFE AND METHODS FOR USE THEREWITH

CROSS REFERENCE TO RELATED PATENTS

This patent application is claiming priority under 35 USC §119(e) to a provisionally filed patent application entitled OPTIMIZING DATA STORAGE IN A DISPERSED STORAGE NETWORK having a provisional filing date of Aug. 29, 2013, and a provisional Ser. No. 61/871,649, which is incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

Technical Field of the Invention

This invention relates generally to computer networks and more particularly to dispersed storage of data and distributed task processing of data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 32 is a diagram of an example of DST allocation information for the example of FIG. 30 in accordance with the present invention;

FIGS. 33-38 are schematic block diagrams of the DSTN module performing the example of FIG. 30 in accordance with the present invention;

FIG. 39 is a diagram of an example of combining result information into final results for the example of FIG. 30 in accordance with the present invention;

FIG. 41A is a schematic block diagram of another embodiment of a dispersed storage network in accordance with the present invention;

FIG. 44A is a schematic block diagram of another embodiment of a distributed computing system in accordance with the present invention;

DETAILED DESCRIPTION OF THE INVENTION

Figure 1:
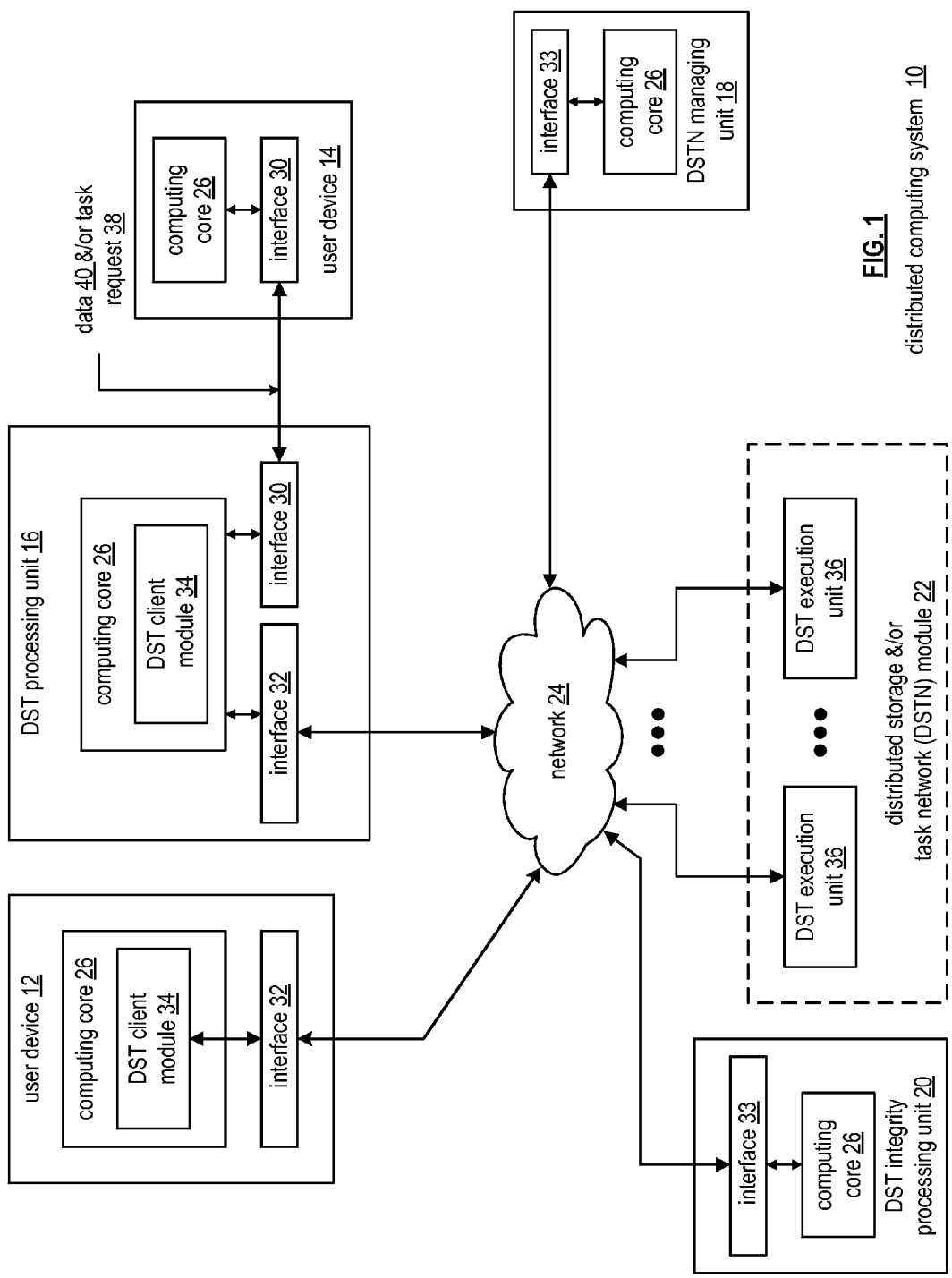
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g. or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations include authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system 10 has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39. With respect to the DST management, it is substantially similar to the DST management to support distributed task processing on received data.

Figure 2:
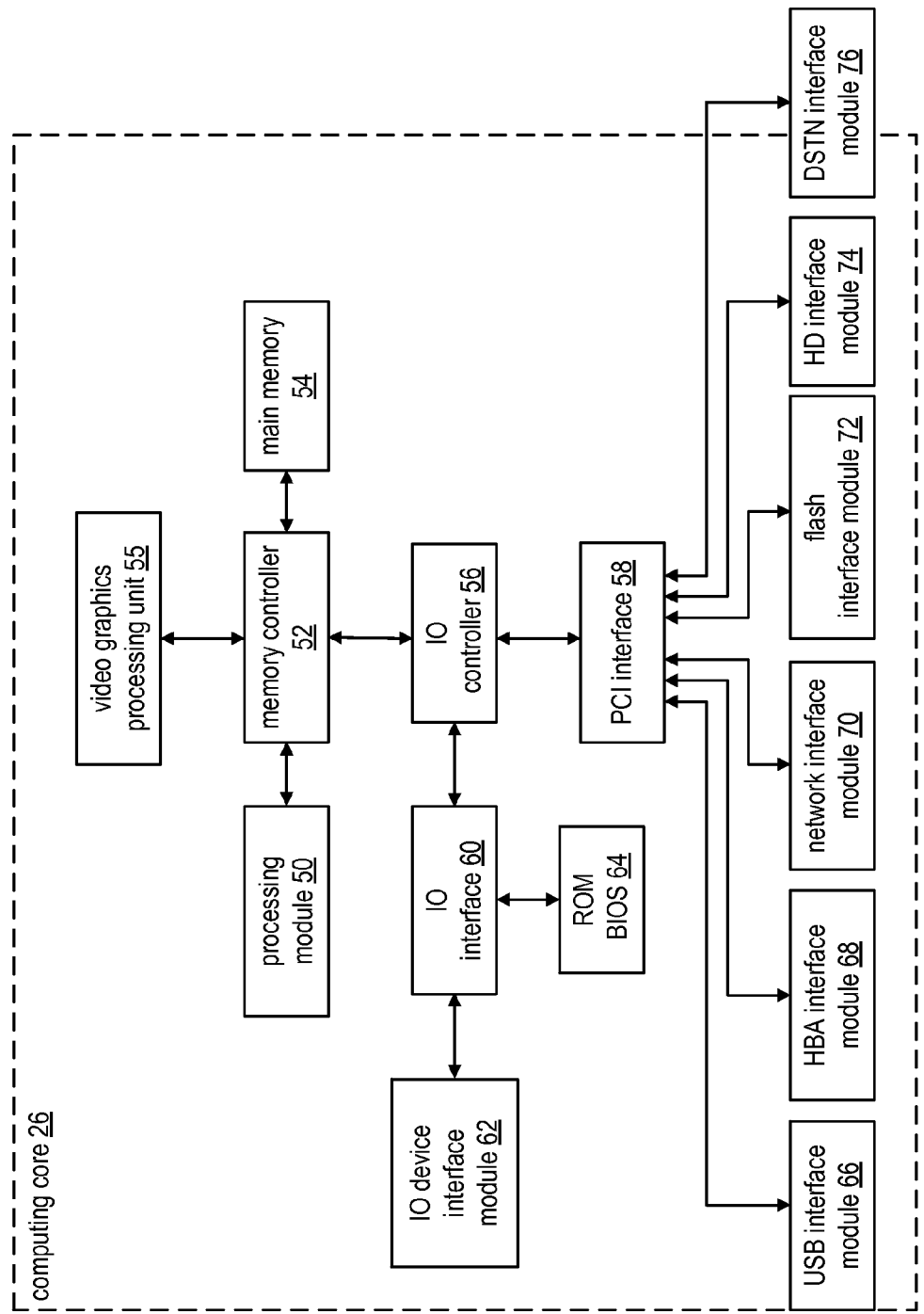
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
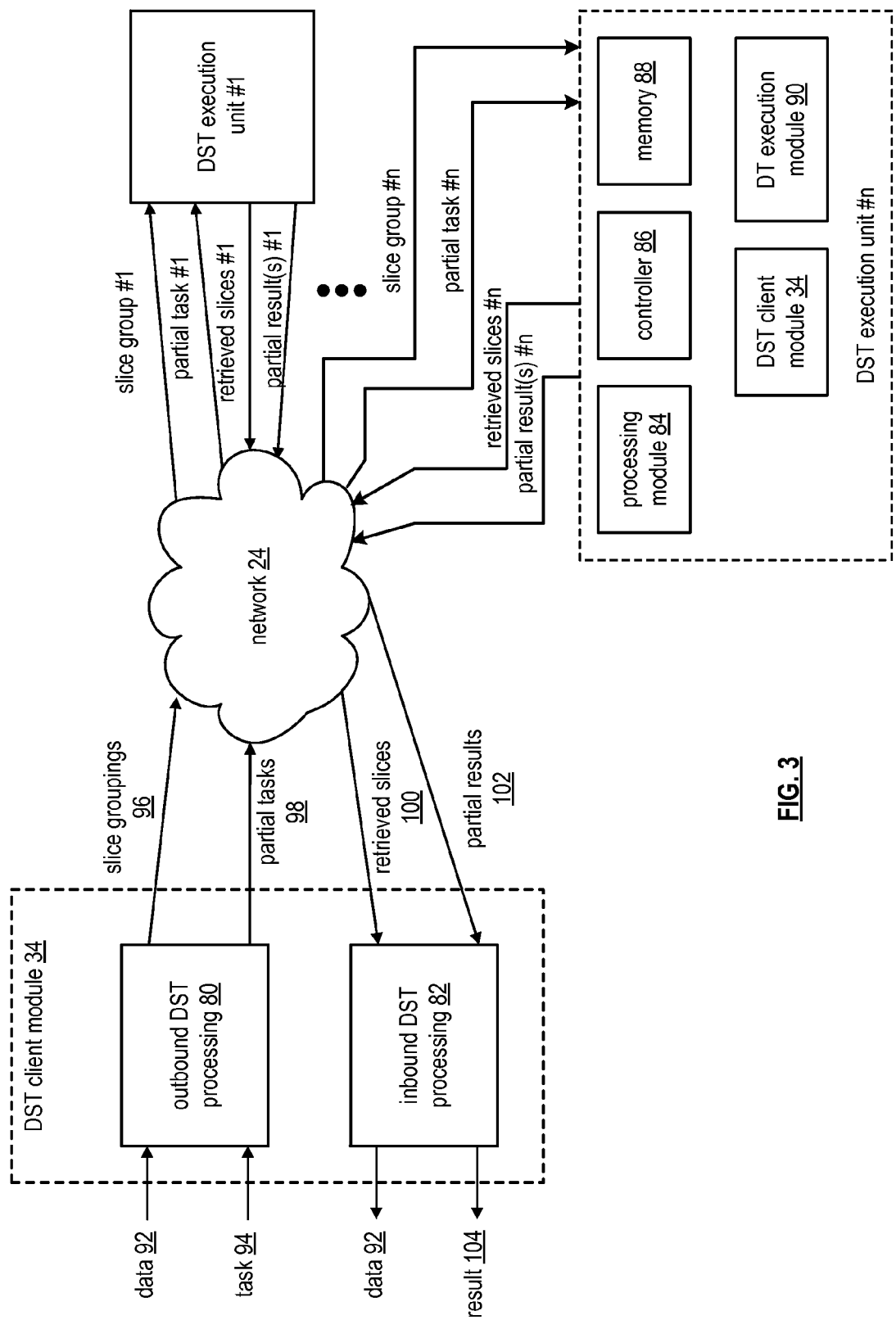
FIG. 3 is a diagram of an example of a distributed storage and task processing in accordance with the present invention.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-n that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-n includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terabytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-n of the DSTN module 22 of FIG. 1. For example, the outbound DST processing section 80 sends slice group 1 and partial task 1 to DST execution unit 1. As another example, the outbound DST processing section 80 sends slice group #n and partial task #n to DST execution unit #n.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-n.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1. The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
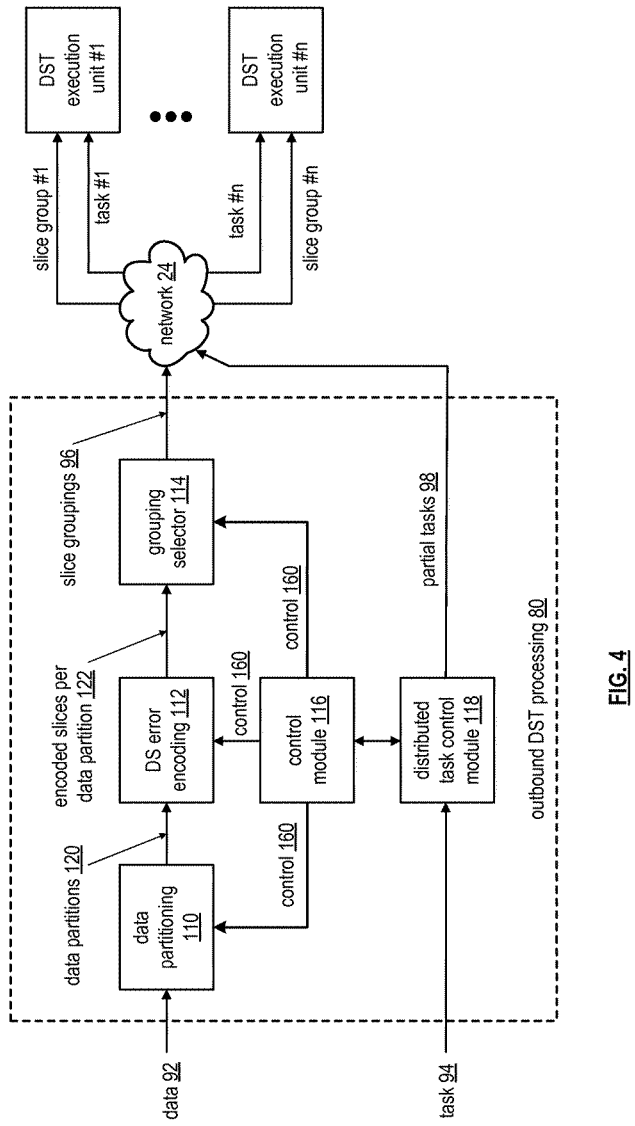
FIG. 4 is a schematic block diagram of an embodiment of an outbound distributed storage and/or task (DST) processing in accordance with the present invention.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terabytes) into 100,000 data segments, each being 1 Gigabyte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94. For example, if five DST execution units 36 are identified for the particular task 94, the grouping selector module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phrase and a second set of partial tasks for finding and counting the second phrase. The distributed task control module 118 sends respective first and/or second partial tasks 98 to each DST execution unit 36.

Figure 5:
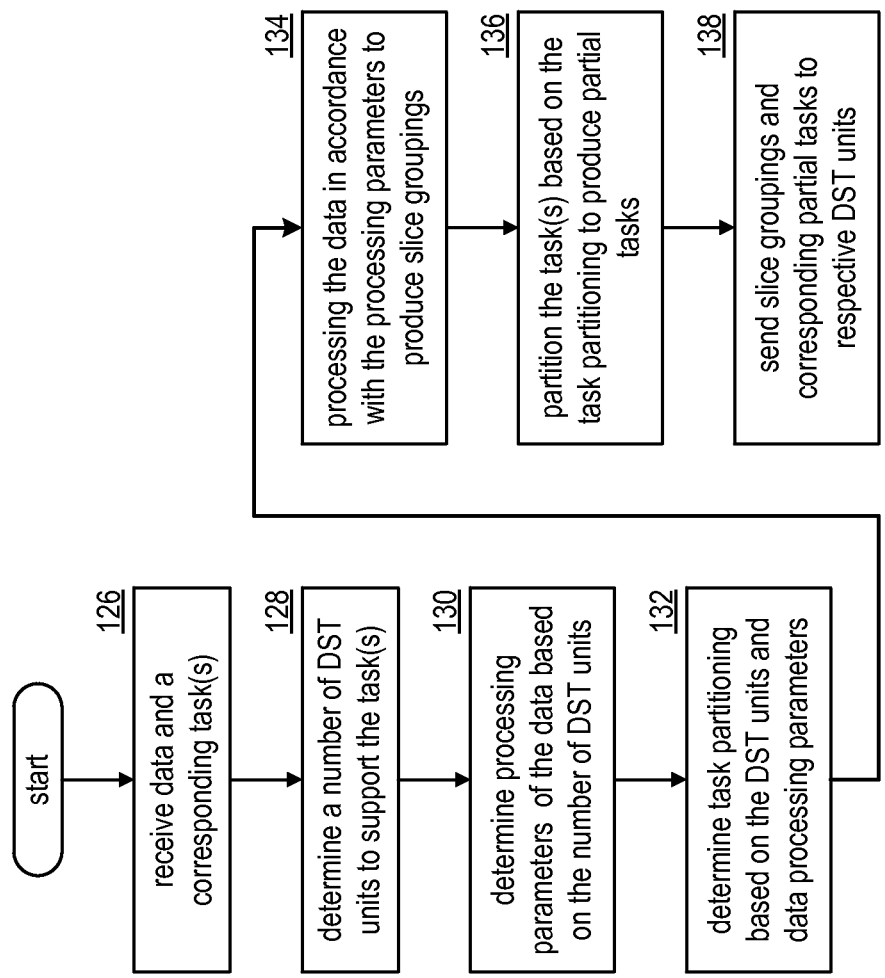
FIG. 5 is a logic diagram of an example of a method for outbound DST processing in accordance with the present invention.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.)), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to respective DST units.

Figure 6:
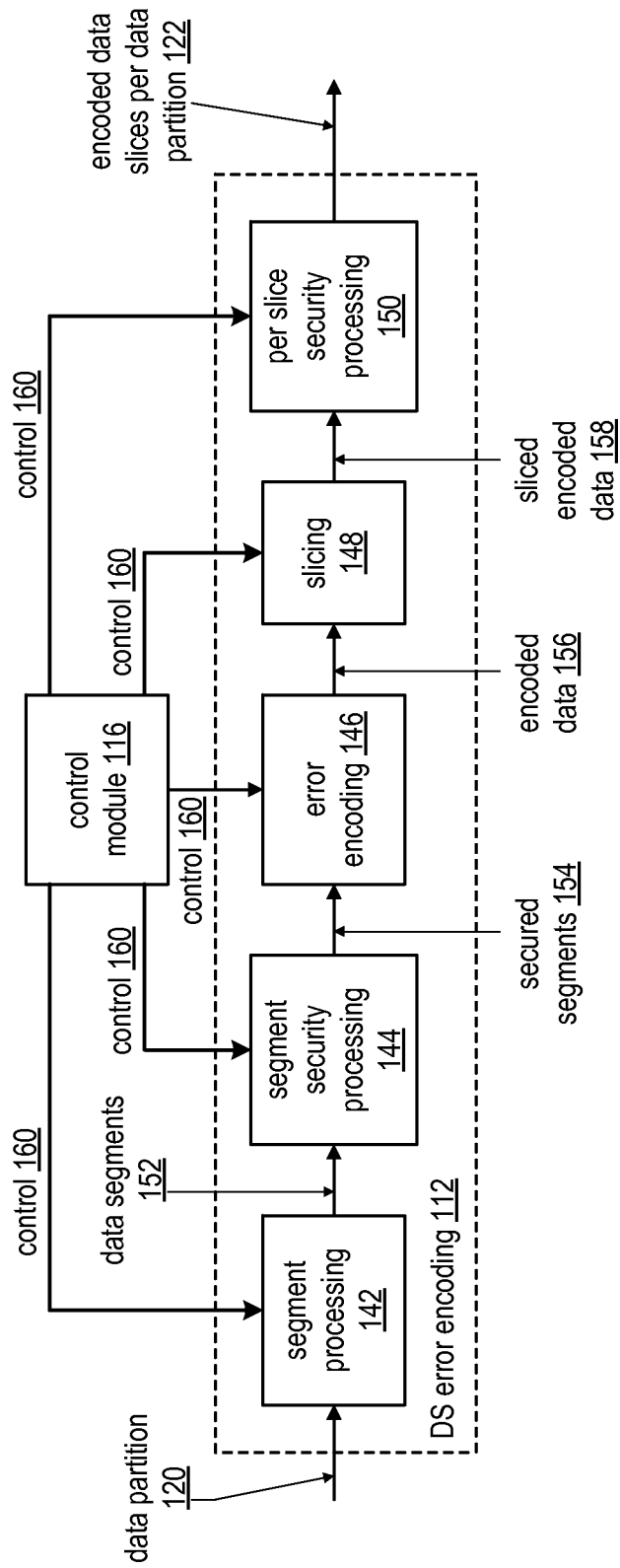
FIG. 6 is a schematic block diagram of an embodiment of a dispersed error encoding in accordance with the present invention.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check (CRC), etc.), and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of encoded data segments 156 for a given data partition, the slicing module outputs a plurality of sets of encoded data slices 158.

The per slice security processing module 150, when enabled by the control module 116, secures each encoded data slice 158 based on slice security information received as control information 160 from the control module 116. The slice security information includes data compression, encryption, watermarking, integrity check (e.g., CRC, etc.), and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
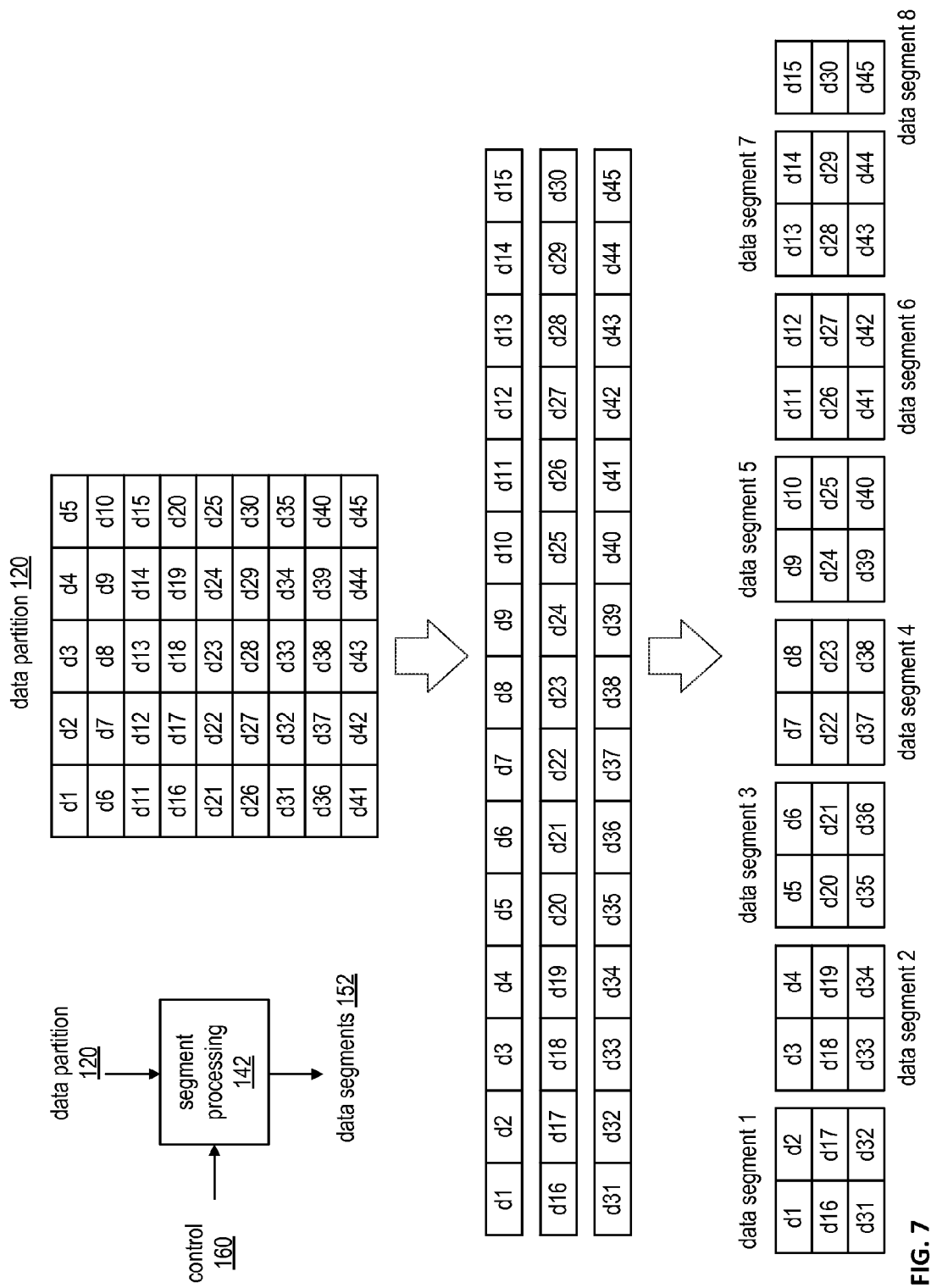
FIG. 7 is a diagram of an example of a segment processing of the dispersed error encoding in accordance with the present invention.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
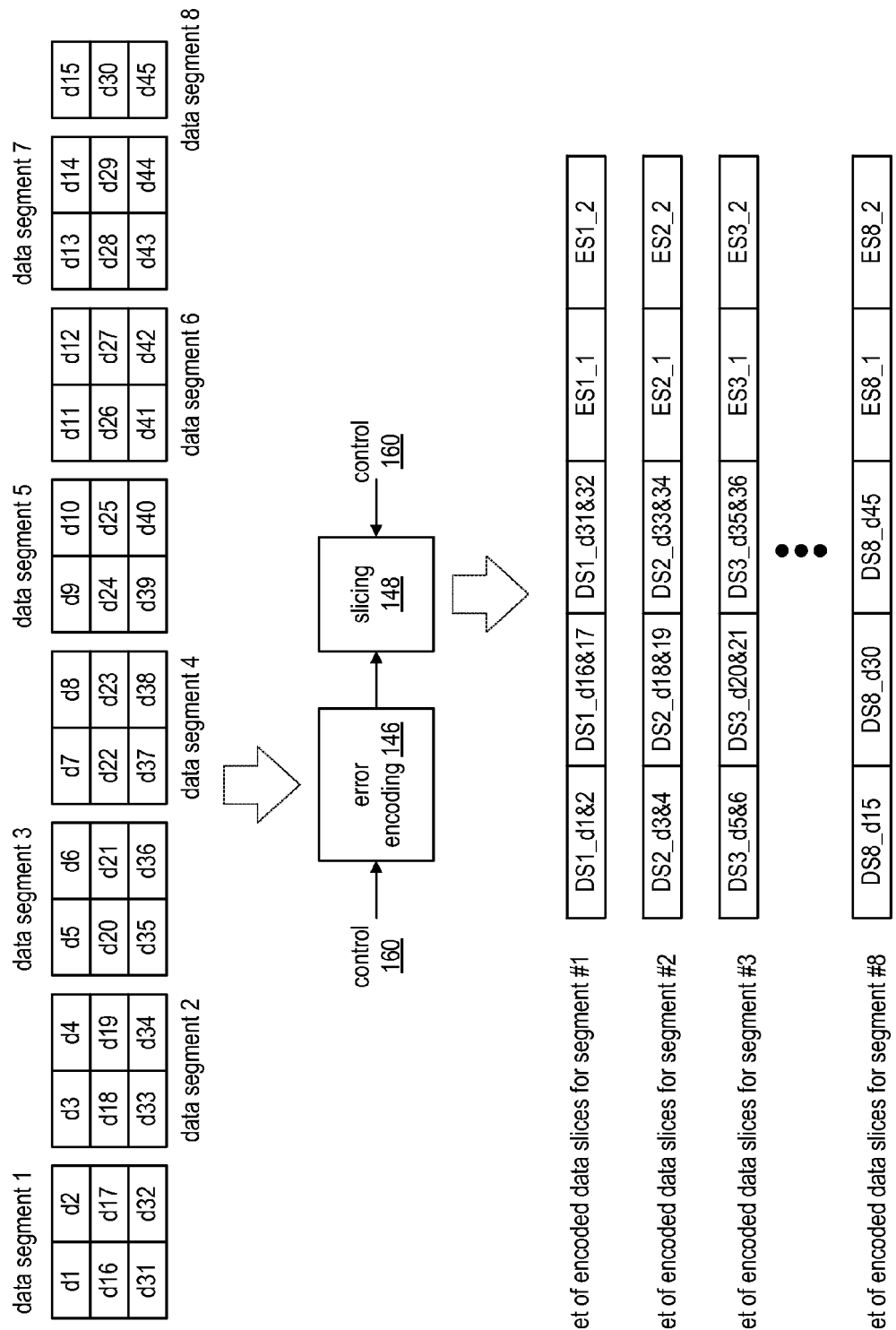
FIG. 8 is a diagram of an example of error encoding and slicing processing of the dispersed error encoding in accordance with the present invention.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first-third words of the first data segment. With such an encoding and slicing scheme, retrieving any three of the five encoded data slices allows the data segment to be accurately reconstructed.

The encoding and slicing of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of the second set of encoded data slices includes error correction data based on the first-third words of the second data segment.

Figure 9:
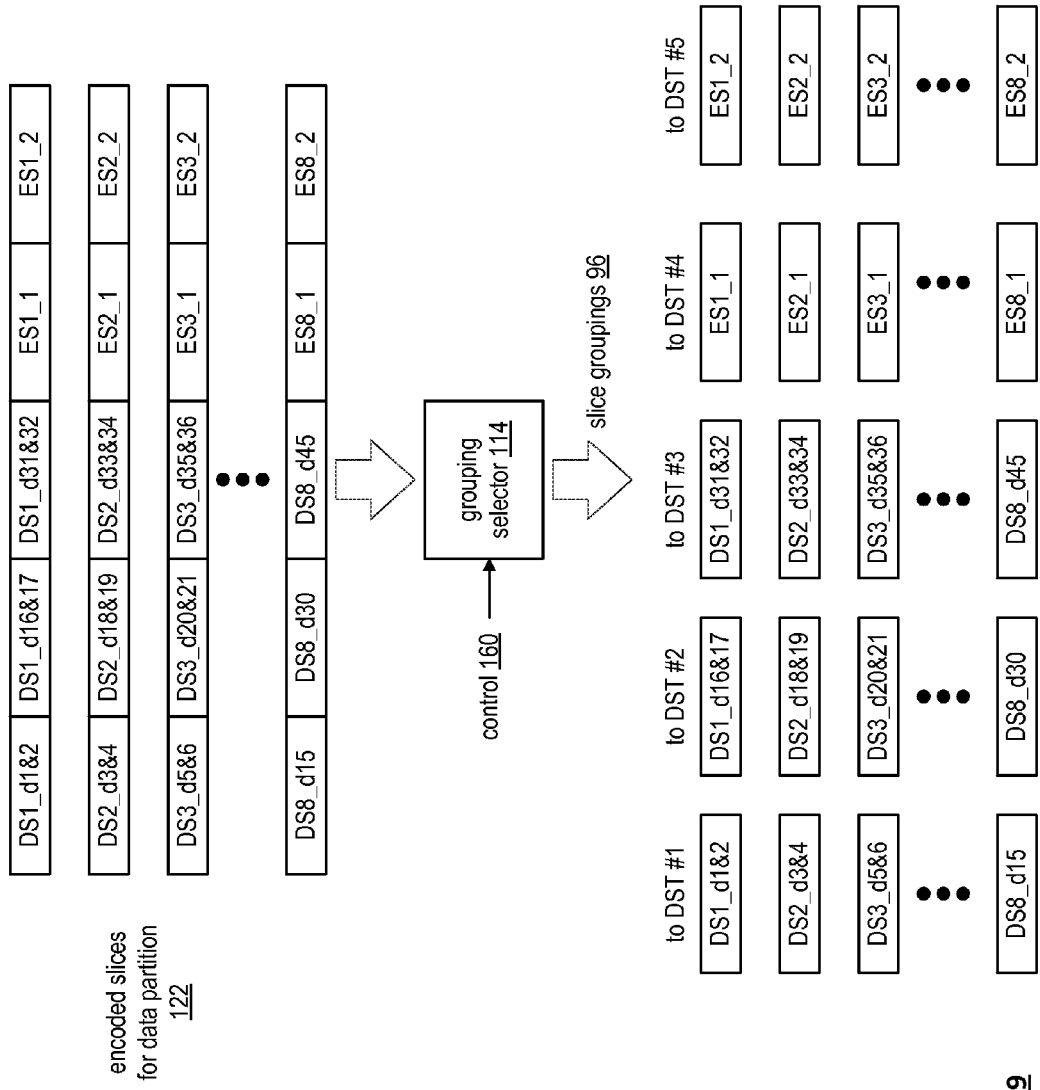
FIG. 9 is a diagram of an example of grouping selection processing of the outbound DST processing in accordance with the present invention.

FIG. 9 is a diagram of an example of grouping selection processing of an outbound distributed storage and task (DST) processing in accordance with group selection information as control information 160 from a control module. Encoded slices for data partition 122 are grouped in accordance with the control information 160 to produce slice groupings 96. In this example, a grouping selector module 114 organizes the encoded data slices into five slice groupings (e.g., one for each DST execution unit of a distributed storage and task network (DSTN) module). As a specific example, the grouping selector module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selector module 114 also creates a second slice grouping for a DST execution unit #2, which includes second encoded slices of each of the sets of encoded slices. As such, the second DST execution unit receives encoded data slices corresponding to data blocks 16-30. The grouping selector module 114 further creates a third slice grouping for DST execution unit #3, which includes third encoded slices of each of the sets of encoded slices. As such, the third DST execution unit receives encoded data slices corresponding to data blocks 31-45.

The grouping selector module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selector module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
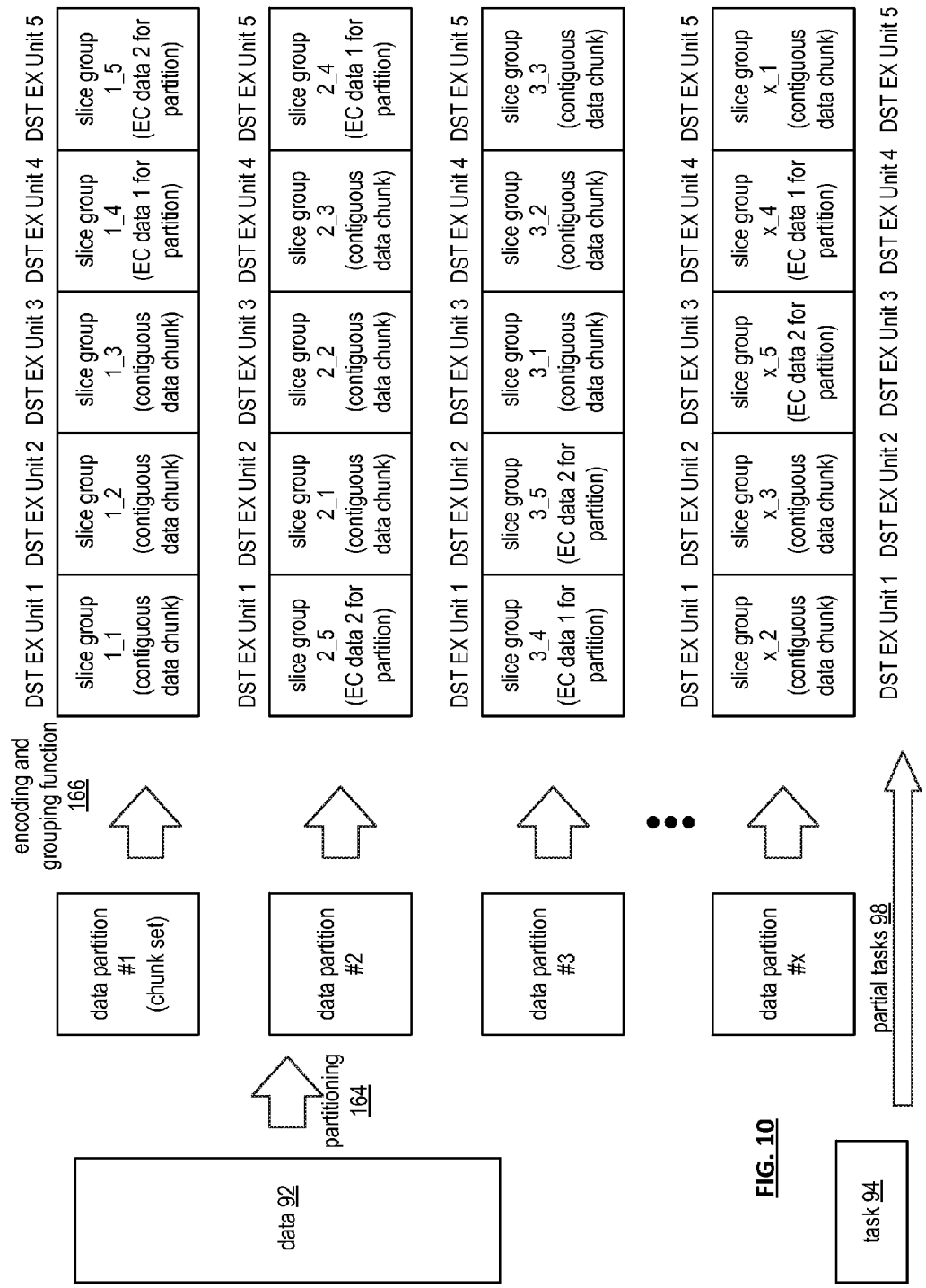
FIG. 10 is a diagram of an example of converting data into slice groups in accordance with the present invention.

FIG. 10 is a diagram of an example of converting data 92 into slice groups that expands on the preceding figures. As shown, the data 92 is partitioned in accordance with a partitioning function 164 into a plurality of data partitions (1-x, where x is an integer greater than 4). Each data partition (or chunkset of data) is encoded and grouped into slice groupings as previously discussed by an encoding and grouping function 166. For a given data partition, the slice groupings are sent to distributed storage and task (DST) execution units. From data partition to data partition, the ordering of the slice groupings to the DST execution units may vary.

For example, the slice groupings of data partition #1 is sent to the DST execution units such that the first DST execution unit receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

Figure 11:
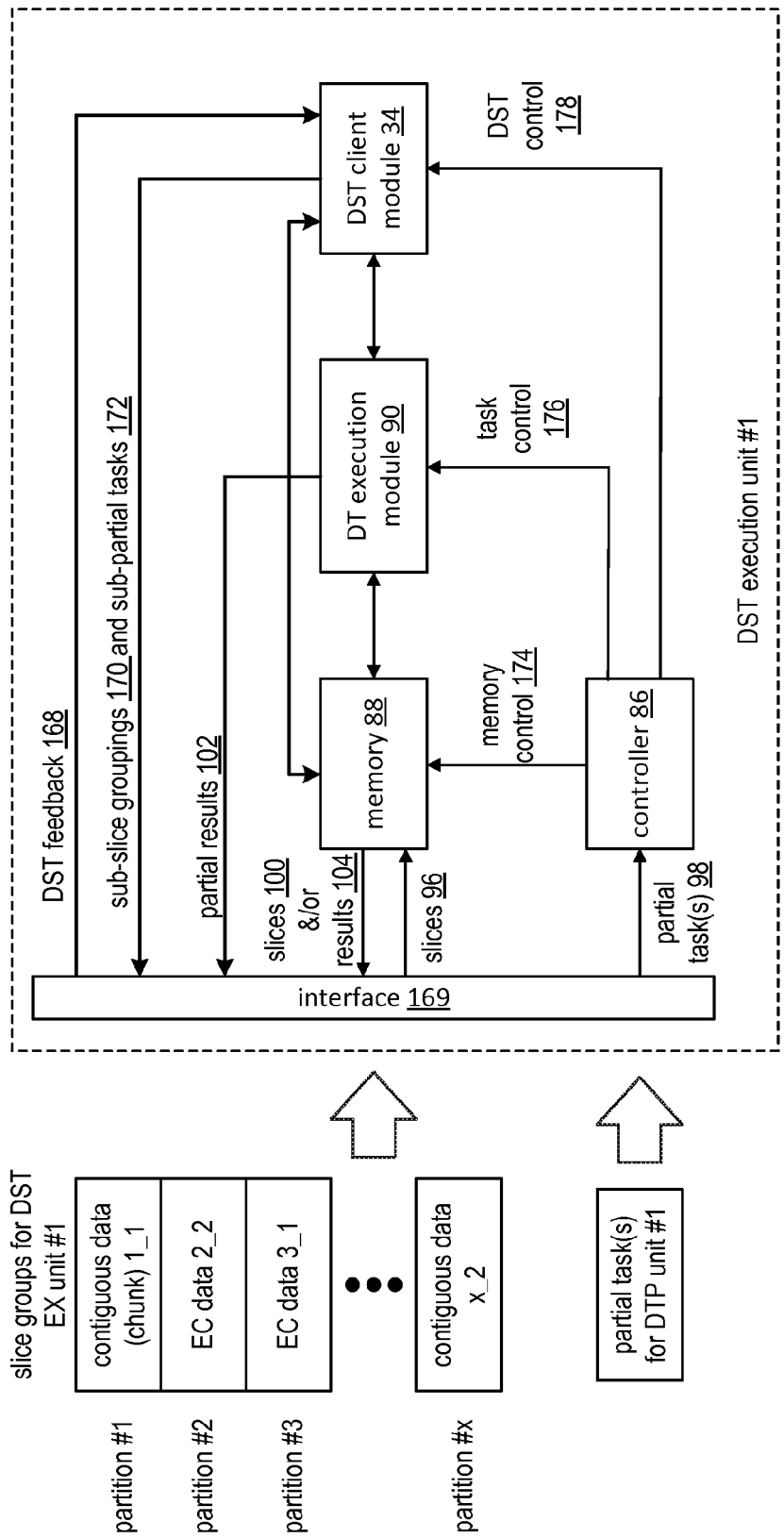
FIG. 11 is a schematic block diagram of an embodiment of a DST execution unit in accordance with the present invention.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 in the memory 88. For example, when the partial task 98 includes a retrieval request, the controller 86 outputs the memory control 174 to the memory 88 to facilitate retrieval of slices 100 and/or results 104.

Figure 12:
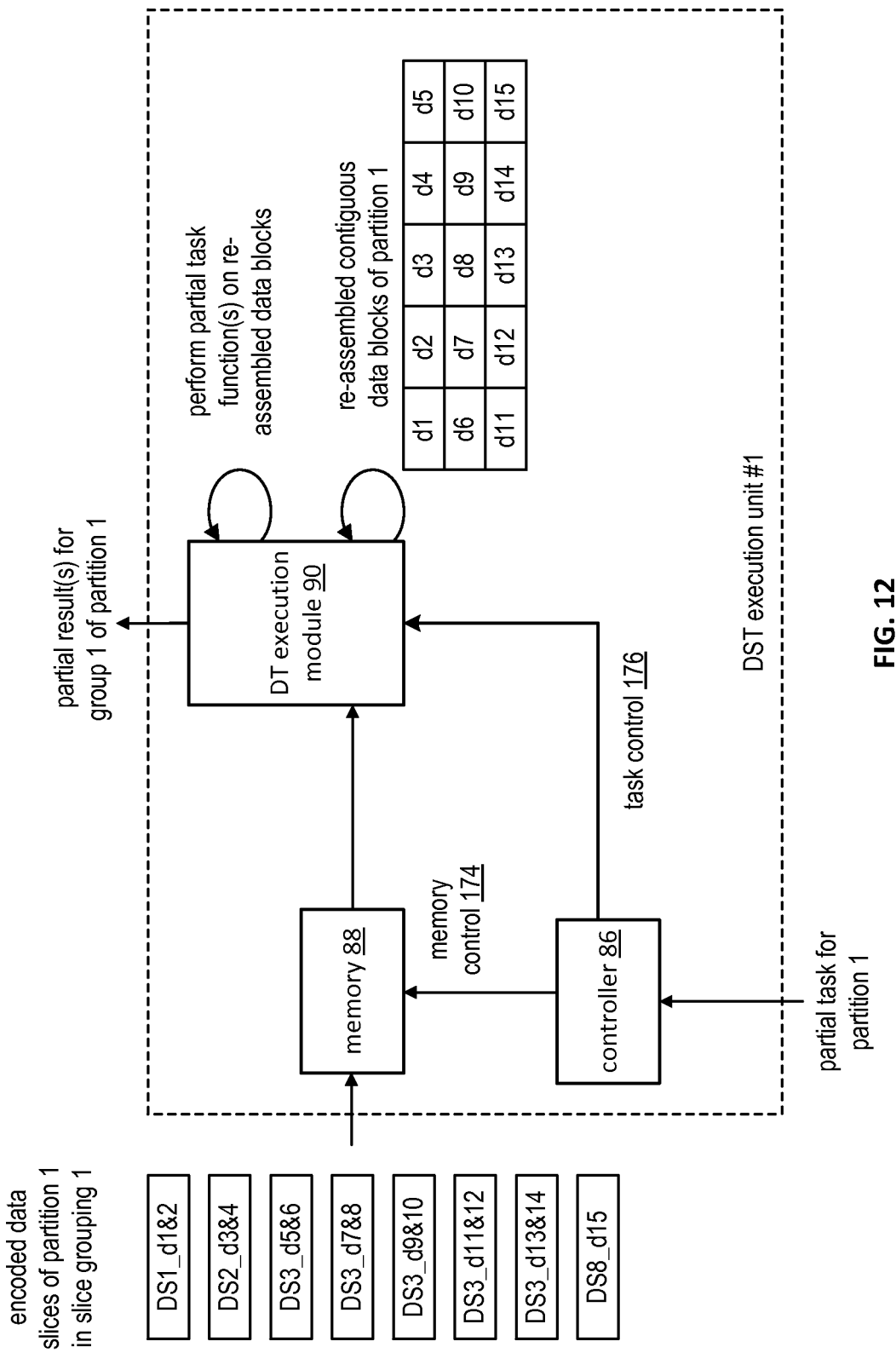
FIG. 12 is a schematic block diagram of an example of operation of a DST execution unit in accordance with the present invention.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks. The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
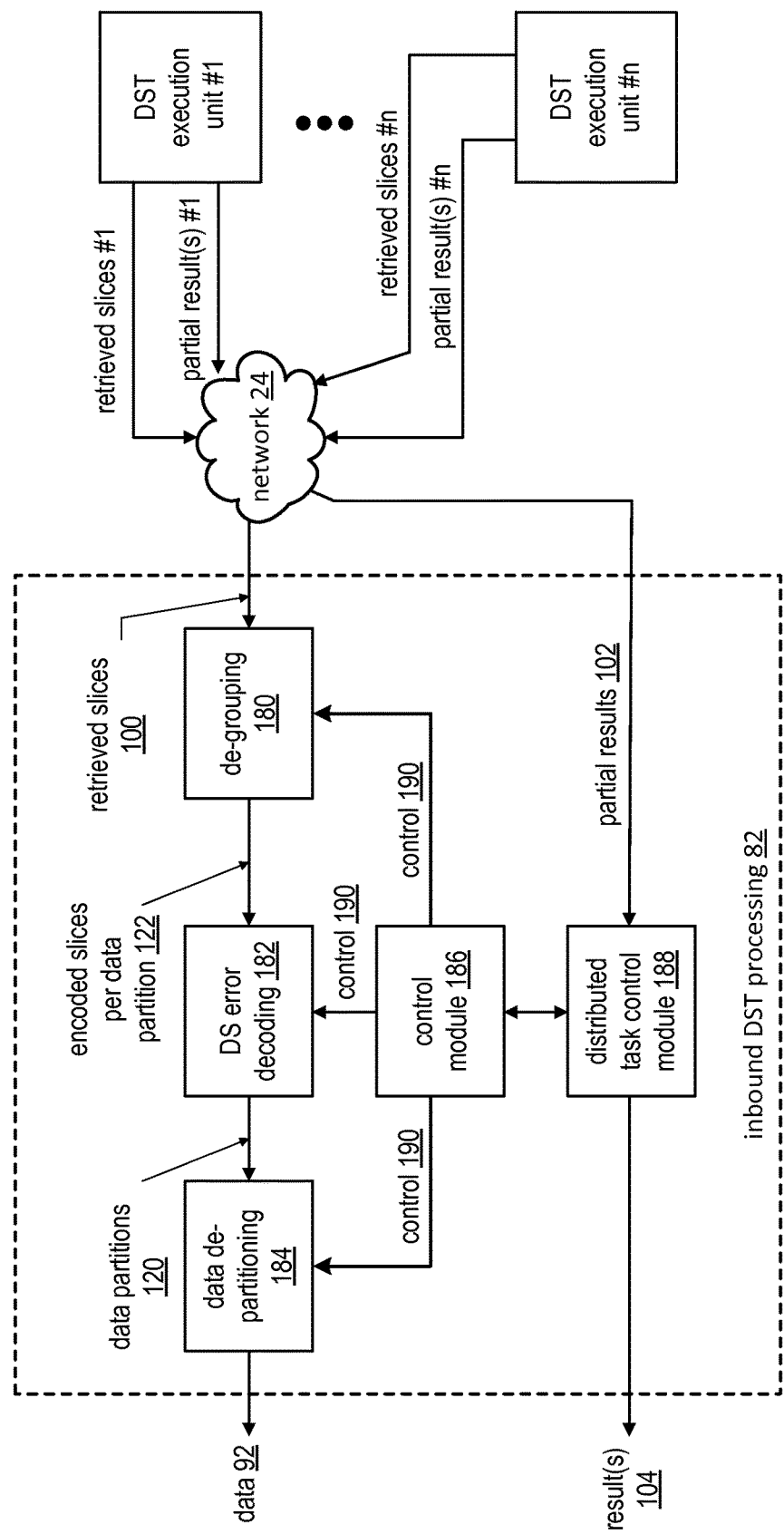
FIG. 13 is a schematic block diagram of an embodiment of an inbound distributed storage and/or task (DST) processing in accordance with the present invention.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieved slices 100 into the data 92 using control signals 190 to each of the modules. For instance, the control module 186 provides de-grouping information to the de-grouping module 180, provides the DS error encoding parameters to the DS error decoding module 182, and provides de-partitioning information to the data de-partitioning module 184.

Figure 14:
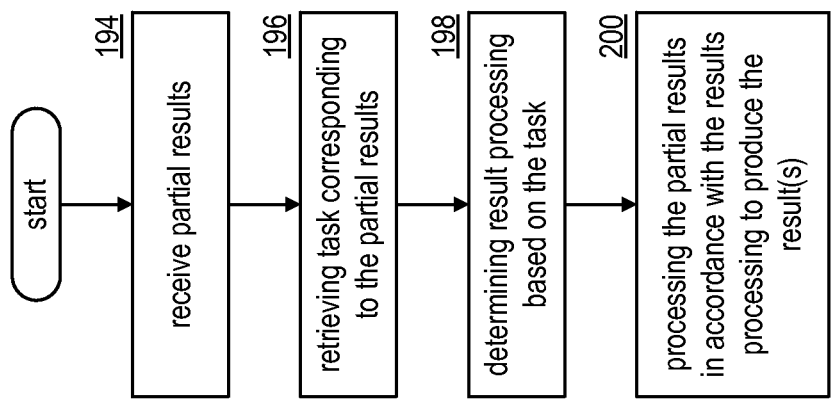
FIG. 14 is a logic diagram of an example of a method for inbound DST processing in accordance with the present invention.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, results of processing the information would indicate to add the partial results to produce the final results. The method continues at step 200 where the DST client module processes the partial results in accordance with the result processing information to produce the final result or results.

Figure 15:
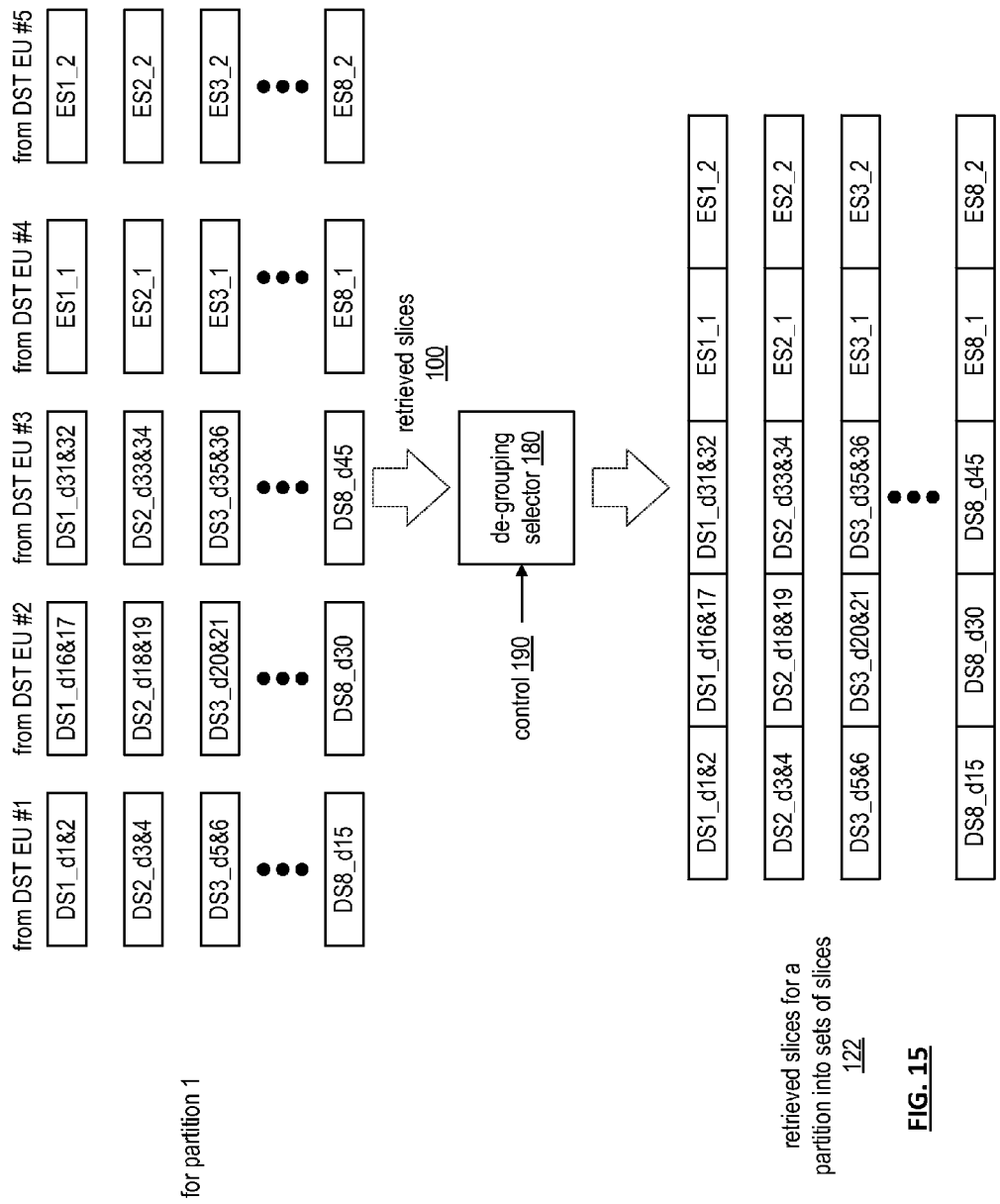
FIG. 15 is a diagram of an example of de-grouping selection processing of the inbound DST processing in accordance with the present invention.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
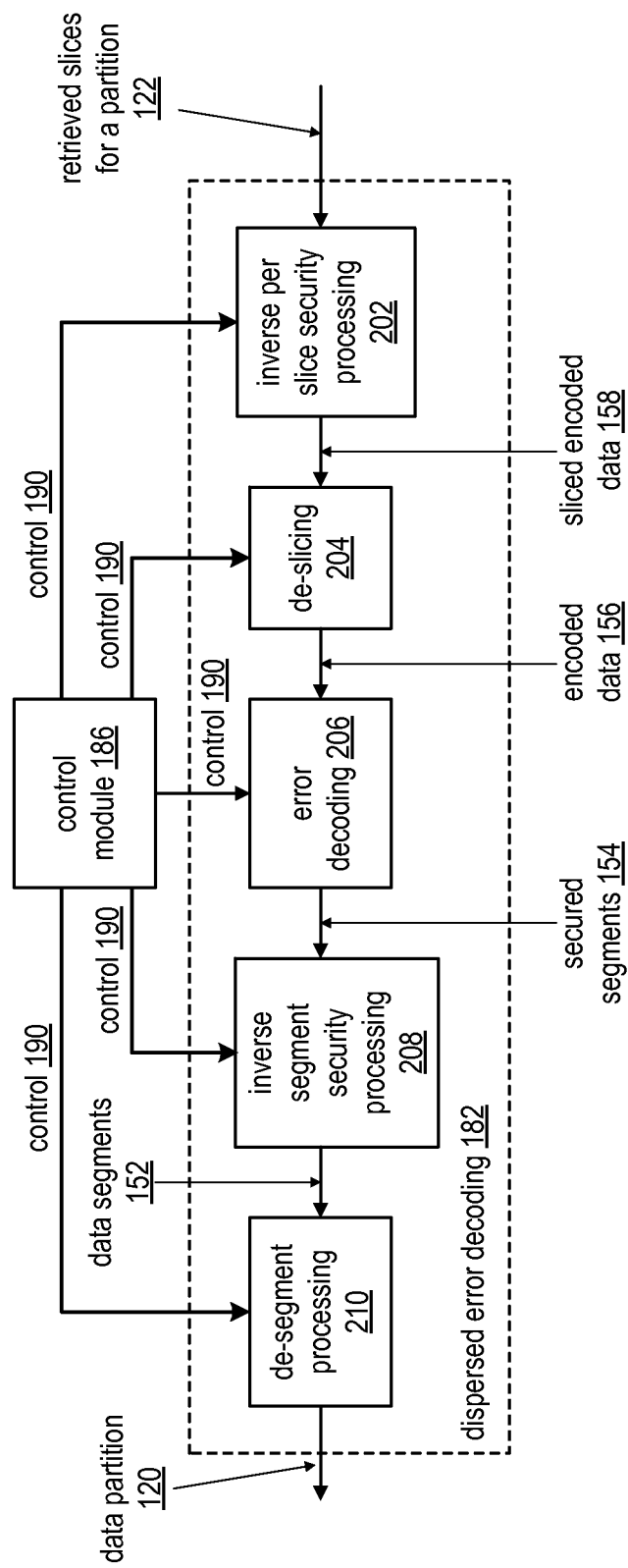
FIG. 16 is a schematic block diagram of an embodiment of a dispersed error decoding in accordance with the present invention.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186. The slice security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC, etc.) verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is bypassed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
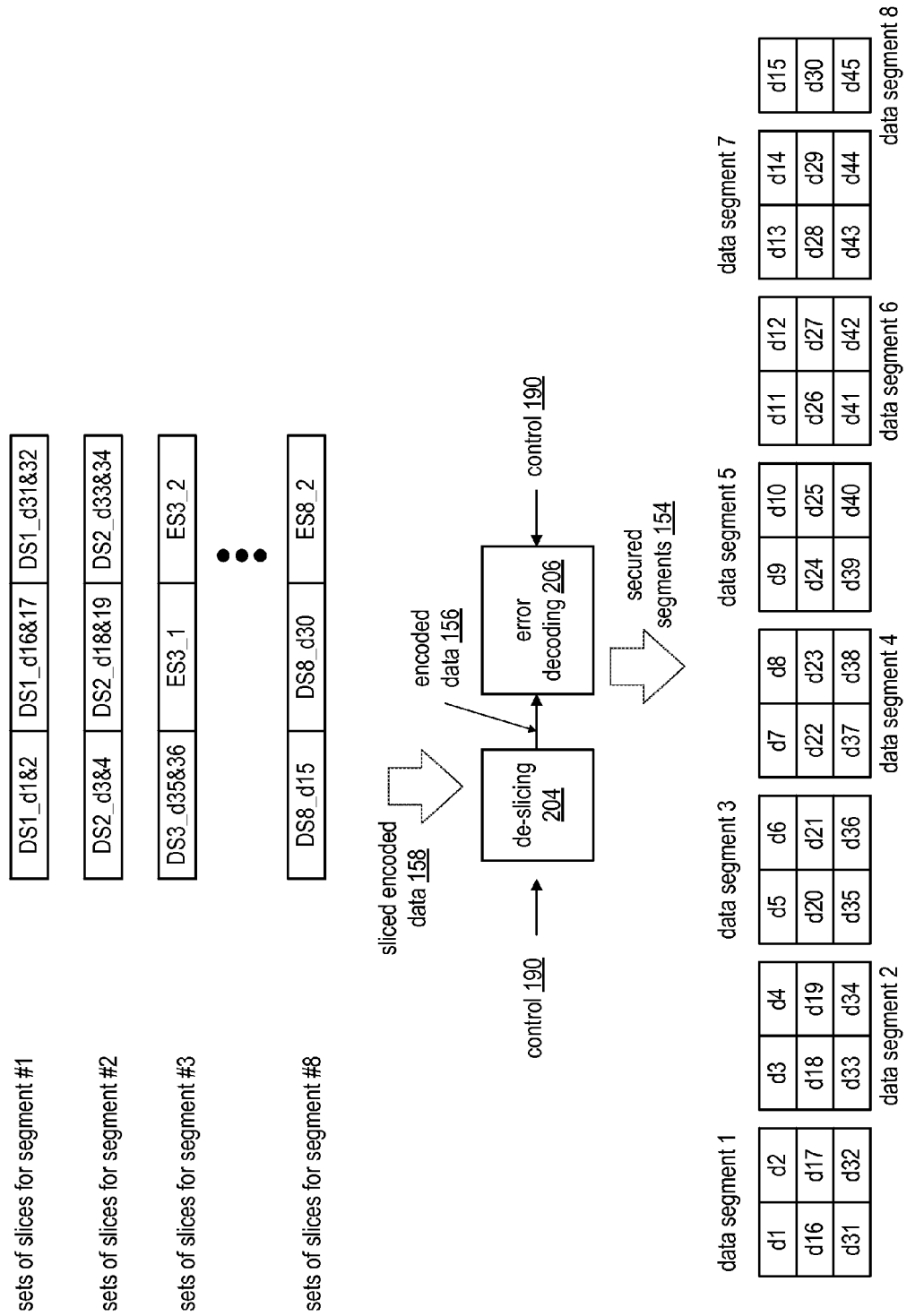
FIG. 17 is a diagram of an example of de-slicing and error decoding processing of the dispersed error decoding in accordance with the present invention.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_d1&d2) or an error code based encoded data slice (e.g., ES3_1).

An error decoding module 206 decodes the encoded data 156 of each data segment in accordance with the error correction decoding parameters of control information 190 to produce secured segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
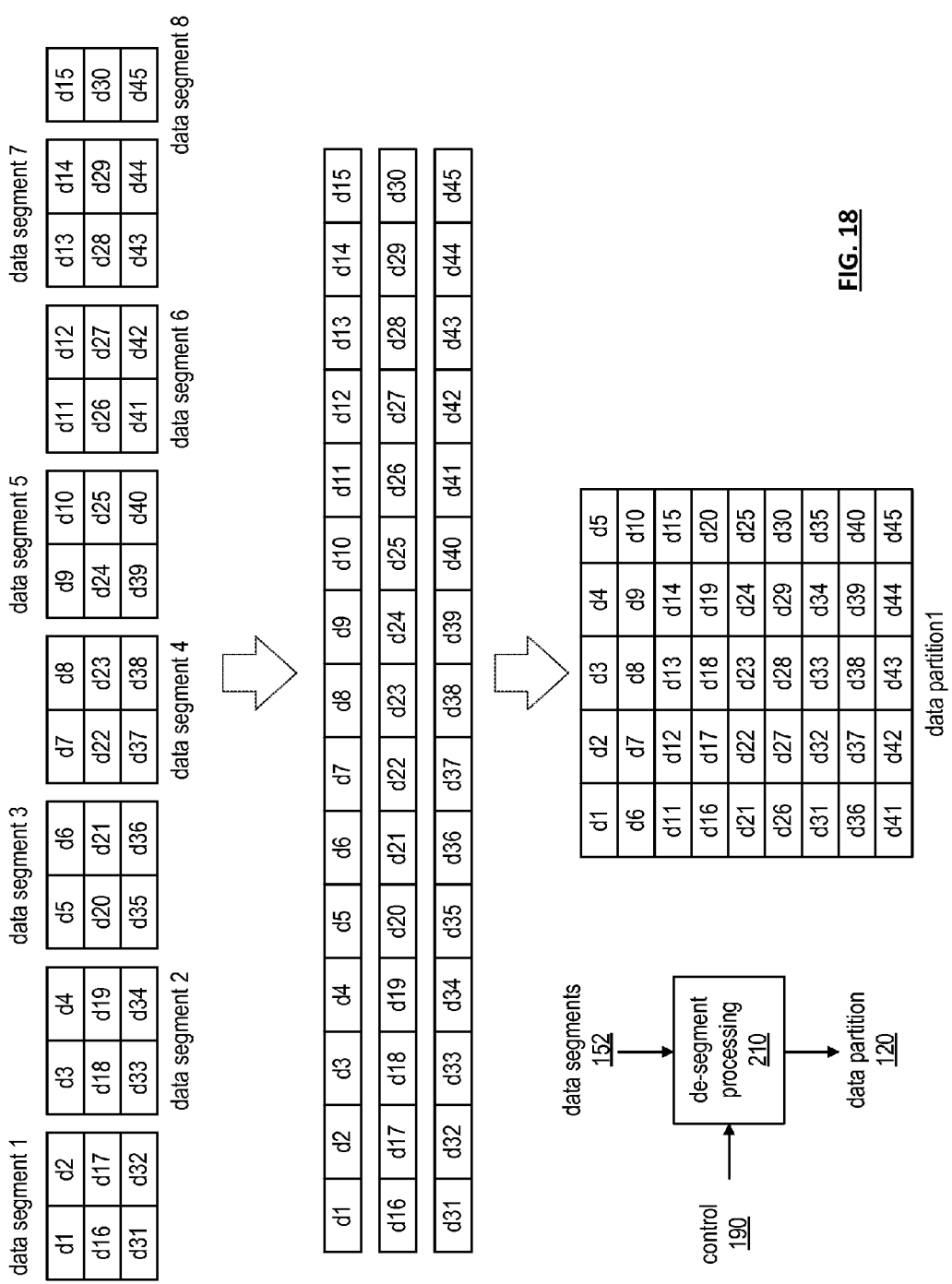
FIG. 18 is a diagram of an example of a de-segment processing of the dispersed error decoding in accordance with the present invention.

FIG. 18 is a diagram of an example of de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
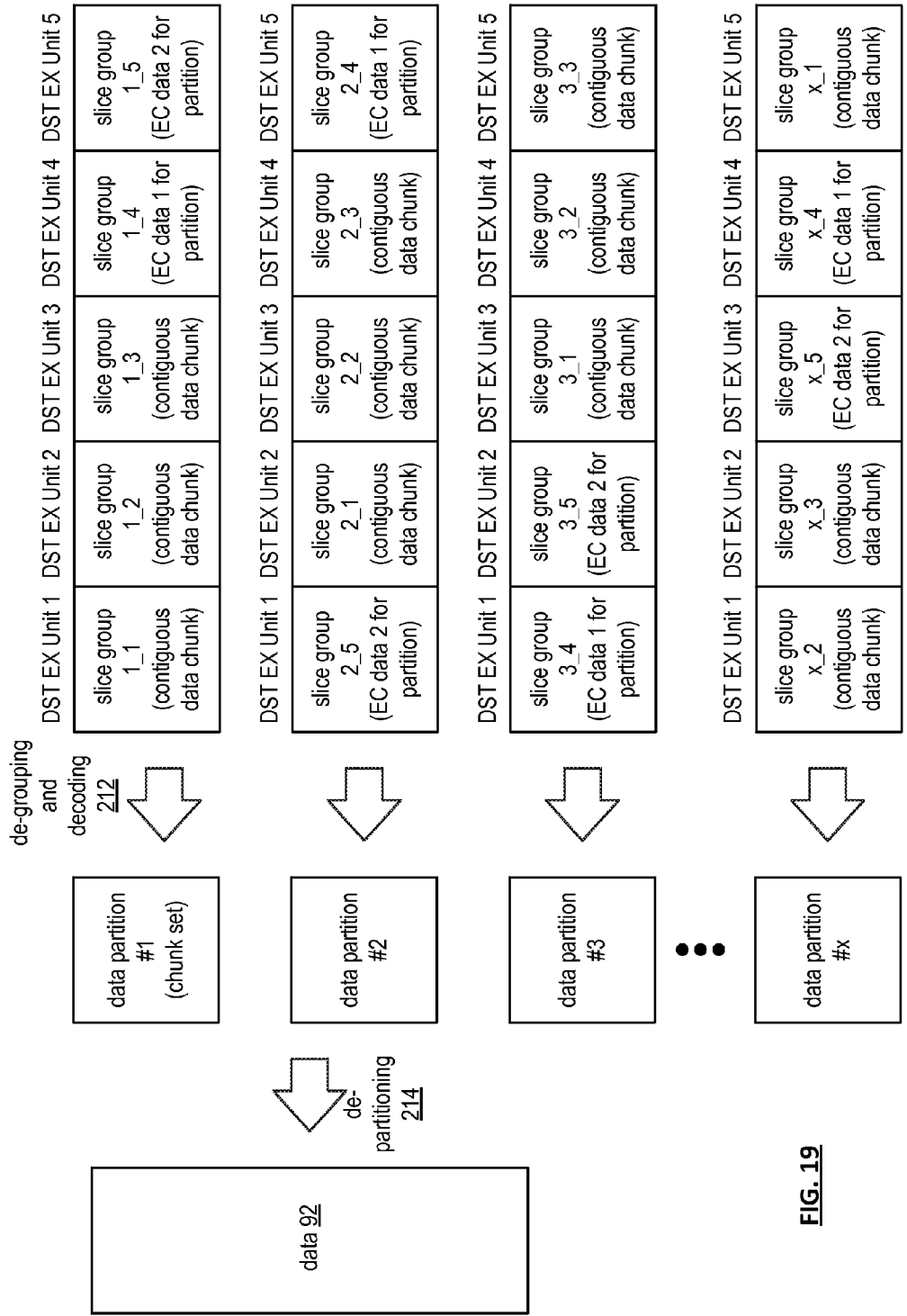
FIG. 19 is a diagram of an example of converting slice groups into data in accordance with the present invention.

FIG. 19 is a diagram of an example of converting slice groups into data 92 within an inbound distributed storage and task (DST) processing section. As shown, the data 92 is reconstructed from a plurality of data partitions (1-x, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
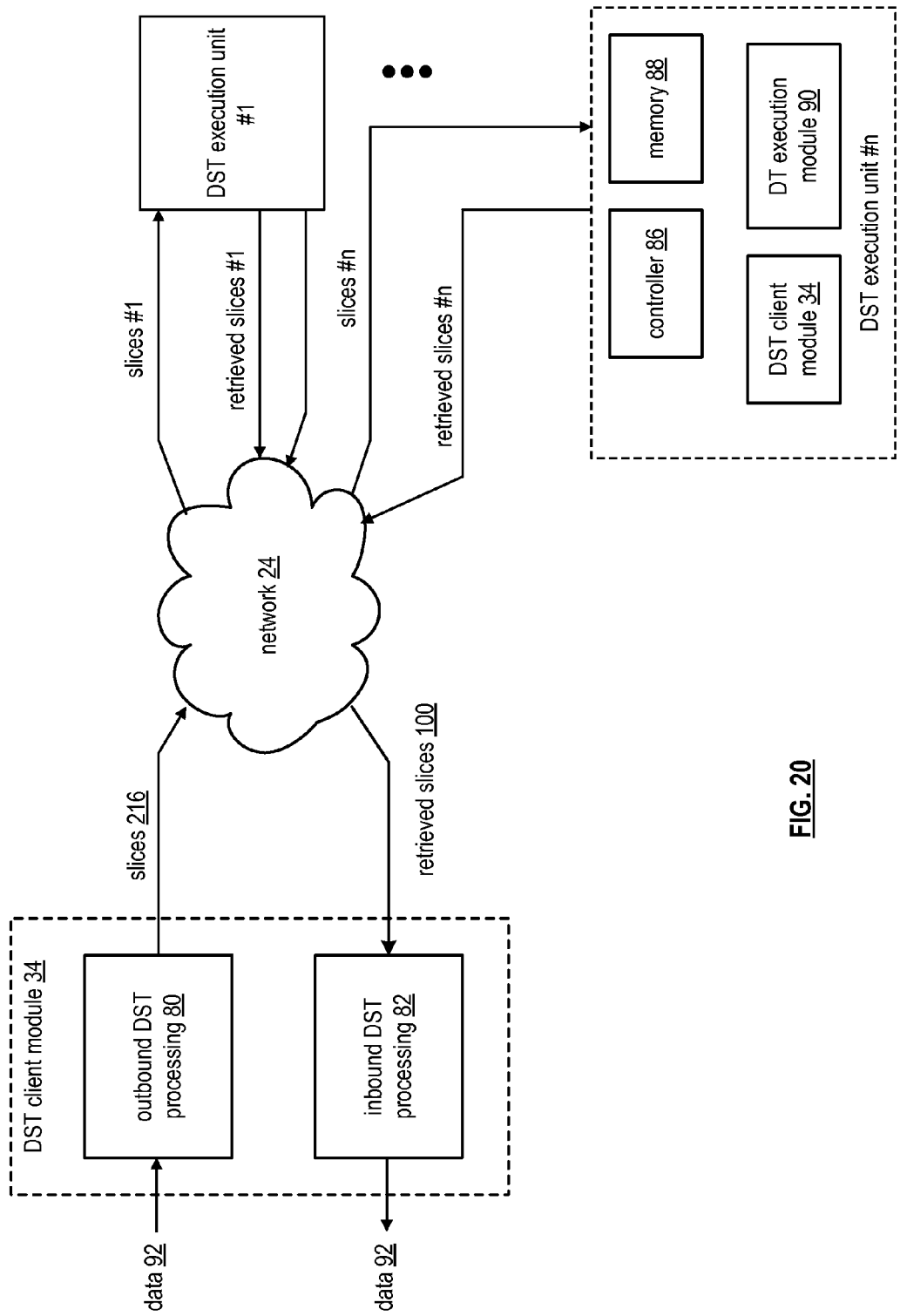
FIG. 20 is a diagram of an example of a distributed storage within the distributed computing system in accordance with the present invention.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units. In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
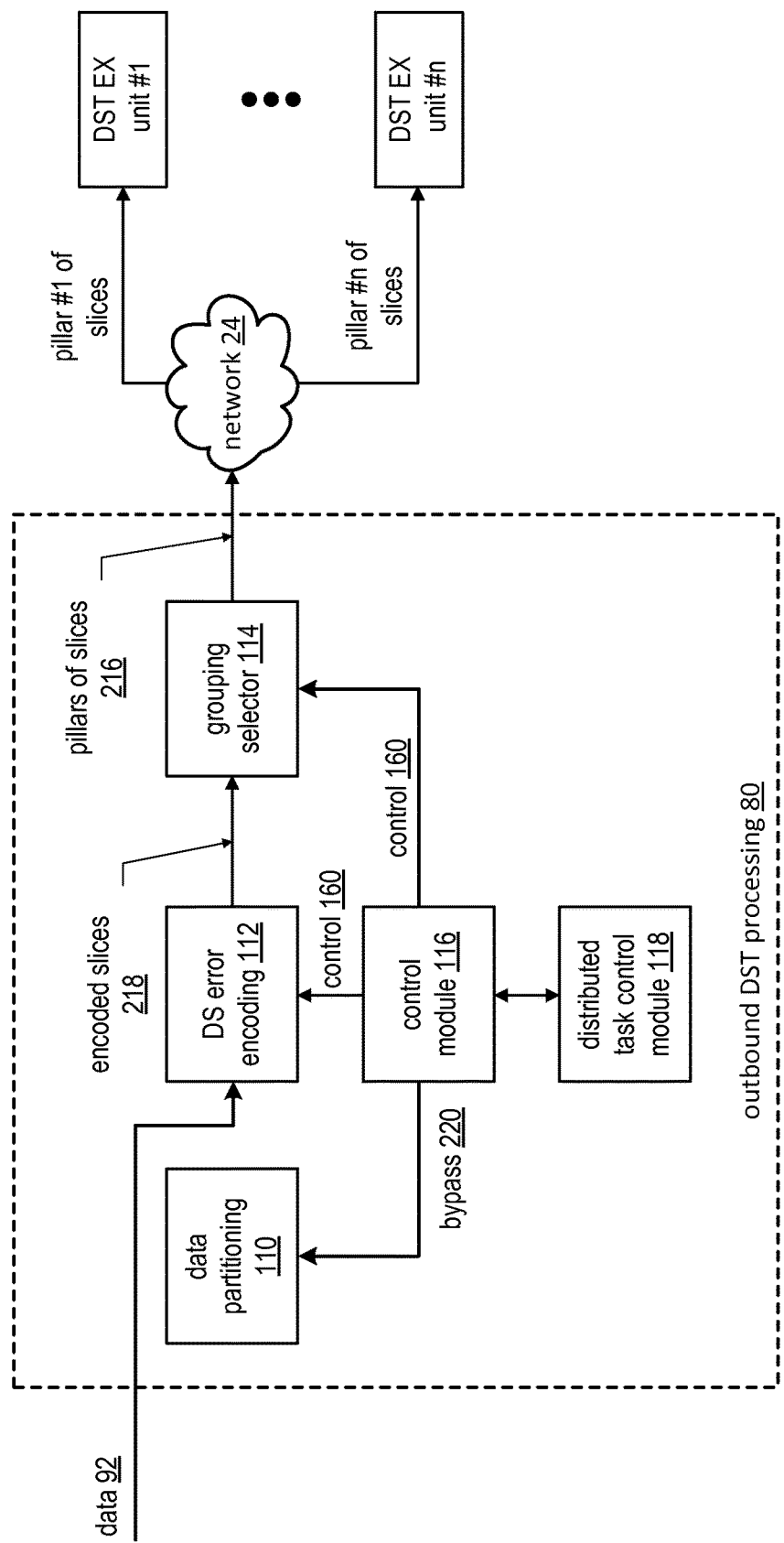
FIG. 21 is a schematic block diagram of an example of operation of outbound distributed storage and/or task (DST) processing for storing data in accordance with the present invention.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC, etc.)), error encoding, slicing, and/or per slice security processing (e.g., encryption, compression, watermarking, integrity check (e.g., CRC, etc.)). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
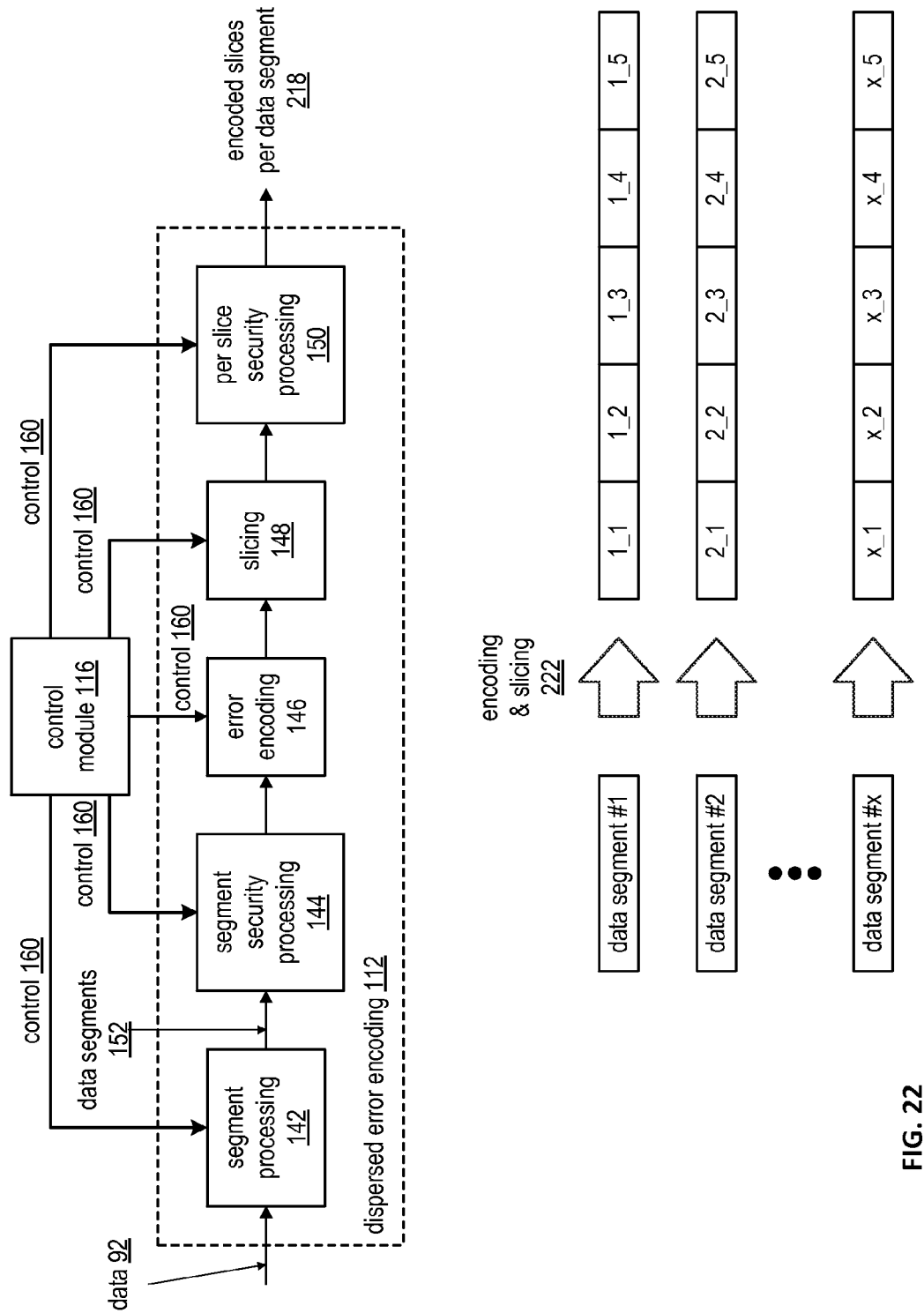
FIG. 22 is a schematic block diagram of an example of a dispersed error encoding for the example of FIG. 21 in accordance with the present invention.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC, etc.), and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC, etc.), and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
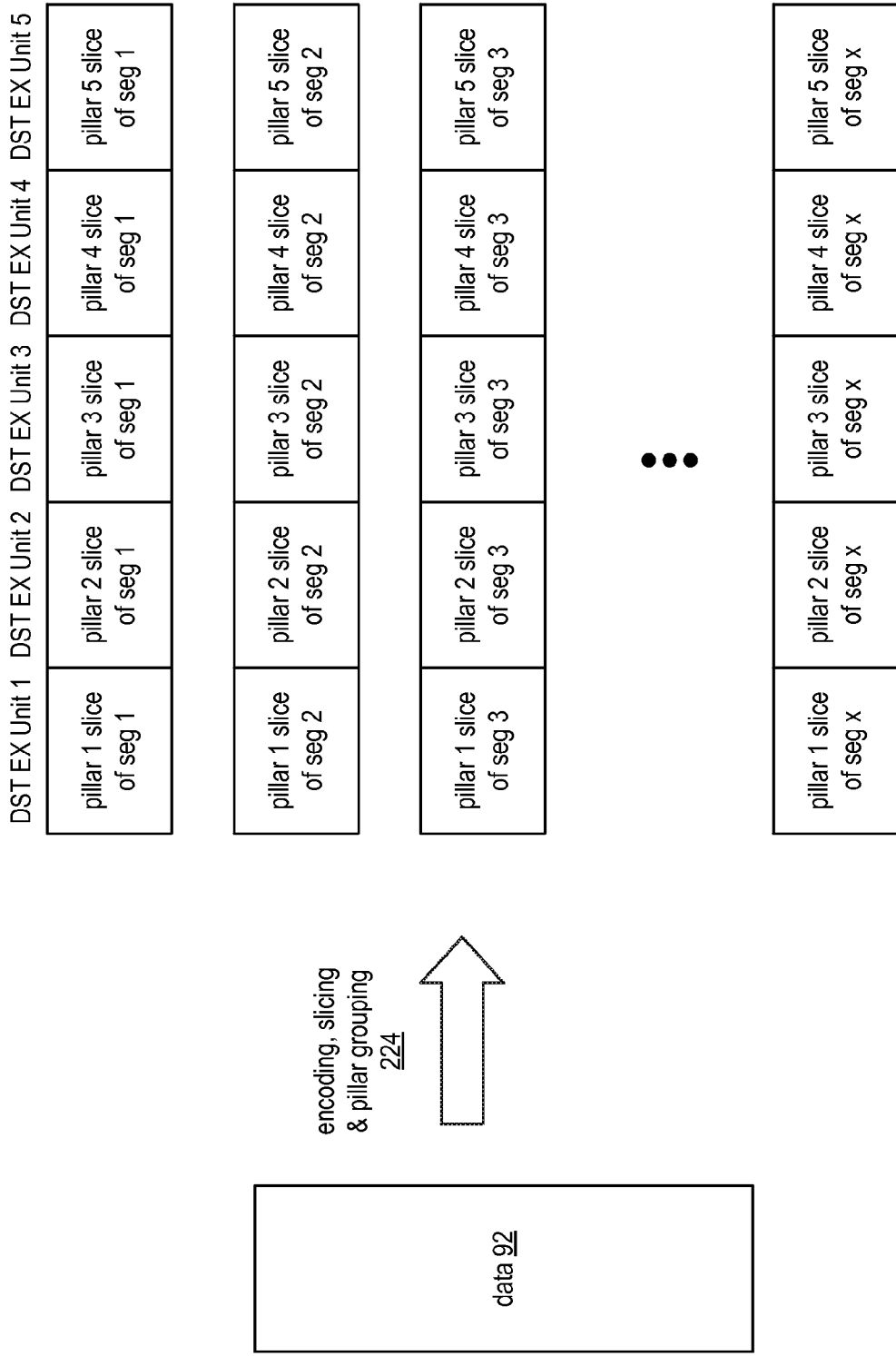
FIG. 23 is a diagram of an example of converting data into pillar slice groups for storage in accordance with the present invention.

FIG. 23 is a diagram of an example of converting data 92 into pillar slice groups utilizing encoding, slicing and pillar grouping function 224 for storage in memory of a distributed storage and task network (DSTN) module. As previously discussed the data 92 is encoded and sliced into a plurality of sets of encoded data slices; one set per data segment. The grouping selector module organizes the sets of encoded data slices into pillars of data slices. In this example, the DS error encoding parameters include a pillar width of 5 and a decode threshold of 3. As such, for each data segment, 5 encoded data slices are created.

The grouping selector module takes the first encoded data slice of each of the sets and forms a first pillar, which may be sent to the first DST execution unit. Similarly, the grouping selector module creates the second pillar from the second slices of the sets; the third pillar from the third slices of the sets; the fourth pillar from the fourth slices of the sets; and the fifth pillar from the fifth slices of the set.

Figure 24:
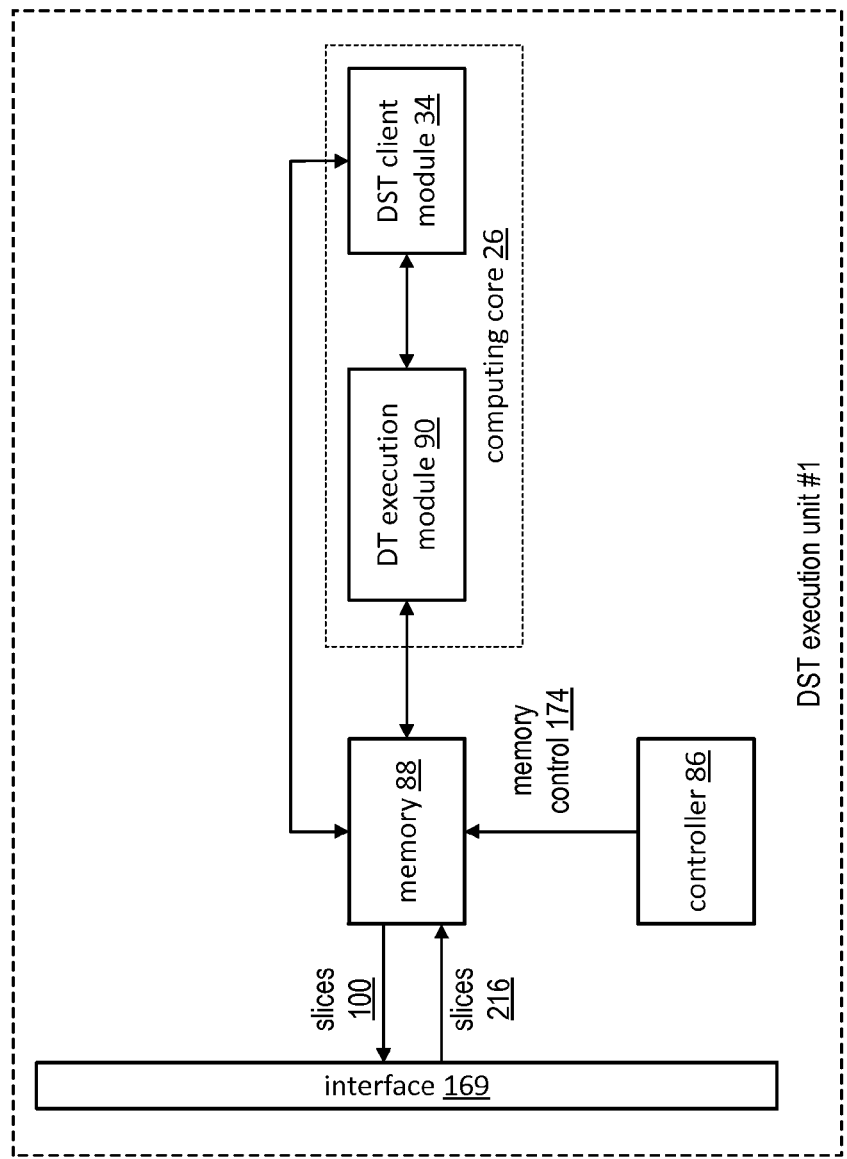
FIG. 24 is a diagram of an example of a storage operation of a DST execution unit in accordance with the present invention.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

Figure 25:
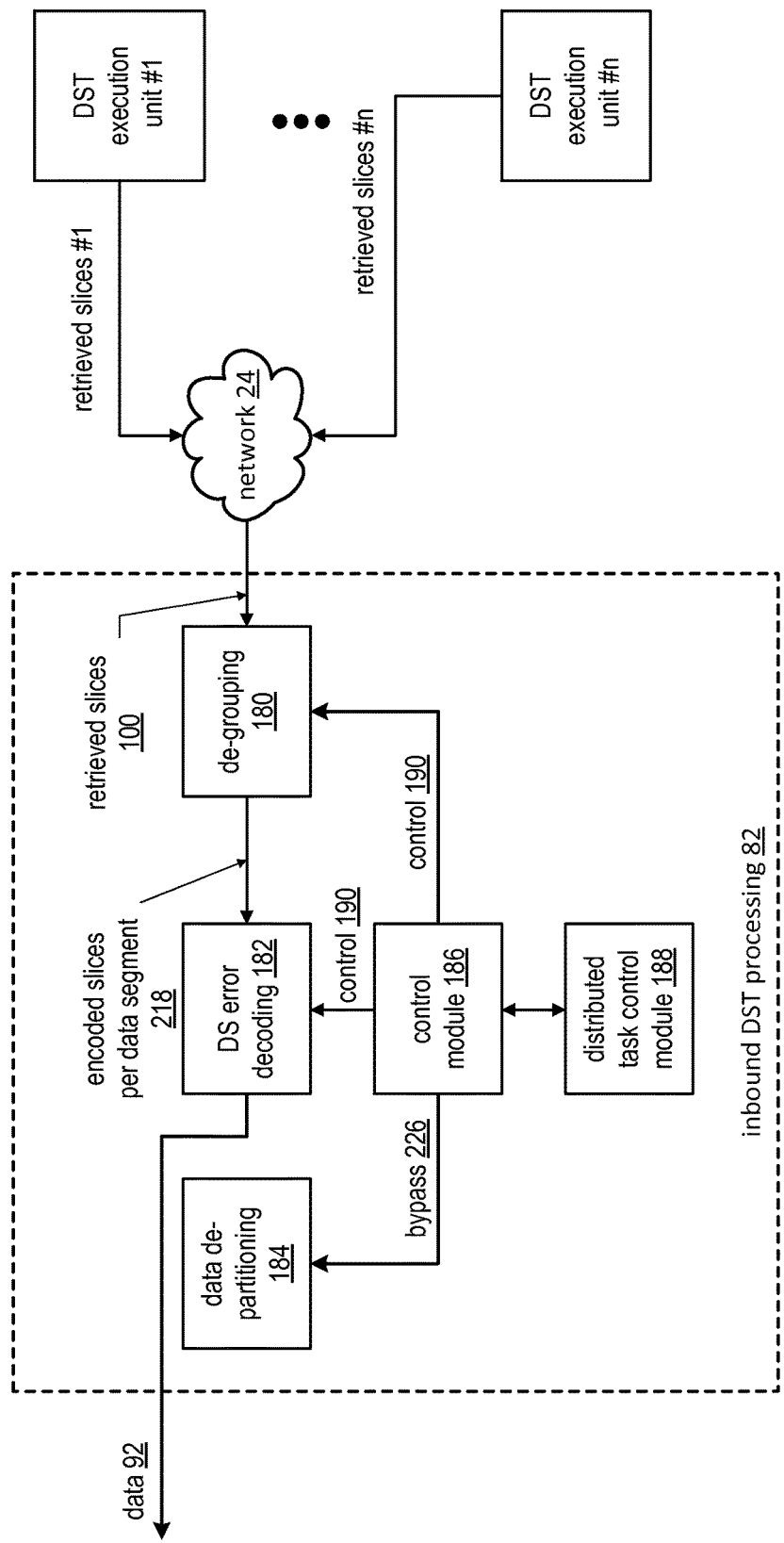
FIG. 25 is a schematic block diagram of an example of operation of inbound distributed storage and/or task (DST) processing for retrieving dispersed error encoded data in accordance with the present invention.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

Figure 26:
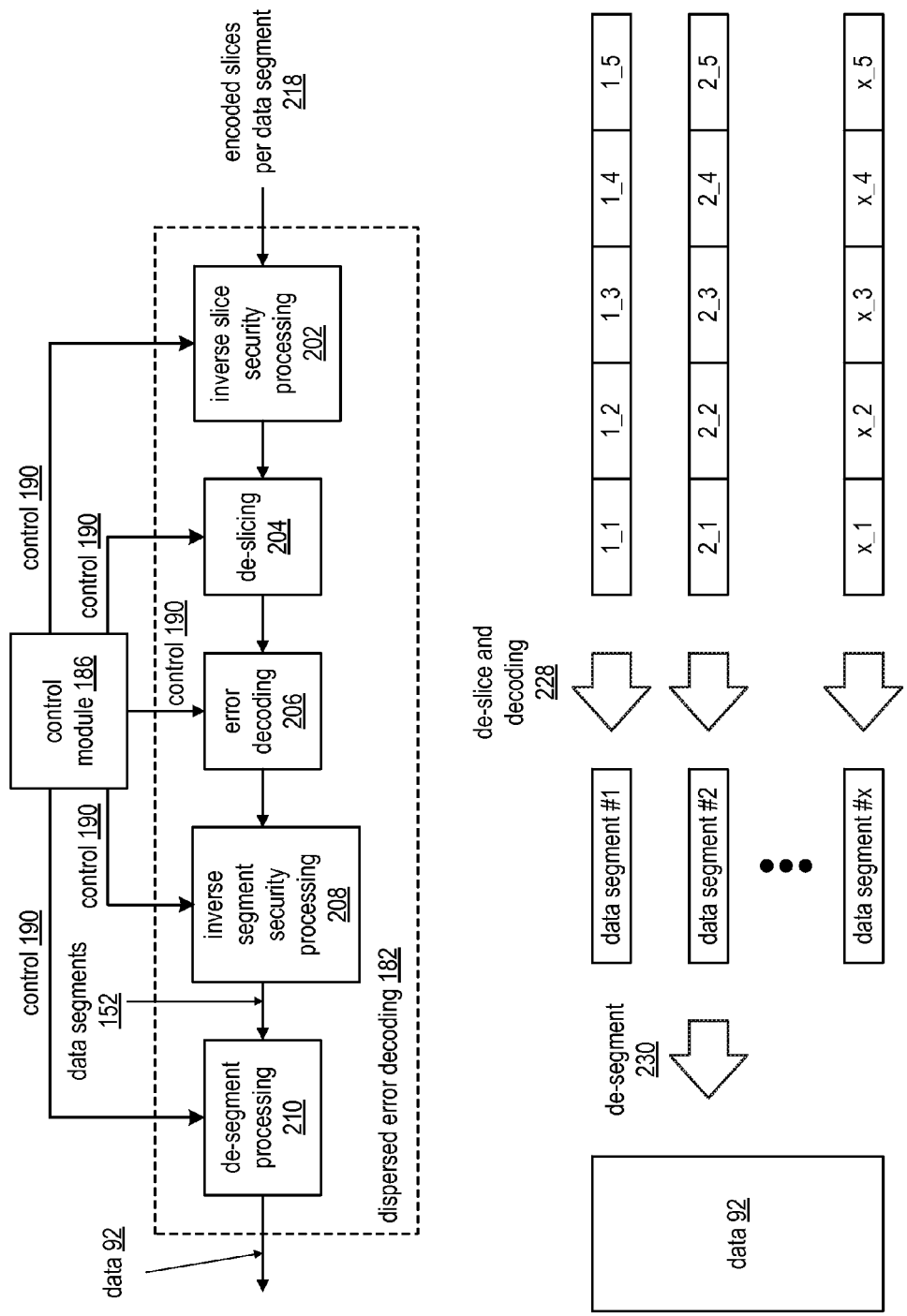
FIG. 26 is a schematic block diagram of an example of a dispersed error decoding for the example of FIG. 25 in accordance with the present invention.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, and a de-segmenting processing module 210. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from a control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC, etc.) verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

Figure 27:
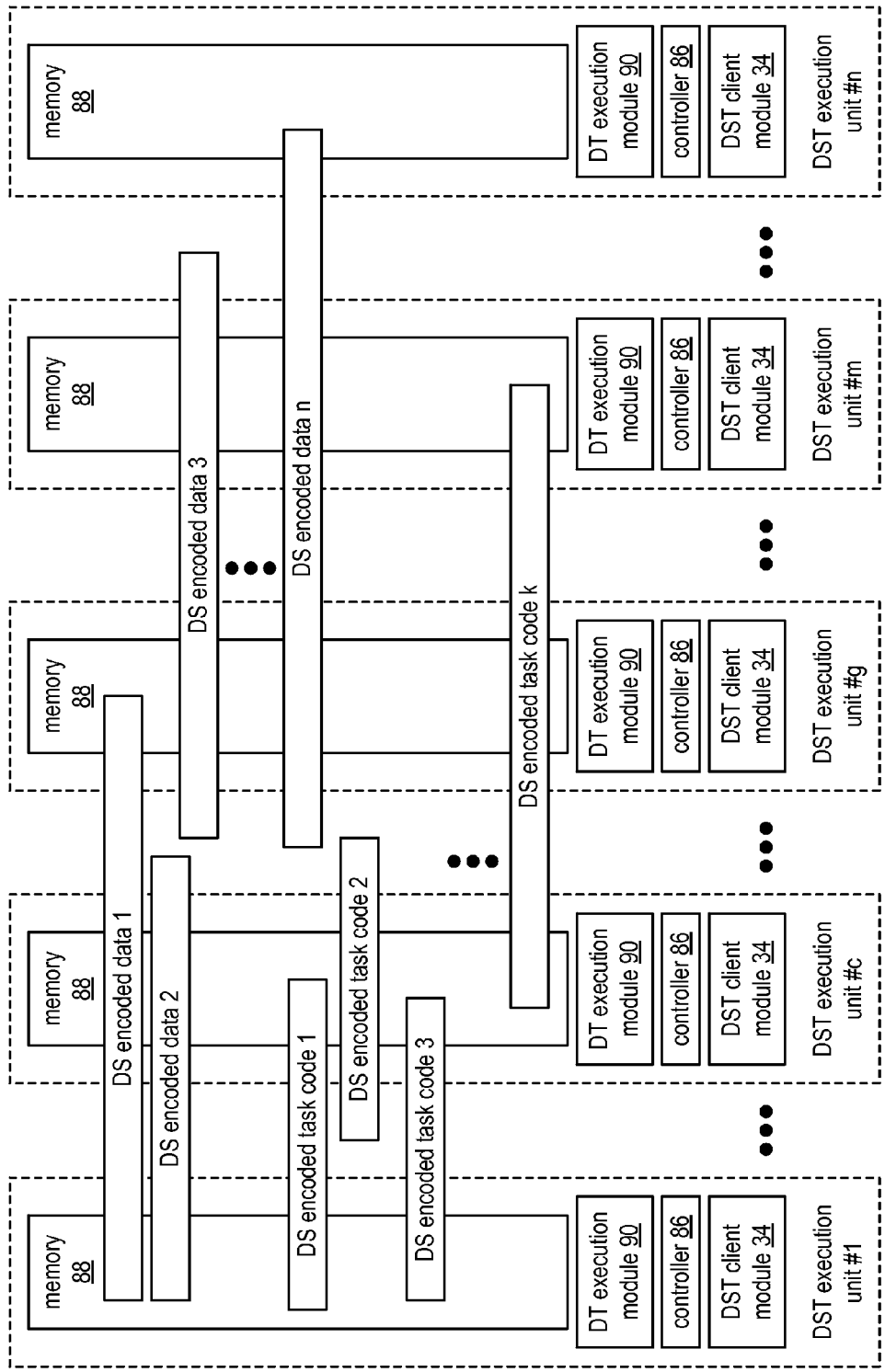
FIG. 27 is a schematic block diagram of an example of a distributed storage and task processing network (DSTN) module storing a plurality of data and a plurality of task codes in accordance with the present invention.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terabytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

Figure 28:
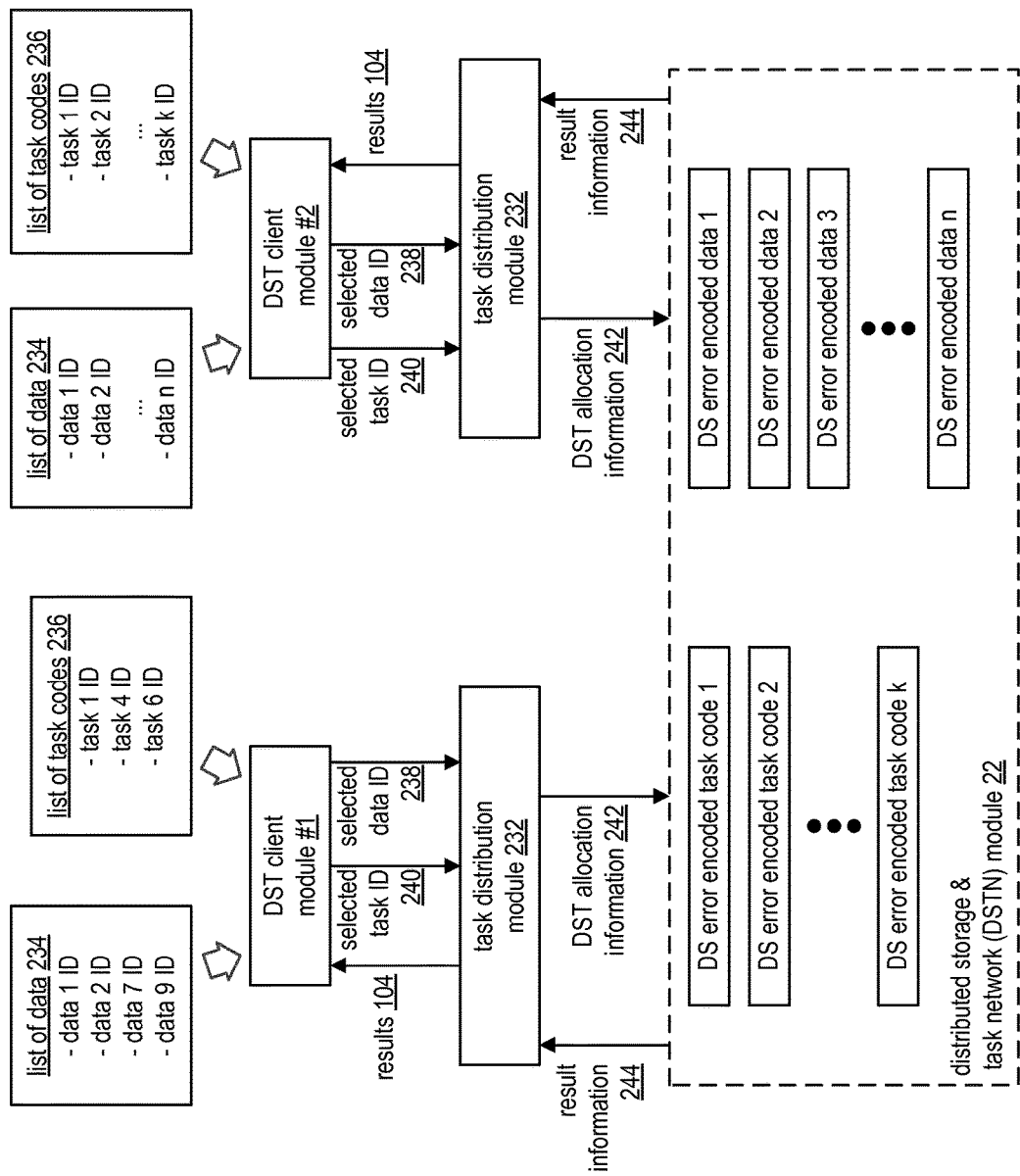
FIG. 28 is a schematic block diagram of an example of the distributed computing system performing tasks on stored data in accordance with the present invention.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

Figure 29:
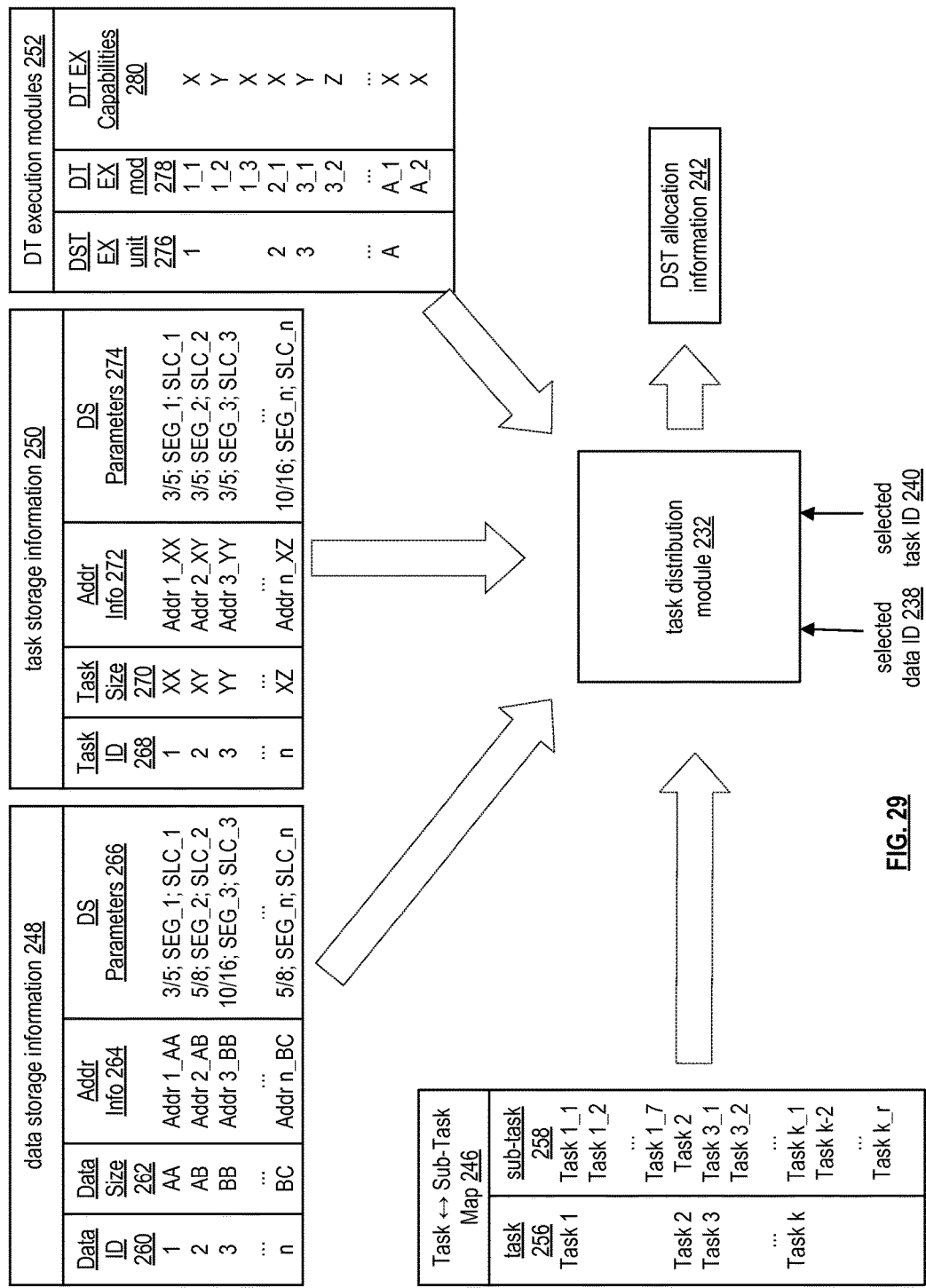
FIG. 29 is a schematic block diagram of an embodiment of a task distribution module facilitating the example of FIG. 28 in accordance with the present invention.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task⇔sub-task mapping information 246.

The data storage information table 248 includes a data identification (ID) field 260, a data size field 262, an addressing information field 264, distributed storage (DS) information 266, and may further include other information regarding the data, how it is stored, and/or how it can be processed. For example, DS encoded data #1 has a data ID of 1, a data size of AA (e.g., a byte size of a few Terabytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slice names of the encoded data slices of the data, etc. The DS parameters may include identity of an error encoding scheme, decode threshold/pillar width (e.g., 3/5 for the first data entry), segment security information (e.g., SEG_1), per slice security information (e.g., SLC_1), and/or any other information regarding how the data was encoded into data slices.

The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task⇔a sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and, if so, how many and if any of the sub-tasks are ordered. In this example, the task⇔sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task on which data partitions, where and how intermediate results are to be stored, etc. If multiple tasks are being performed on the same data or different data, the task distribution module factors such information into its generation of the DST allocation information.

Figure 30:
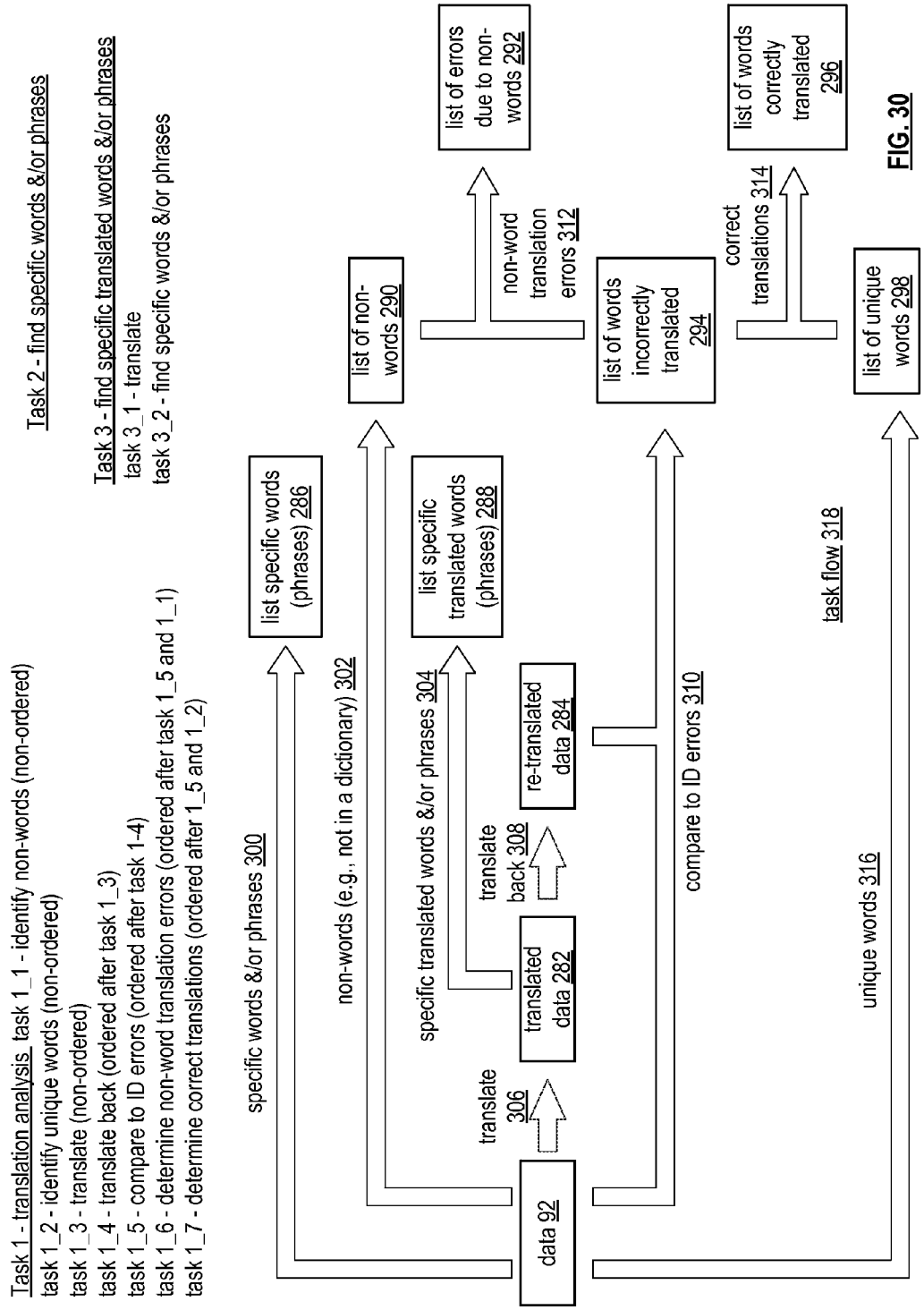
FIG. 30 is a diagram of a specific example of the distributed computing system performing tasks on stored data in accordance with the present invention.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1—identify non-words (non-ordered); task 1_2—identify unique words (non-ordered); task 1_3—translate (non-ordered); task 1_4—translate back (ordered after task 1_3); task 1_5—compare to ID errors (ordered after task 1-4); task 1_6—determine non-word translation errors (ordered after task 1_5 and 1_1); and task 1_7—determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases 288. The translated data 282 is translated back 308 (e.g., sub-task 1_4) into the language of the original data to produce re-translated data 284. These two tasks are dependent on the translate task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc.,) may include the word and/or phrase, how many times it is used, where in the data it is used, and/or any other information requested regarding a word and/or phrase.

Figure 31:
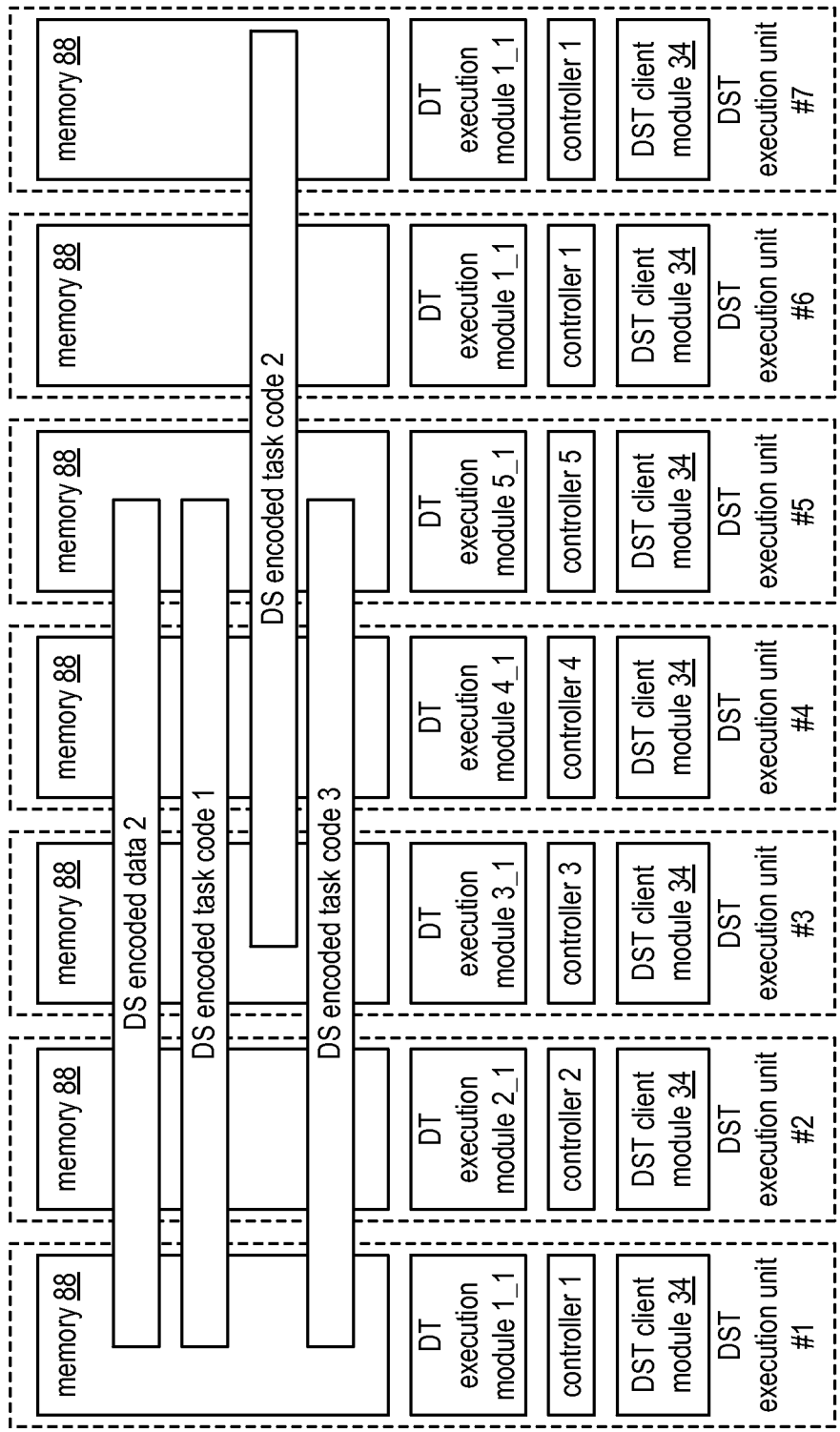
FIG. 31 is a schematic block diagram of an example of a distributed storage and task processing network (DSTN) module storing data and task codes for the example of FIG. 30 in accordance with the present invention.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1-5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of 3/5 for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done by the DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 1_2 (e.g., identify unique words) has similar task execution information as task 1_1 to produce task 1_2 intermediate results (R1-2, which is the list of unique words).

Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1-4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition.

As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terabyte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 1_2 to produce a partial results (e.g., $1^{st}$ through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin the encoding, the DST client module determines whether the list of unique words is of a sufficient size to partition (e.g., greater than a Terabyte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/ pillar width ratio) to produce slice groupings. The slice groupings are stored in the intermediate result memory (e.g., allocated memory in the memories of DST execution units 1-5).

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., $1^{st}$ through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3)

into a plurality of partitions (e.g., R1-3_1 through R1-3_y). For each partition of the third intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is further shown in FIG. 35, the DSTN module is performing task 1_4 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_1 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 1_4 to produce partial results 102 (e.g., $1^{st}$ through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
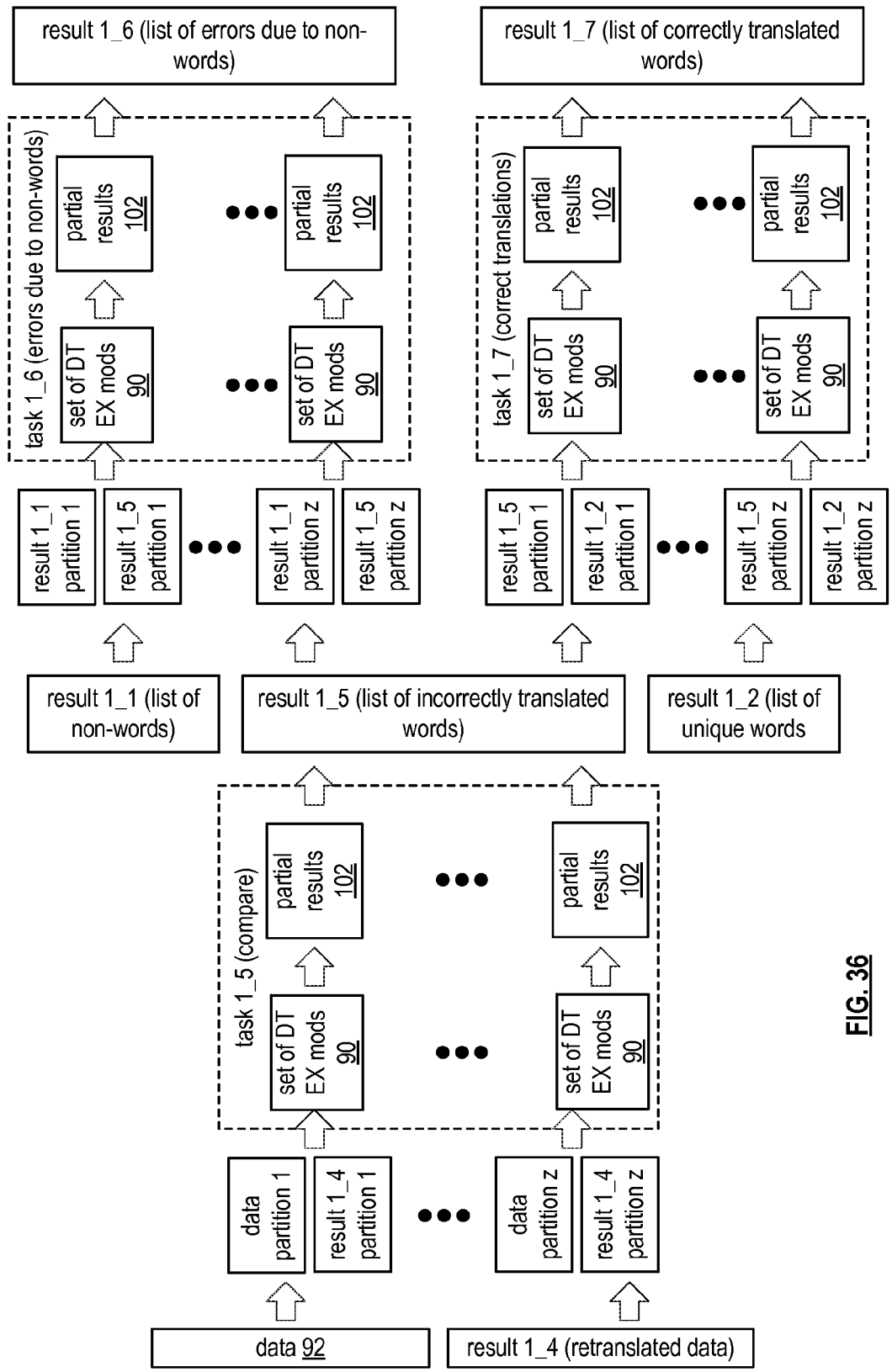

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., $1^{st}$ through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., R1-5_1 through R1-5_z). For each partition of the fifth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition R1-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., $1^{st}$ through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., R1-6_1 through R1-6_z). For each partition of the sixth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2). To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., $1^{st}$ through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7_z). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-z in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., $1^{st}$ through "zth") of specific words and/or phrases found in the data partitions.

As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terabyte). If yes, it partitions the task 2 intermediate result (R2) into a plurality of partitions (e.g., R2_1 through R2_m). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., $1^{st}$ through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terabyte). If yes, it partitions the task 3 intermediate result (R3) into a plurality of partitions (e.g., R3_1 through R3_m). If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

Figure 40A:
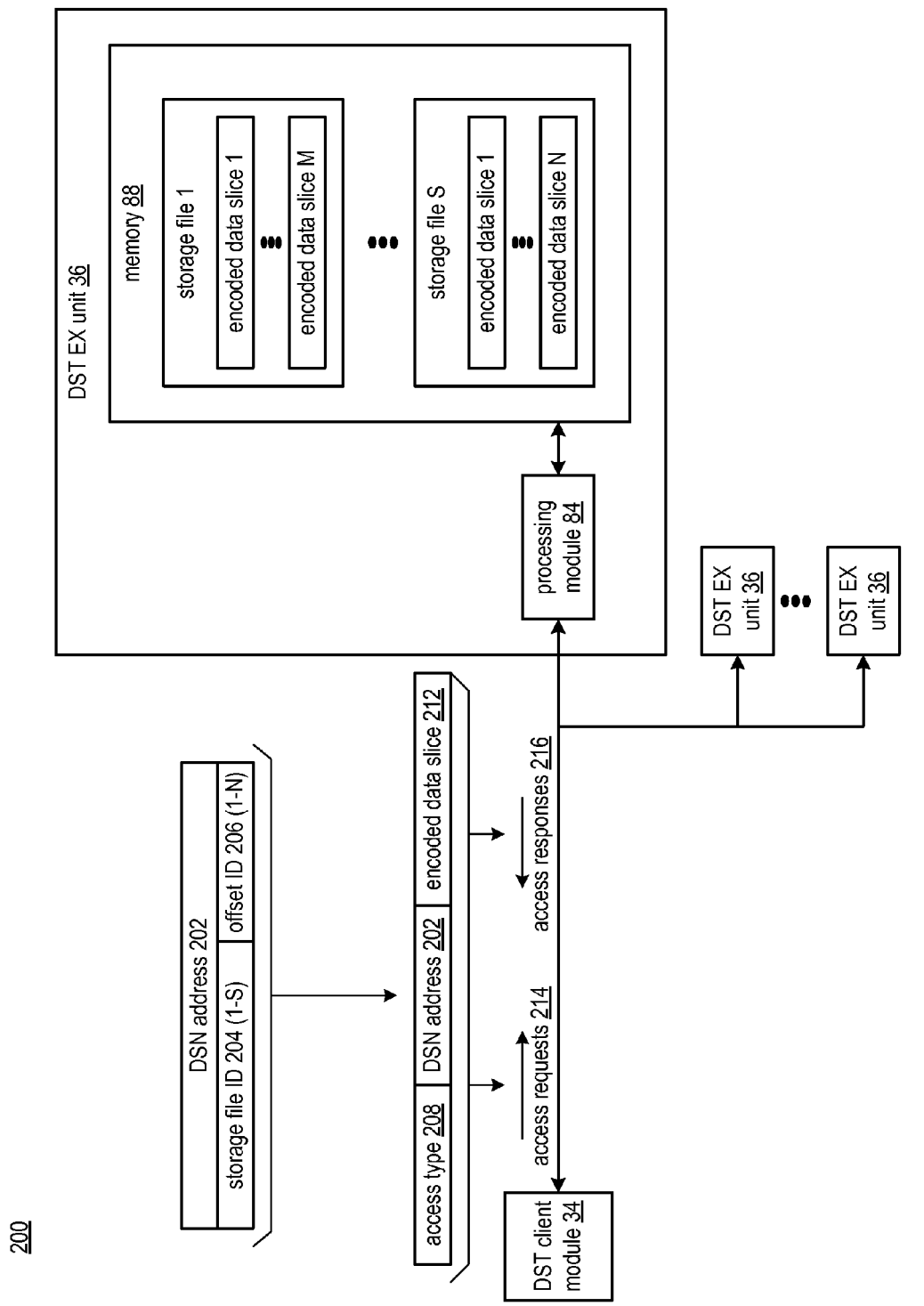
FIG. 40A is a schematic block diagram of an embodiment of a dispersed storage network in accordance with the present invention.

FIG. 40A is a schematic block diagram of an embodiment of a dispersed storage network that includes the distributed storage and task (DST) client module 34 and the plurality of DST execution units 36 of FIG. 1. Each DST execution unit 36 includes a processing module 84 and a memory 88. The memory 88 stores a plurality of storage files 1-S. Each storage file stores encoded data slices. The system functions to access data in the plurality of DST execution units 36. In an embodiment, a dispersed storage and task (DST) processing unit 16 includes a client module 34, when operable within a computing device, that causes the computing device to perform the following method steps: selecting a slice length for a data segment to be stored in the DSN; encoding the data segment using a dispersed storage error coding function to produce a set of data slices in accordance with the slice length; selecting a storage file based on the slice length; generating a storage file identifier (ID) that indicates the storage file; generating a set of DSN addresses corresponding to the set of data slices, wherein the set of DSN addresses each include the storage file ID and a corresponding one of a plurality of offset identifiers (IDs); writing the set of data slices in accordance with the set of DSN addresses; and updating a directory to associate the set of DSN addresses with an identifier of the data segment.

A first storage file can be selected when the slice length has a first value and a second storage file is selected when the slice length has a second value. The first storage file can be selected when the slice length falls within a first range of values and a second storage file is selected when the slice length falls within a second range of values. The storage file can include a file header that includes the plurality of offset identifiers and a corresponding plurality of slice locations.

Each of the plurality of data slices can be stored in the storage file with the selected slice length at one of a plurality of slice locations. The slice length can be selected based on one or more of: a length of the data segment, a predetermination, a vault identifier, a data type of the data segment, or a storage utilization level. The selection of the storage file can be further based on one or more of: a data type of the data segment, a data owner of the data segment, a vault identifier, a data priority level of the data segment, or a preference of a DSN device.

The method described above in conjunction with a DST processing unit 16 can alternatively be performed by other modules of a dispersed storage network, of a dispersed storage and tracking network or by other devices. In addition, at least one memory section that stores operational instructions can, when executed by one or more processing modules of one or more computing devices of a dispersed storage network (DSN), cause the one or more computing devices to perform any or all of the method steps described above.

In an example of operation, the DST client module 34 receives a request to access the data, such as access request 214 from DST client module 34. The request to access the data includes at least one of a write data request and a read data request. When the request to access the data includes the write data request, the DST client module 34 encodes the data using a dispersed storage error coding function associated with the data to produce sets of encoded data slices. Each slice includes a slice length number of bytes in accordance with the dispersed storage error coding function. The DST client module 34 determines the dispersed storage coding function based on the data by at least one of a vault identifier (ID), a lookup based on the vault ID, a requesting entity ID, a predetermination, a data type indicator, a data size indicator, and a request.

Having produced the sets of encoded data slices, the DST client module 34 generates a storage file ID 204 based on a commonality factor of the sets of encoded data slices and other sets of encoded data slices stored within the plurality of DST execution units 36. The commonality factor includes at least one of a slice length range, a data type, a data length, a data owner ID, and an association with a common vault ID. For example, the DST client module 34 generates a storage file ID 214 associated with a first storage file when slice lengths of the sets of encoded data slices fall within a range of 1 to 2 MB slice lengths associated with the storage file 1 and the storage file ID is available (e.g., not utilized for storage of other data). As another example, the DST client module 34 generates another storage file ID 214 associated with a second storage file when the slice lengths of the sets of encoded data slices fall within another range of 15 to 30 MB slice lengths associated with the storage file 2 and the other storage file ID 214 is available.

Having selected the storage file ID 214, the DST client module 34 generates sets of unique DSN addresses 202 for the sets of encoded data slices based on the storage file ID 214. Each DSN address 202 includes the storage file ID 204 (e.g., common for all sets of encoded data slices) and an offset ID 206, where the offset ID 206 is unique for each encoded data slice. For example, the offset ID 206 can be associated with each set of encoded data slices. As another example, the offset ID 206 can be associated with a magnitude of a number of encoded data slices of a group of associated encoded data slices. The DST client module 34 generates sets of write access requests, where each write access request includes an access type 208 (e.g., an access type field may include indicators for other access types including reading, listing, and deleting for other access requests), a corresponding DSN address 202, and a corresponding encoded data slice 212. For example, the DST client module 34 generates the access type 208 to indicate a write slice request. The DST client module 34 sends the sets of write access requests to a set of DST execution units 36 of the plurality of DST execution units 36. The DST client module 34 updates at least one of a DSN directory and a dispersed hierarchical index to associate the sets of DSN addresses and an identifier of the data to facilitate subsequent data retrieval. The method of operation of the DST client module 34, including several optional functions and features, is discussed in greater detail with reference to FIG. 40C. The method of operation of the DST execution unit 36, including several optional functions and features, is discussed in greater detail with reference to FIGS. 40B and 40D.

Figure 40C:
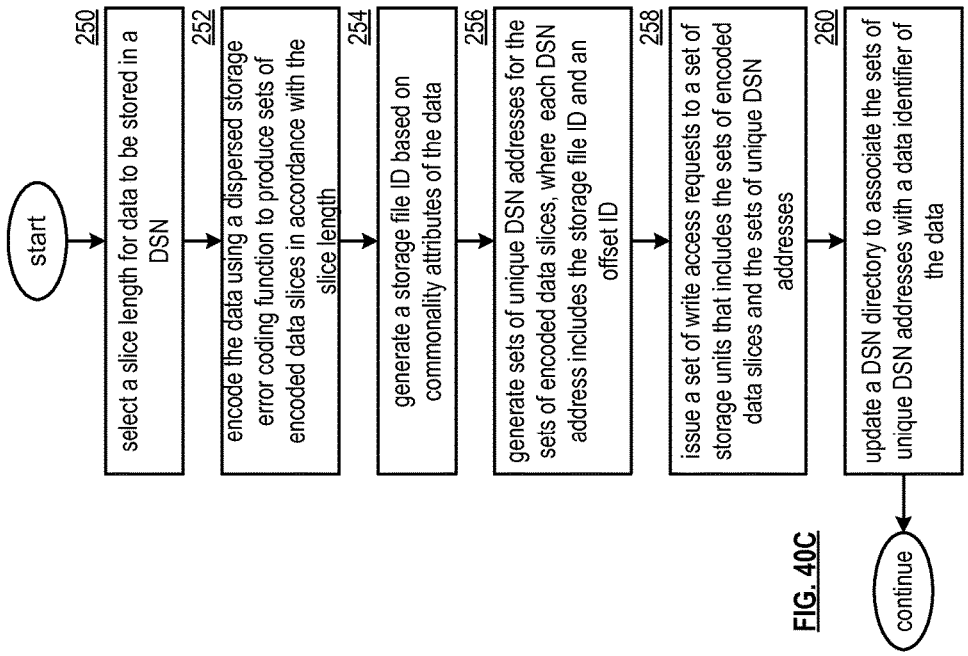
FIG. 40C is a flowchart illustrating an example of writing data in accordance with the present invention.
Figure 40B:
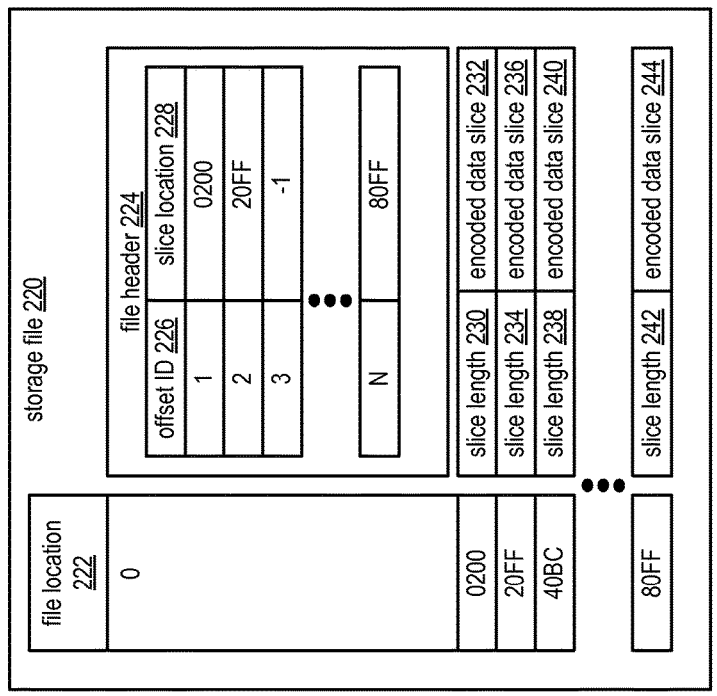
FIG. 40B is a diagram of an embodiment of a storage file structure in accordance with the present invention.

FIG. 40B is a diagram of an embodiment of a storage file structure to facilitate storage of encoded data slices (232, 236, 240, 244 . . . ) within an associated storage file 220, where a dispersed storage network (DSN) address includes a storage file identifier (ID) and an offset ID 226 utilized in selection of the storage file 220 and a storage location, such as slice location 228 within the storage file 220. The storage file 220 includes a file header 224, a plurality of encoded data slices (232, 236, 240, 244 . . . ), and a plurality of slice lengths (230, 234, 238, 242 . . . ) associated with the plurality of encoded data slices (232, 236, 240, 244 . . . ). Alternatively, or in addition to, the storage file 220 may also include a plurality of integrity values associated with the plurality of encoded data slices (232, 236, 240, 244 . . . ). The file header 224 and the plurality of associated encoded data slices (232, 236, 240, 244 . . . ), and slice lengths (230, 234, 238, 242 . . . ) are stored at corresponding ones of the file locations 222 within the storage file 220. The file locations 222 include either an absolute address within the storage file or an offset within the storage file. For example, the file header 224 can be stored at an offset of zero and a first associated encoded data slice 232 and slice length 230 can be stored at an offset with a value of "0200".

The file header 224 includes pairings of an offset ID entry 226 and a slice location entry 228 for a set of 1-N offset IDs 226 associated with the storage file 220. For each offset ID 226, the file header 224 is utilized to indicate at what file location 222 an encoded data slice (232, 236, 240, 244 . . . ) and associated slice length (230, 234, 238, 242, . . . ) are stored. For example, the first associated encoded data slice 232 and slice length 230 are associated with offset ID 1 and are stored at a slice location 228 of the file location 222 with a value of "0200". As another example, a second associated encoded data slice 236/slice length 234 are associated with offset ID 2 and are stored at a slice location 228 of file location 222 with a value of "20FF".

When an association does not exist between an available offset ID 226 and a encoded data slice and slice length pairing, an available marker can be included in the slice location field 228 (e.g., −1). As such, an associated DSN address that includes a storage file ID associated with the storage file 220 and the available offset number may be assigned when writing a new encoded data slice to the storage file 220.

In an example of writing an encoded data slice (232, 236, 240 or 244 . . . ) to the storage file 220, the storage file ID of the DSN address is utilized to access the storage file 220 associated with the storage file ID of a write request. The file header 224 is retrieved from the storage file 220. An available storage/slice location 228 within the storage file 220 is identified. For example, a storage location availability table is accessed to identify a storage location that includes sufficient space to store the encoded data slice (232, 236, 240 or 244 . . . ). As another example, the file header 224 is utilized and slice lengths (230, 234, 238, 242 . . . ) are gathered from slice locations 228 to identify the available storage location. With the available storage location identified, the file header 224 is updated to include the storage location as the sliced location 228 associated with the corresponding offset ID 226 of the DSN address. The encoded data slice and a slice length of encoded data slice are stored at the storage location 228 that is selected.

The file header 224 may be utilized when reading an encoded data slice (232, 236, 240 or 244 . . . ) from the storage file 220. In an example of reading the encoded data slice (232, 236, 240 or 244 . . . ), the file header 224 is retrieved from the storage file 220 based on the storage file ID of the DSN address. The slice location 228 is extracted from the file header 224 based on the offset ID 226 of the DSN address. The slice location 228 is accessed to retrieve the slice length (230, 234, 238 or 242 . . . ). The encoded data slice (232, 236, 240 or 244 . . . ) is retrieved from the storage file 220 based on the slice location 228 and the slice length (230, 234, 238 or 242 . . . ) (e.g., recovered at an offset just beyond a field that stores the slice length entry).

The file header 224 is updated when deleting an encoded data slice (230, 234, 238 or 242 . . . ). In an example of deleting the encoded data slice (230, 234, 238 or 242 . . . ), a delete slice access request includes the DSN address. The storage file 220 is accessed based on the storage file ID of the DSN address. The file header 224 is extracted from the storage file 220. The file header 224 is updated to indicate that the offset ID 226 of the DSN address is available. For example, the slice location field 228 associated with the offset ID 226 is marked to indicate that there is no associated encoded data slice (230, 234, 238 or 242 . . . ). The storage location availability table is updated to indicate that the storage location previously associated with the encoded data slice is available when the storage location availability table is utilized.

Upon deletion of the encoded data slice (230, 234, 238 or 242 . . . ) or at any other time, a determination is made whether to compress the storage file 220. When compressing the storage file 220, a remaining plurality of encoded data slices (230, 234, 238 or 242 . . . ) are packed together at a plurality of the storage locations 228. The file header 224 is updated to include the plurality of new storage locations 228 with corresponding offset IDs 226 associated with the plurality of encoded data slices (230, 234, 238 or 242 . . . ).

FIG. 40C is a flowchart illustrating an example of writing data. The method includes step 250 where a processing module (e.g., of a distributed storage and task (DST) client module) selects a slice length for data to be stored in a dispersed storage network (DSN). The selection may be based on one or more of length of the data, a predetermination, a vault identifier (ID), a data type indicator, and a storage utilization level. For example, the processing module selects a smaller than average slice length when the data is smaller than average. As another example, the processing module selects a smaller than average slice length when the storage utilization level is higher than a maximum storage utilization threshold level.

The method continues at step 252 where the processing module encodes the data using a dispersed storage error coding function to produce sets of encoded data slices in accordance with the slice length. The method continues at step 254 where the processing module generates a storage file ID based on commonality attributes of the data. The commonality attributes include one or more of the slice length, the data type, a data owner, a vault ID, a data priority level, and a DST execution unit set preference. The generating can include generating the storage file ID to be within a storage file ID range of storage file IDs associated with the commonality attributes. For example, the processing module generates the storage file ID to be associated with a first range for encoded data slices with less than average slice lengths. As another example, the processing module generates the storage file ID to be associated with a second range for encoded data slices with average slice lengths. As yet another example, the processing module generates the storage file ID to be associated with a third range for encoded data slices with greater than average slice lengths.

The method continues at step 256 where the processing module generates sets of unique DSN addresses for the sets of encoded data slices, where each DSN address includes the storage file ID and an offset ID. The offset ID can be unique for at least one of each set of encoded data slices and a grouping of associated encoded data slices. The method continues at step 258 where the processing module issues a set of write slice access requests to a set of storage units that includes the sets of encoded data slices and the sets of unique DSN addresses. The method continues at step 260 where the processing module updates a DSN directory to associate the sets of unique DSN addresses with a data identifier of the data.

Figure 40D:
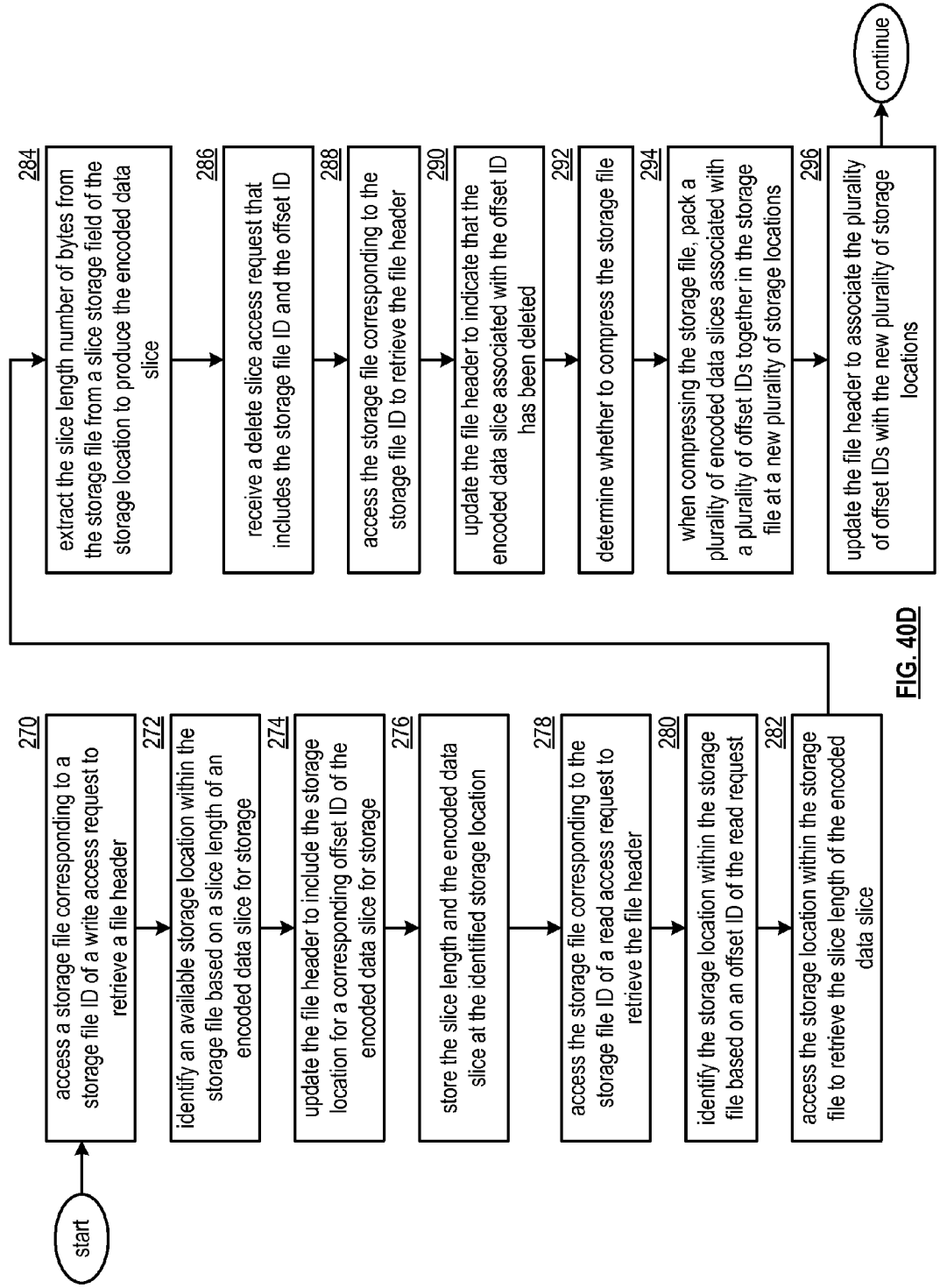
FIG. 40D is a flowchart illustrating an example of accessing encoded data slices in accordance with the present invention.

FIG. 40D is a flowchart illustrating an example of accessing encoded data slices. The method includes step 270 where a processing module (e.g., of a distributed storage and task (DST) client module), for a write sequence, accesses a storage file corresponding to a storage file identifier (ID) of a write access request to retrieve a file header. For example, the processing module performs a storage file location lookup based on the storage file ID to retrieve the storage file and extract the file header from the storage file. The method continues at step 272 where the processing module identifies an available storage location within the storage file based on a slice length of an encoded data slice for storage. The identifying can include analyzing the file header and slice lengths at storage locations referenced by the file header to identify available storage space with sufficient capacity to store the encoded data slice for storage.

The method continues at step 274 where the processing module updates the file header to include the storage location for a corresponding offset ID (e.g., from the write access request) of the encoded data slice for storage. The method continues at step 276 where the processing module stores the slice length and the encoded data slice at the identified storage location. Alternatively, or in addition to, the processing module stores an integrity value (e.g., received and/or generated) of the encoded data slice with the slice length and encoded data slice at the identified storage location.

For a read access sequence, the method continues at step 278 where the processing module accesses the storage file corresponding to the storage file ID of a read access request to retrieve the file header. The method continues at step 280 where the processing module identifies the storage location within the storage file based on an offset ID of the read request. The identifying can include utilizing the offset ID to access the storage location within the file header. The method continues at step 282 where the processing module accesses the storage location within the storage file to retrieve the slice length of the encoded data slice. For example, the processing module can add the storage location to a beginning address of the storage file and the storage location is an offset or directly accesses the storage location when the storage location is an absolute address. The method continues at step 284 where the processing module extracts a slice length number of bytes from the storage file from a slice storage field of the storage location to produce the encoded data slice.

For a delete access sequence, the method continues at step 286 where the processing module receives a delete slice access request that includes the storage file ID and the offset ID. The method continues at step 288 where the processing module accesses the storage file corresponding to the storage file ID to retrieve the file header. The method continues at step 290 where the processing module updates the file header to indicate that the encoded data slice associated with the offset ID has been deleted. For example, the processing module updates the file header to indicate that the offset ID is available (e.g., replaces a storage location with an available marker).

The method continues at step 292 where the processing module determines whether to compress the storage file. The determining may be based on one or more of interpreting a schedule, detecting that an amount of available contiguous storage space is less than a low space threshold level, detecting that a memory utilization level is greater than a maximum utilization threshold level, detecting deletion of encoded data slice, and/or receiving a request. When compressing the storage file, the method continues at step 294 where the processing module packs a plurality of encoded data slices associated with a plurality of offset IDs together in the storage file at a new plurality of storage locations. The packing may include temporarily buffering at least some of the plurality of encoded data slices while moving encoded data slices from previous storage locations to the new plurality of storage locations. Some level of overlap may occur between the previous storage locations in the new plurality of storage locations. For instance, encoded data slices been stored at a same storage location and a second encoded data slice being stored at a previous storage location of a first encoded data slice. The method continues at step 296 where the processing module updates the file header to associate the plurality of offset IDs with the new plurality of storage locations.

FIG. 41A is a schematic block diagram of another embodiment of a dispersed storage network that includes the distributed storage and task (DST) client module 34 and the plurality of DST execution units 36 of FIG. 1 (e.g., a set of DST execution units 1-n). Each DST execution unit 36 includes a processing module 84 and a plurality of memories. Each memory stores a plurality of encoded data slices (e.g., 1-M, 1-N, 1-P, etc.). The system functions to access data in the plurality of DST execution units.

In an embodiment, the dispersed storage and task (DST) processing unit 16 includes at least one module, such as DST client module 34, when operable within a computing device, that causes the computing device to perform the following method steps: receiving a data access request corresponding to a data segment; obtaining range availability information for a plurality of DST execution units of the DST network; selecting a subset of the plurality of DST execution units based on the range availability information and a threshold number corresponding to the data access request; and generating execution unit access requests to the subset of the plurality of DST execution units corresponding to a plurality of slices of the data segment, wherein the execution unit access requests include address information that is based on the range availability information.

The threshold number can correspond to a read threshold number when the data access request includes a read request and the threshold number can correspond to a write threshold number when the data access request includes a write request and wherein the read threshold number is less than the write threshold number. The range availability information for the plurality of DST execution units can include at least one of: a historical record of range availability for the plurality of DST execution units, a range availability response to a query to at least one of the plurality of DST execution units, an error message corresponding to at least one of the plurality of DST execution units, and/or a test of range availability of the plurality of DST execution units.

Each of the plurality of DST execution units can include a corresponding range of DST addresses and the address information can be generated to correspond to the range of DST addresses of the subset of the plurality of DST execution units. At least one of DST execution units can include a plurality of memory subranges, and the range availability information can identify at least one of the plurality of subranges—wherein the address information is determined based on the at least one of the plurality of subranges.

The process of selecting the subset of the plurality of DST execution units can include including ones of the DST execution units with range availability in the subset of the plurality of DST execution units. The process of selecting the subset of the plurality of DST execution units can further be based on a determination, for the subset of the plurality of DST execution units, at least one of, a current level of activity, a predicted level of input/output activity, or a predicted level of slice rebuilding.

The method described above in conjunction with the DST processing unit 16 can alternatively be performed by other modules of a dispersed storage network, of a dispersed storage and tracking network or by other devices. In addition, at least one memory section that stores operational instructions can, when executed by one or more processing modules of one or more computing devices of a dispersed storage network (DSN), cause the one or more computing devices to perform any or all of the method steps described above.

In an example of operation, the DST client module 34 assigns a dispersed storage network (DSN) address range to each of the DST execution units. Alternatively, a distributed storage and task network (DSTN) managing unit assigns the DSN address range. As such, encoded data slices with a DSN address that fall within the DSN address range are directed to the associated DST execution unit. For example, an encoded data slice associated with a range one DSN address is directed to a first DST execution unit (e.g., DST execution unit range 1). At least one of the processing module 84 and the DST client module 34 assigns a set of 1-R DSN address sub-ranges within an associated DSN address range of a DST execution unit, where each DSN address sub-ranges associated with a memory of the plurality of memories. For example, the processing module 84 assigns a first DSN address sub-range to a first memory (e.g., memory sub-range 1). As such, encoded data slices 1-M associated with the first DSN address sub-range are stored within the first memory.

In an example of accessing data, the DST client module 34 generates or receives a data access request 300. The DST client module 34 obtains range availability information 302 associated with memories of the DST execution units. The range availability information can include one or more of, by a DSN address sub-range, a performance level, a reliability level, and/or an availability level. The obtaining can include at least one of issuing a range availability request, interpreting an error message, accessing a historical record, or receiving the range availability information.

Having obtained the range availability information 302, the DST client module 34 generates addressing information based on the data access request 300 and the range availability information 302. For example, when the data access request 302 is a write data access request, the DST client module 34 selects a DSN address within a DSN address sub-range associated with most favorable range availability information 302 (e.g., more favorable performance than others). As another example, when the data access request 300 is a read data access request, the DST client module 34 retrieves the DSN address from a DSN directory based on a data ID of the data access request.

The DST client module 34 generates a threshold number of access requests 300 based on the range availability information 302. The access request 300 can include the addressing information. For example, the DST client module 34 selects a subset of DST execution units based on the range availability information 302 (e.g., more favorable performance). The DST client module 34 sends the threshold number of access requests 300 to an associated threshold number of DST execution units.

Figure 41B:
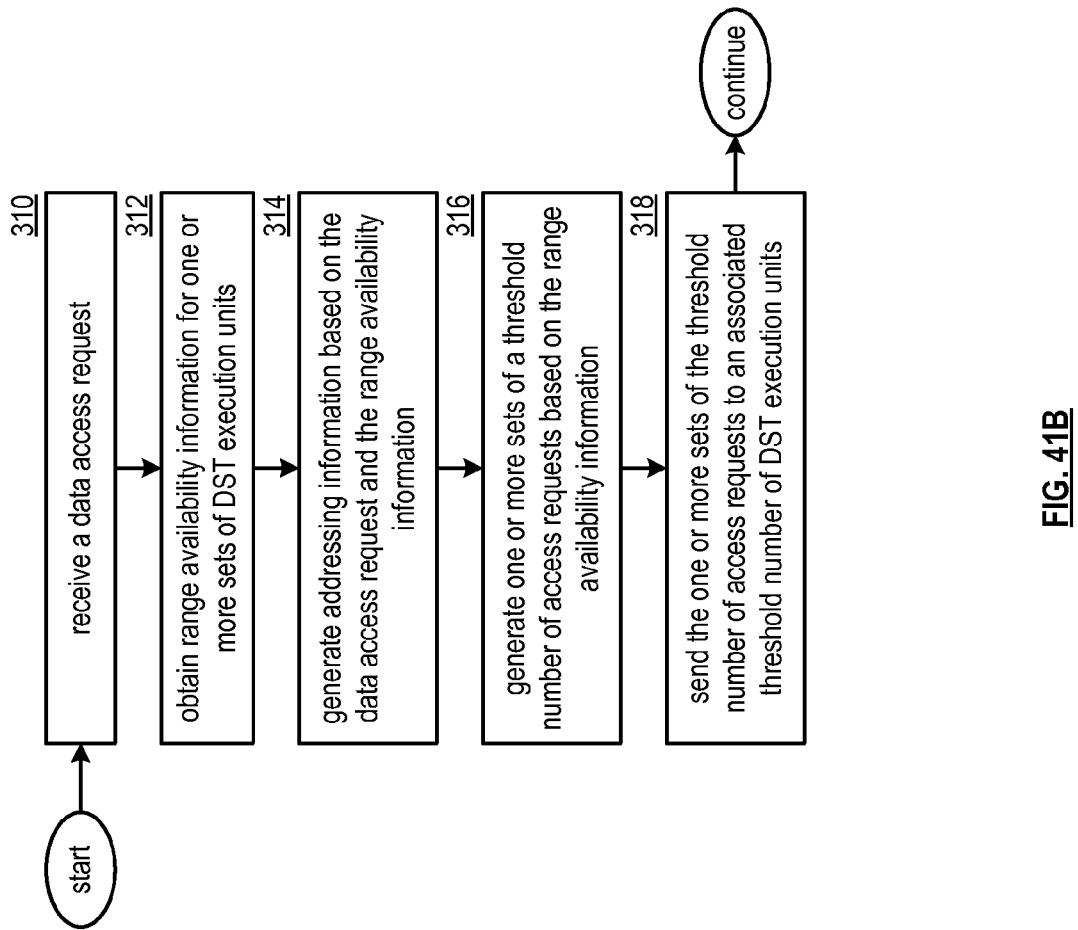
FIG. 41B is a flowchart illustrating an example of accessing data in accordance with the present invention.

FIG. 41B is a flowchart illustrating an example of accessing data. The method includes step 310 where a processing module (e.g., of a distributed storage and task (DST) client module) receives a data access request (e.g. read, write). The method continues at step 312 where the processing module obtains range availability information for one or more sets of DST execution units. For example, the processing module performs a range availability performance test to acquire performance information as the availability information. The method continues at step 314 where the processing module generates addressing information based on the data access request and range availability information.

The method continues at step 316 where the processing module generates one or more sets of a threshold number of access requests based on the range availability information. For example, when the data access request is a read access request, the processing module generates a read threshold number of read slice access requests. As another example, when the data access request is a write access request, the processing module generates a write threshold number of write slice access requests. The generating can include selecting the threshold number of addressing sub-ranges associated with favorable range availability information. For example, the processing module selects addressing sub-ranges associated with a least amount of pending access requests. As another example, the processing module selects addressing sub-ranges associated with a least amount of pending encoded data slice rebuilding requests.

The method continues at step 318 where the processing module sends the one or more sets of the threshold number of access requests to an associated threshold number of DST execution units. Sending the access requests can include identifying the threshold number of DST execution units associated with the selected addressing sub-ranges.

Figure 42A:
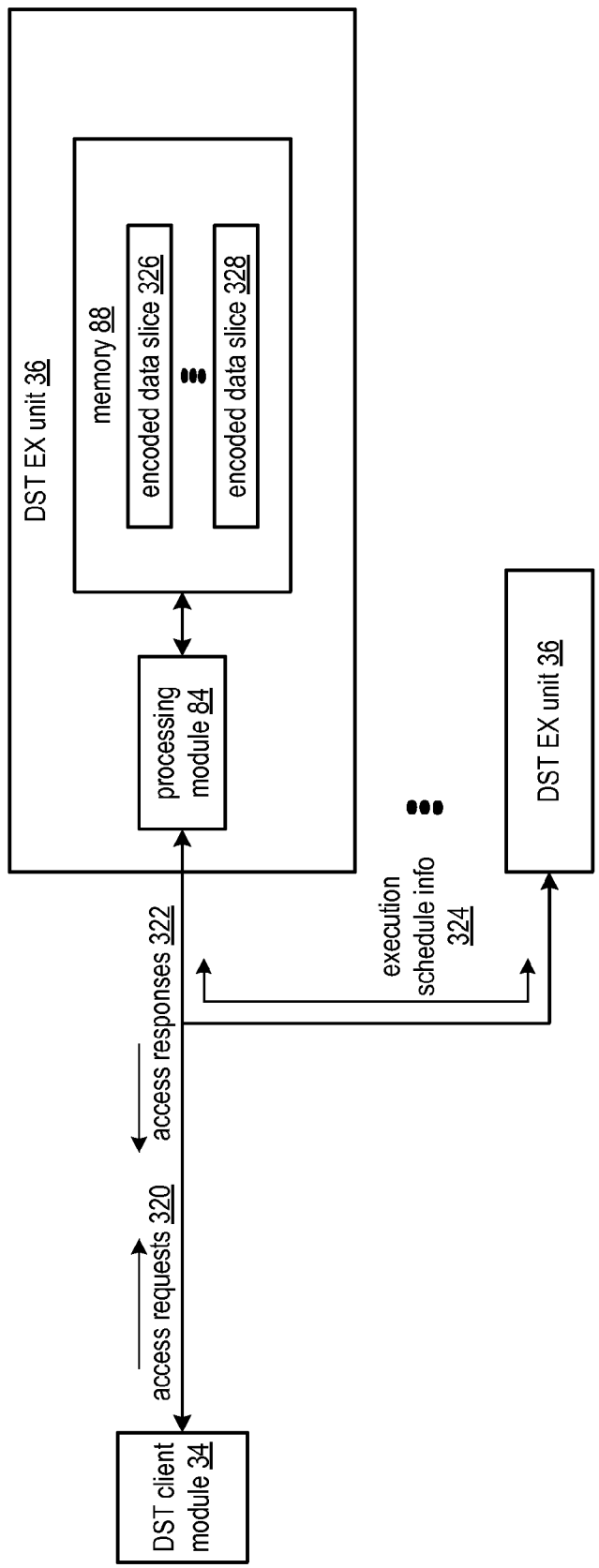
FIG. 42A is a schematic block diagram of another embodiment of a dispersed storage network in accordance with the present invention.

FIG. 42A is a schematic block diagram of another embodiment of a dispersed storage network that includes the distributed storage and task (DST) client module 34 and the plurality of DST execution units 36 of FIG. 1 (e.g., a set of DST execution units 1-n). Each DST execution unit 36 includes a processing module 84 and a memory 88. Each memory 88 stores a plurality of encoded data slices (326, 328 . . . ). The system functions to prioritize access of data in the plurality of DST execution units.

In an embodiment, the dispersed storage and task (DST) processing unit 16 includes at least one module, when operable within a computing device, that causes the computing device to perform the following method steps: receiving an access request; determining an estimated processing load associated with the access request; selecting a processing resource based on the estimated processing load; determining a coordinated execution schedule for a plurality of DST execution units; and assigning the access request to the processing resource in accordance with the coordinated execution schedule. In addition, the method can further include: detecting an execution deviation in the coordinated execution schedule; and updating the coordinated execution schedule in response to the execution deviation.

The estimated processing load can be determined based on at least one of: an access type corresponding to the access request, or a quantity of data slices associated with the access request. The processing resource can be selected from a plurality of processing resources, based on a capability of the processing resource.

The coordinated execution schedule can be determined based on at least one of: an execution status associated with one or more current access requests, or a number of access requests in queue. The coordinated execution schedule can also be determined to coordinate commencement of the access request across at least a subset of the plurality of DST execution units. The coordinated execution schedule can also be determined to coordinate commencement of the access request across at least a subset of the plurality of DST execution units based on an estimated completion time of one or more prior access requests.

The method described above in conjunction with the DST processing unit 16 can alternatively be performed by other modules of a dispersed storage network, of a dispersed storage and tracking network or by other devices. In addition, at least one memory section that stores operational instructions can, when executed by one or more processing modules of one or more computing devices of a dispersed storage network (DSN), cause the one or more computing devices to perform any or all of the method steps described above.

In an example of operation, the DST client module 34 sends an access request 320 to a DST execution unit 36. The access request 320 is associated with one or more encoded data slices and a common task, where the common task includes at least one access type including reading, writing, deleting, and listing. The processing module 84 of the DST execution unit 36 receives the access request 320. The processing module 84 determines an estimated processing load to service the access request based on one or more of the access type and quantity of encoded data slices of the access request 320. The processing module 84 selects a processing resource for the access request based on the estimated processing load and capability of the processing resource. For example, the processing module 84 selects the memory 88 and a CPU of the processing module 84.

Having selected the processing resource, the processing module 84 determines an execution schedule for the access request based on status of executing a current access request and other previously queued access requests assigned to processing resources of the set of DST execution units. The processing of the access request is scheduled to commence at an estimated time of completion of all current and pending access requests associated with the processing resource. The estimated time of completion is similar across the set of DST execution units. The processing module 84 exchanges execution schedule information 324 with other DST execution units 36, where the other DST execution units 36 receive associated access requests 320. The processing module 84 assigns access request 320 to the selected processing resource in accordance with the execution schedule to facilitate execution of the access request. Upon completion of the access request, the processing module 84 issues an access response 322 to the DST client module 34 that includes results of the access request (e.g., status of a write the encoded data request, an encoded data slice from a read request, a status from a delete encoded data slice request).

Figure 42B:
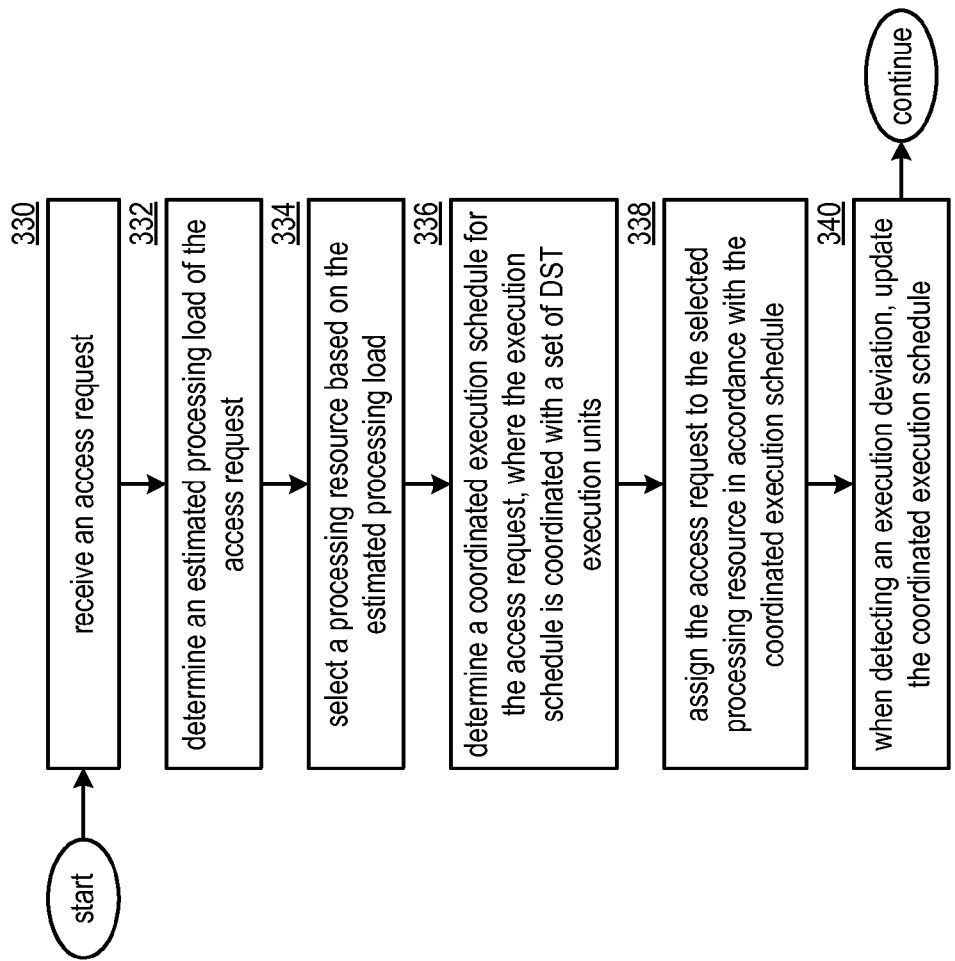
FIG. 42B is a flowchart illustrating an example of scheduling an access request in accordance with the present invention.

FIG. 42B is a flowchart illustrating an example of scheduling an access request. The method includes step 330 where a processing module (e.g., of a distributed storage and task (DST) execution unit) receives an access request (e.g., read, write, delete, list, etc.). The method continues at step 332 where the processing module determines an estimated processing load of the access request. The determining includes at least one of performing a lookup based on an access type of the read access request, initiating a query, receiving processing load information, and/or accessing a historical record. The method continues at step 334 where the processing module selects a processing resource based on the estimated processing load. The selecting includes identifying the processing resource that as processing availability and is capable of executing the access request.

The method continues at step 336 where the processing module determines a coordinated execution schedule for the access request, where the execution schedule is coordinated with a set of DST execution units. The determining includes, when the access request is one of a threshold number of access requests sent to a threshold number of DST execution units, aligning a start time for execution of the access request with the other DST execution units based on one or more of an estimated time of availability of the selected processing resource and availability of the other DST execution units to initiate execution of corresponding access requests. The processing module exchanges execution schedule information (e.g., current request processing, pending request processing, estimated time of availability of one or more processing resources) with the other DST execution units to facilitate the determination of the coordinated execution schedule for the access request.

The method continues at step 338 where a processing module assigns the access request to the selected processing resource in accordance with the coordinated execution schedule. The assigning includes scheduling the selected processing resource to execute the access request at the start time. The method continues at step 340 where the processing module, when detecting an execution deviation, updates the coordinated execution schedule. The updating includes detecting the execution deviation by exchanging execution schedule information with the threshold number of DST execution units and indicating the execution deviation when one or more DST execution units indicate that processing of an associated access request is behind schedule in relation to the coordinated execution schedule. The updating further includes realigning selection of processing resources to improve adherence to the updated coordinated execution schedule.

Figure 43A:
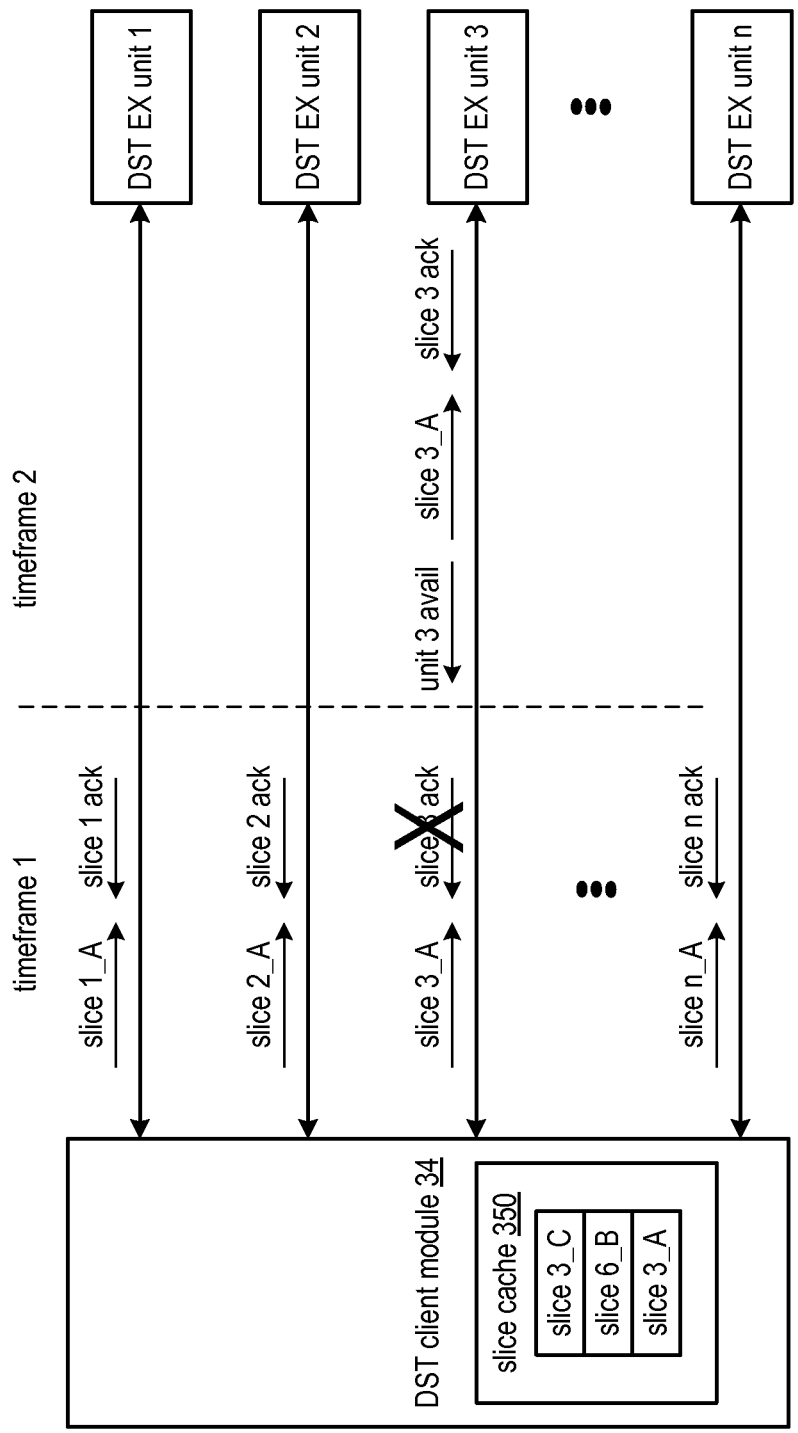
FIG. 43A is a schematic block diagram of another embodiment of a dispersed storage network in accordance with the present invention.

FIG. 43A is a schematic block diagram of another embodiment of a dispersed storage network that includes the DST client module 34 and a set of DST execution units 1-n of FIG. 1. The DST client module 34 includes a slice cache memory 350. The system functions to store sets of encoded data slices in the set of DST execution units 1-n.

In an example of operation, in a first timeframe, the DST client module issues a set of write slice requests 1-n to store a set of encoded data slices A in the set of DST execution units 1-n. When receiving at least a write threshold number of favorable write slice responses (e.g., acknowledging storage of an associated read threshold number of encoded data slices of the set of encoded data slices), the DST client module 34 identifies any encoded data slices not associated with a storage acknowledgment. For instance, the DST client module 34 does not receive a write slice response for encoded data slice 3.

The DST client module 34 stores the encoded data slices not associated with the storage acknowledgment (e.g., without write confirmation) in the slice cache 350. For example, the DST client module 34 stores encoded data slice 3_A in a cache memory. The DST client module 34 overwrites an oldest previously stored encoded data slice in the slice cache 350 when the slice cache 350 is full. The DST client module 34 determines whether to resend an encoded data slice without write confirmation to associated DST execution unit based on one or more of receiving a DST execution unit availability indicator, interpreting a resend schedule, receiving an error message, receiving an access request response, receiving a resend request that request resending encoded data slices without write confirmation, and receiving a rebuilding request. For example, the DST client module 34 determines to resend encoded data slice 3_A when DST execution unit 3 issues a DST execution unit 3 available message.

When determining to resend the encoded data slice without write confirmation, the DST client module 34 resends the encoded data slice without write confirmation to the associated DST execution unit. For example, the DST client module 34 resends encoded data slice 3_A to the DST execution unit 3. When receiving a favorable write slice response, the DST client module 34 deletes the encoded data slice without write confirmation from the slice cache. For example, the DST client module 34 receives a encoded data slice 3 write slice response (e.g., a favorable acknowledgment) and deletes encoded data slice 3_A from the slice cache 350.

Figure 43B:
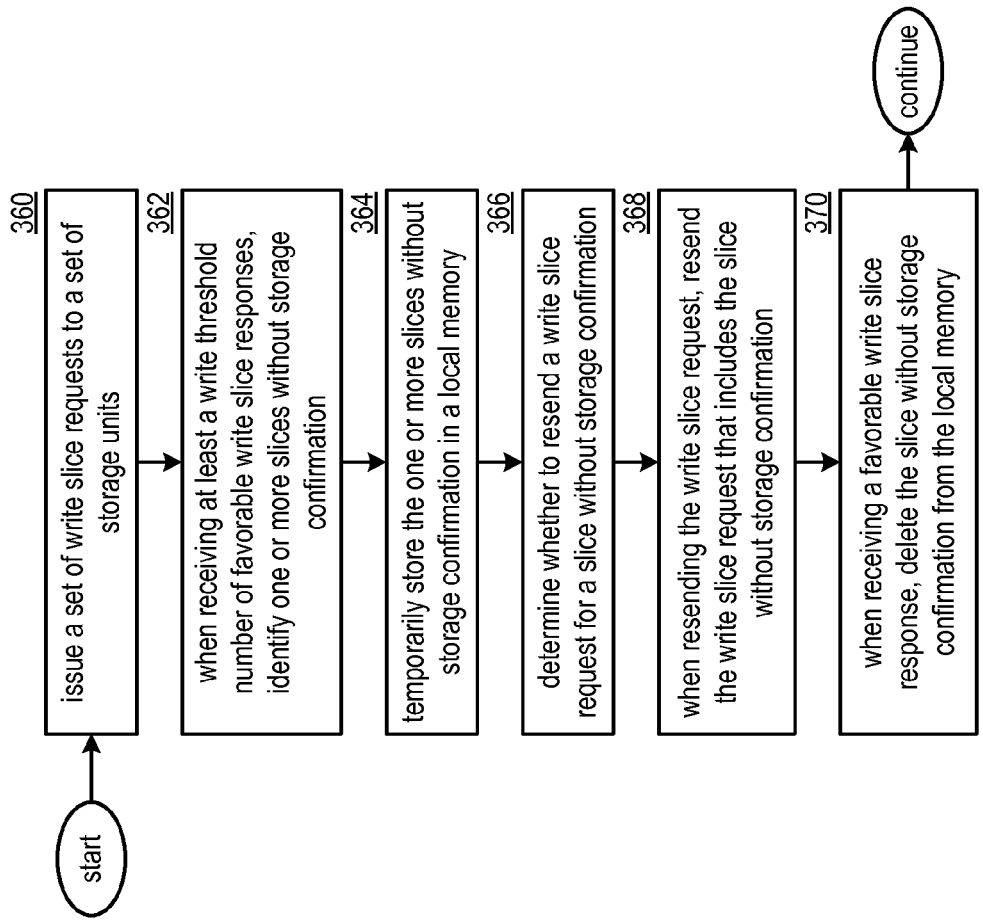
FIG. 43B is a flowchart illustrating an example of completing writing of encoded data slices in accordance with the present invention.

FIG. 43B is a flowchart illustrating an example of completing writing of encoded data slices. The method includes step 360 where a processing module (e.g., of a distributed storage and task (DST) client module) issues a set of write slice requests to a set of storage units. The issuing includes generating and sending at least a write threshold number of write slice requests, where each request includes an encoded data slice. When receiving at least a write threshold number of favorable write slice responses, the method continues at step 362 where the processing module identifies one or more encoded data slices without storage confirmation. The identifying includes receiving write slice responses, determining whether each write slice response indicates favorable writing, and detecting whether no write slice response has been received for an encoded data slice within a response timeframe.

The method continues at step 364 where the processing module temporarily stores the one or more encoded data slices without storage confirmation in a local memory (e.g., a cache memory). The storing includes overwriting an oldest encoded data slice previously stored in the local memory when the local memory is full. The method continues at step 366 where the processing module determines to resend a write slice request for an encoded data slice without storage confirmation. The determining includes at least one of receiving an availability indicator, interpreting a resend schedule, receiving an error message, receiving an access request response, receiving a resend request, and receiving a rebuilding request.

When resending the write slice request, the method continues at step 368 where the processing module resends the write slice request that includes the encoded data slice without storage confirmation. For example, the processing module retrieves the encoded data slice without storage confirmation from the local memory and outputs the encoded data slice to an associated storage unit. When receiving a favorable write slice response, the method continues at step 370 where the processing module deletes the encoded data slice without storage confirmation from the local memory. The deleting includes receiving a write slice response and detecting favorable writing within a response timeframe from the resending of a write slice request.

FIG. 44A is a schematic block diagram of another embodiment of a distributed computing system that includes the distributed computing system 10 of FIG. 1. The distributed storage and task network (DSTN) managing unit 18 generates a dispersed storage network (DSN) access whitelist. The generating is based on one or more of a template whitelist, a manager input, detecting devices of the distributed computing system 10, and receiving vault association information. The vault association information associates devices of the distributed computing system 10. For example, a first distributed storage and task (DST) processing unit 16 is associated with a first set of DST execution units 36 for a first vault and a second distributed storage and task (DST) processing unit 16 is associated with a second set of DST execution units 36 for a second vault. Each association indicates which devices are authorized to communicate with each other to co-execute services supported by the distributed computing system 10. Such services includes one or more of writing data, reading data, deleting data, listing data, rebuilding data, and managing configuration parameters of the system.

The DSN access whitelist 380 includes a plurality of sets of entries where each set of entries includes a first entry for a service identifier (ID) field 390, a second entry for a device ID field 392, a third entry for a initiate to device IDs field 394, and a fourth entry for a received from devices IDs field 396. Entries of the service ID field 390 indicate a service type of the services supported by the system. Entries of the device ID field 392 indicate an identifier associated with one of the devices of the system (e.g., a universally unique identifier associated with one or more of the user device 12, the DST processing unit 16, etc.). Entries of the initiate to device IDs field 394 indicate one or more allowable device IDs to be targeted for an associated service type. Entries of the received from device IDs field 396 indicate one or more allowable device IDs to accept requests from with regards to the associated service type.

With the whitelist 380 generated, the DSTN managing unit 18 distributes the DSN access whitelist 380 to each device of the system. For example, from time to time, the DSTN managing unit 18 publishes registry information to one or more of the devices of the system, where the registry information includes the DSN access whitelist 380. The method to generate and distribute the DSN access whitelist is discussed in greater detail with reference to FIG. 44B.

Figure 44B:
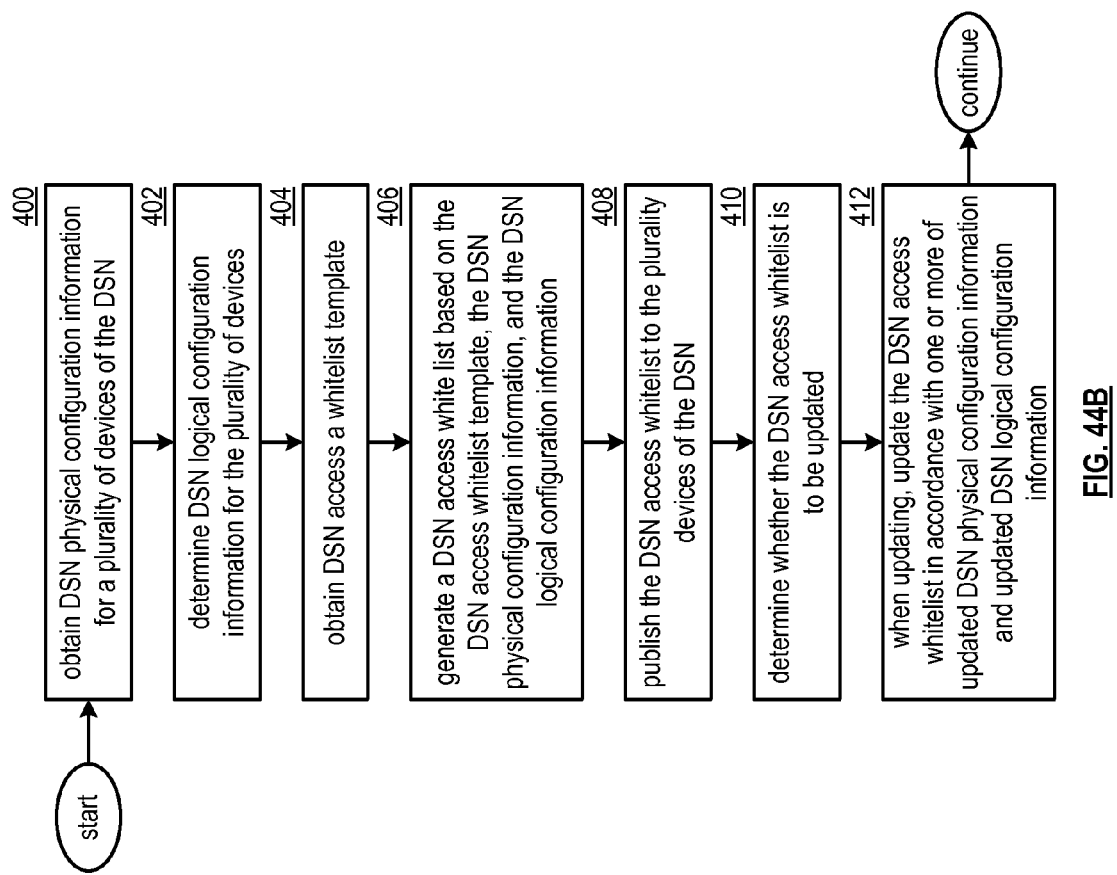
FIG. 44B is a flowchart illustrating an example of updating access control information in accordance with the present invention.

FIG. 44B is a flowchart illustrating an example of updating access control information. The method includes step 400 where a processing module (e.g., of a distributed storage and task network (DSTN) managing unit) obtains dispersed storage network (DSN) physical configuration information for a plurality of devices of the DSN. The DSN physical configuration information includes one or more of identities of the devices, device types of the devices, and one or more network addresses for each device. The obtaining includes at least one of initiating a query, receiving a response, receiving manufacturing device information, interpreting a manager input, and receiving a template. The method continues at step 402 where the processing module determines DSN logical configuration information for the plurality of devices. The DSN logical configuration information includes one or more of identities of processes supported, process types, and assignments of processes to a device. The determining includes matching capabilities of a physical device to required processes, interpreting a manager input, receiving a template, performing a test, initiating a query, and receiving a query response.

The method continues at step 404 where the processing module obtains a DSN access whitelist template. The DSN access whitelist template includes typical entries for a DSN access whitelist (e.g., typical service initiators, typical service receivers by service type and device type). The obtaining includes at least one of receiving a manufacturing template, obtaining a previous template, receiving a manager input that includes the template, and generating the template based on the DSN physical configuration information and the DSN logical configuration information.

The method continues at step 406 where the processing module generates a DSN access whitelist based on the DSN access whitelist template, the DSN physical configuration information, and the DSN logical configuration information. The generating includes modifying the DSN access whitelist template in accordance with the DSN physical configuration information and the DSN logical configuration information. For example, the processing module, for each service supported by the DSN, enable only those devices required to send service requests of the service and to enable only those devices required to receive the service requests of the service. For instance, the processing module modifies the DSN access whitelist template to associate a set of distributed storage and task (DST) execution units with a DST processing unit where the DST processing unit is authorized to request data access services and the set of DST execution units are authorized to receive the requested data access services. In another instance, the processing module modifies the DSN access whitelist to enable the set of DST execution units to initiate and share encoded data slice rebuilding service requests between DST execution units. In yet another instance, the processing module modifies the DSN access whitelist to enable the DSTN managing unit to initiate simple network management protocol polling requests and canned registry publishing service requests and for all other devices to receive and process the simple network management protocol polling requests and the canned registry publishing service requests.

The method continues at step 408 where the processing module publishes the DSN access whitelist to the plurality devices of the DSN. For example, the processing module outputs registry information to the plurality devices, where the registry information includes the DSN access whitelist. The method continues at step 410 where the processing module determines whether the DSN access whitelist is to be updated. The determining includes at least one of interpreting an updating schedule, detecting a change in the DSN physical configuration information, and detecting a change in the DSN logical configuration information.

When updating the DSN access whitelist, the method continues at step 412 where the processing module updates the DSN access whitelist in accordance with one or more of updated DSN physical configuration information and updated DSN logical configuration information. The updating includes determining the updated DSN physical configuration information, determining the updated DSN logical configuration information, and regenerating the DSN access whitelist based on the updated DSN physical configuration information and the updated DSN logical configuration information. The updating further includes republishing the updated DSN access whitelist to the plurality of devices of the DSN.

Figure 45A:
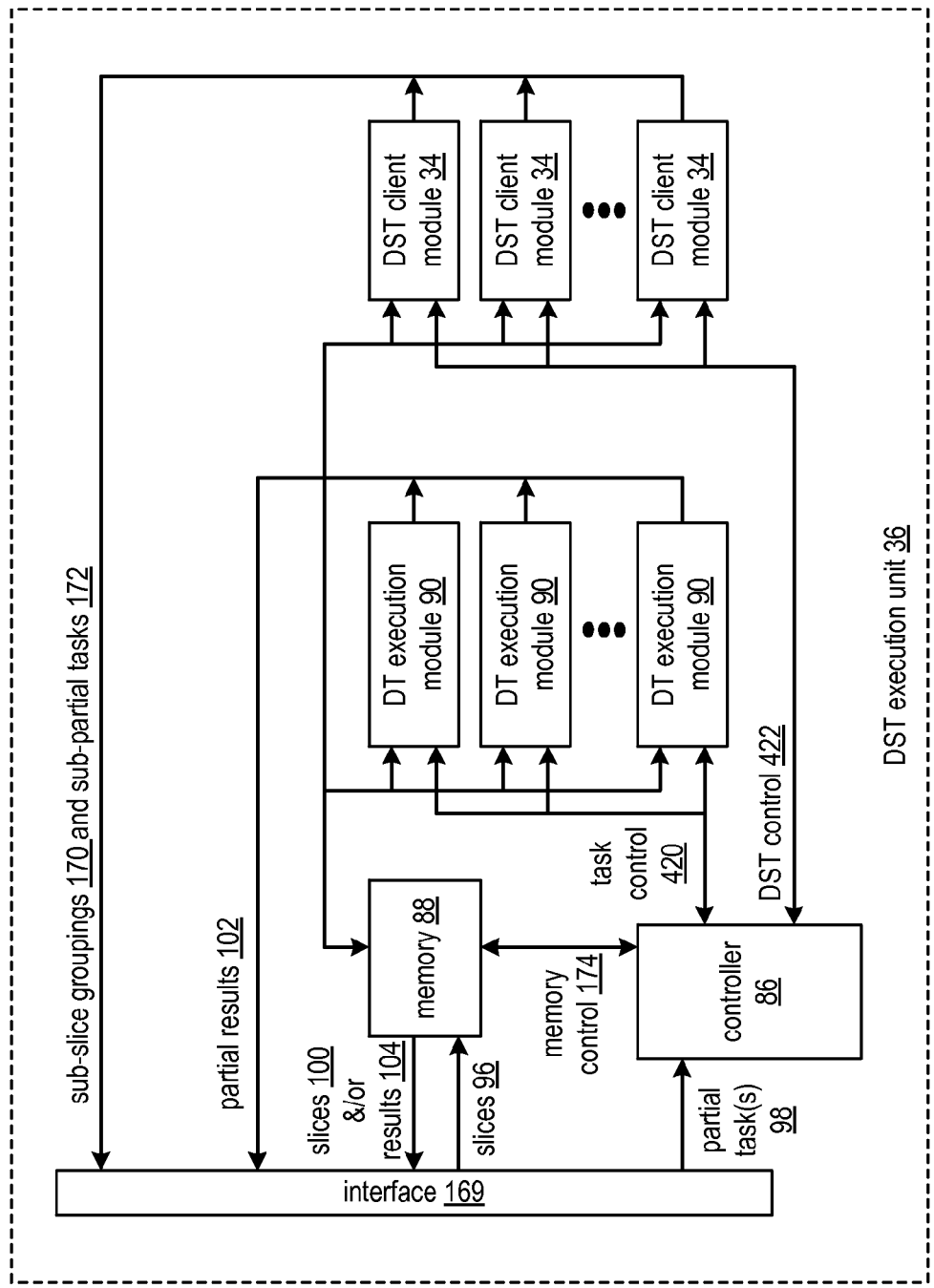
FIG. 45A is a schematic block diagram of another embodiment of a distributed storage and task execution unit in accordance with the present invention.

FIG. 45A is a schematic block diagram of another embodiment of a distributed storage and task (DST) execution unit 36 of FIG. 11. The DST execution unit 36 includes a variety of devices including an interface 169, the memory 88, the controller 86, a plurality of distributed task (DT) execution modules 90, and a plurality of DST client modules 34. The DST execution unit 36 functions to configure the variety of devices and to utilize the variety of configured devices to process partial task requests 98 and to process encoded data slice access requests (e.g., receiving slices 96 for storage and retrieving slices 100).

In an example of configuring a variety of devices, the controller 86 obtains status of the variety of devices of the DST execution unit 36, including the memory 88, the plurality of DT execution modules 90, and the plurality of DST client modules 34. The obtaining includes one or more of issuing a memory control message 174 to the memory 88, issuing a task control message 420 to the plurality of DT execution modules 90, issuing a DST control message 422 to the plurality of DST client modules 34, receiving memory control information 174 from the memory 88 that includes memory status, receiving a task control message 420 from one or more of the DT execution modules 90 that includes DT execution module status, and receiving a DST control message from one or more of the DST client modules 34 that includes a DST client module status. The status includes one or more of processing utilization level information, memory utilization level information, garbage collection logs, error information, number of available computing cores, central processing unit (CPU) speed, actual task processing throughput levels, and pending activity information.

With the status of the devices obtained, the controller 86 generates a status score based on the status of the devices. The status score includes one or more of a memory score and a task execution score. For example, the controller generates a higher than average memory score when the status indicates that a greater than average amount of storage space of the memory 88 is available. As another example, the controller generates a lower than average task execution score when the status indicates that the task processing throughput level is lower than average. With the status score generated, the controller 86 determines configuration information for the devices based on the status score. For example, the controller 86 increases a default cache memory size, increases a number of concurrent connections, increases memory available to tasks, and increases a number of cached nodes of a dispersed hierarchical index when the memory score is higher than an average memory score. As another example, the controller 86 increases a number of rebuilding threads, increases frequency of rebuilding scanning, and increases a number of distributor processing tasks when the task execution score is greater than an average task execution score. As yet another example, the controller 86 turns off distributed processing tasks when the task execution score is lower than the average task execution score. As is still further example, the controller 86 disables storage of foster encoded data slices when the memory score is lower than the average memory score.

With the configuration information determined, the controller 86 activates the configuration information with the devices of the DST execution unit 36. For example, the controller 86 issues the memory control 174, the task control 420, and the DST control 422 to include the configuration information.

In an example of utilizing the variety of configured devices, the controller 86 receives a request via the interface 169, where the request includes at least one of a slice processing request and a partial task 98. The controller 86 identifies a resource type based on the request (e.g., a DT execution module type for the partial task 98 and a DST client module type for the slice processing request). The controller 86 determines whether the resource type is available based on the status. When the resource type is available, the controller 86 selects a particular resource for assignment of the request. For example, the controller 86 identifies a third DST client module 34 that is most available for the request when the request is the slice processing request. As another example, the controller 86 selects a fourth DT execution module 90 when the fourth DT execution module 90 is associated with processing resources capable of executing the partial task 98 when the request is the partial task 98. The controller 86 assigns the request to the selected resource. The assigning includes at least one of outputting an assignment task control message to an assigned DT execution module 90 and outputting an assignment DST control message to the assigned DST client module. When the resource type is not available, the controller 86 may issue an error response via the interface 169 to a requesting entity and/or to a managing unit.

The assigned DT execution module 90 executes the assigned partial task 98 to produce partial results 102. Alternatively, or in addition to, the assigned DT execution module 90 facilitates the memory 88 to retrieve slices 96 and to output results 104. The assigned a DST client module 34 executes the slice processing request to facilitate producing at least one of sub-slice groupings 170 and sub-partial partial tasks 172. Alternatively, or in addition to, the DST client module 34 may facilitate the memory 88 to provide slices 100 and/or two receives slices 96 for further slice processing.

The controller 86 may regenerate the status score to produce an updated status score and updated configuration information based on the utilization of the variety of configured devices. In an example of the regenerating, the controller 86 determines whether to update the configuration information based on deviations of the updated status score. The determining includes updating the status score to produce the updated status score and indicating to update the configuration information when the comparison of the updated status score and the status score is unfavorable (e.g., the scores are different by more than a deviation threshold level). When updating the configuration information, the controller 86 updates the configuration information based on the updated status scoring. The controller 86 activates the updated configuration information with the devices of the DST execution unit 36.

Figure 45B:
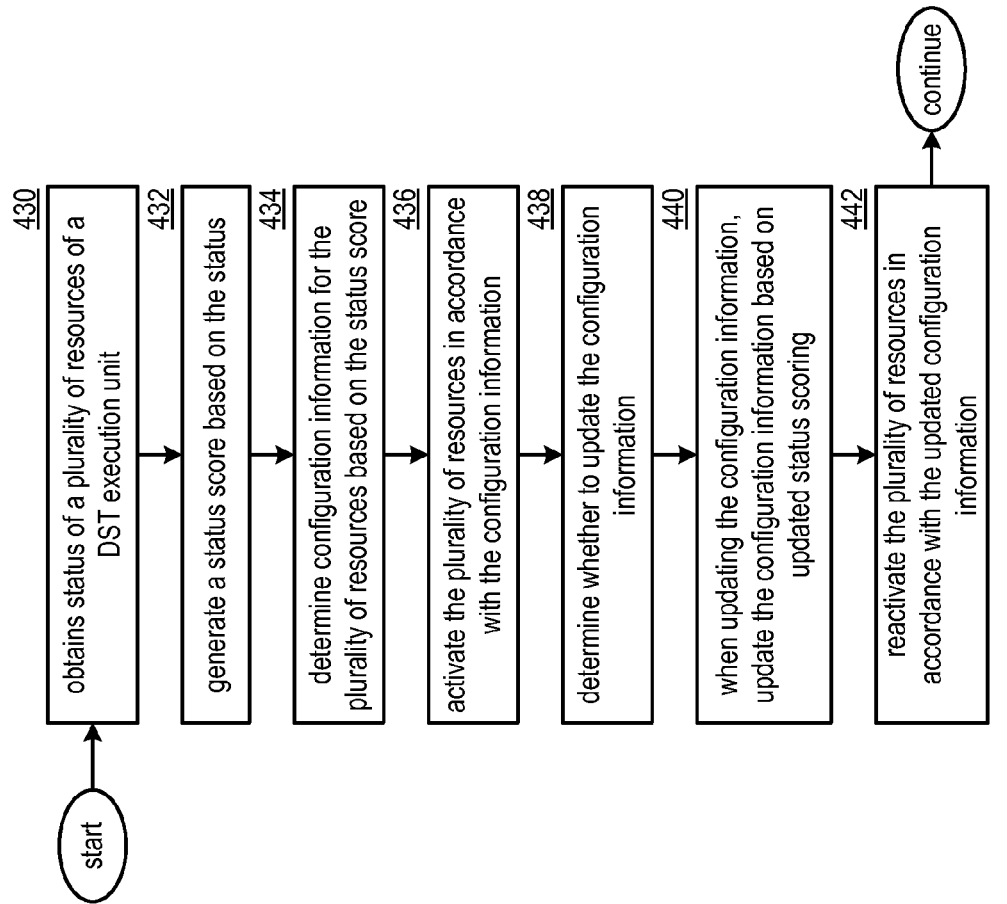
FIG. 45B is a flowchart illustrating an example of configuring a distributed storage and task unit in accordance with the present invention.

FIG. 45B is a flowchart illustrating an example of configuring a distributed storage and task unit. The method includes step 430 where a processing module (e.g., of a controller of a distributed storage and task (DST) execution unit) obtains status of a plurality of resources of the DST execution unit. The obtaining includes at least one of initiating a query, receiving a query response, performing a lookup, accessing a historical record, and interpreting a received error message. The method continues at step 432 where the processing module generates a status score based on the status. The generating includes generating a memory score and a task execution score based on the status (e.g., a weighted scoring amongst a plurality of status factors).

The method continues at step 434 where the processing module determines configuration information for the plurality of resources based on the status score. The determining includes determining processing configuration based on the task execution score and determining memory configuration based on the memory score. The method continues at step 436 where the processing module activates the plurality of resources in accordance with the configuration information. For example, the processing module issues the configuration information to the plurality of resources.

The method continues at step 438 where the processing module determines whether to update the configuration information. The determining includes at least one of interpreting a configuration information updating schedule, receiving an error message, receiving a manager input, and detecting a deviation of the status. When updating the configuration information, the method continues at step 440 where the processing module updates the configuration information based on updated status scoring. The updating includes re-obtaining the status of the plurality of resources, regenerating the status score, and re-determining the configuration information to produce updated configuration information. The method continues at step 442 where the processing module reactivates the plurality of resources in accordance with the updated configuration information. The reactivating includes reissuing the updated configuration information to the plurality of resources.

Figure 46A:
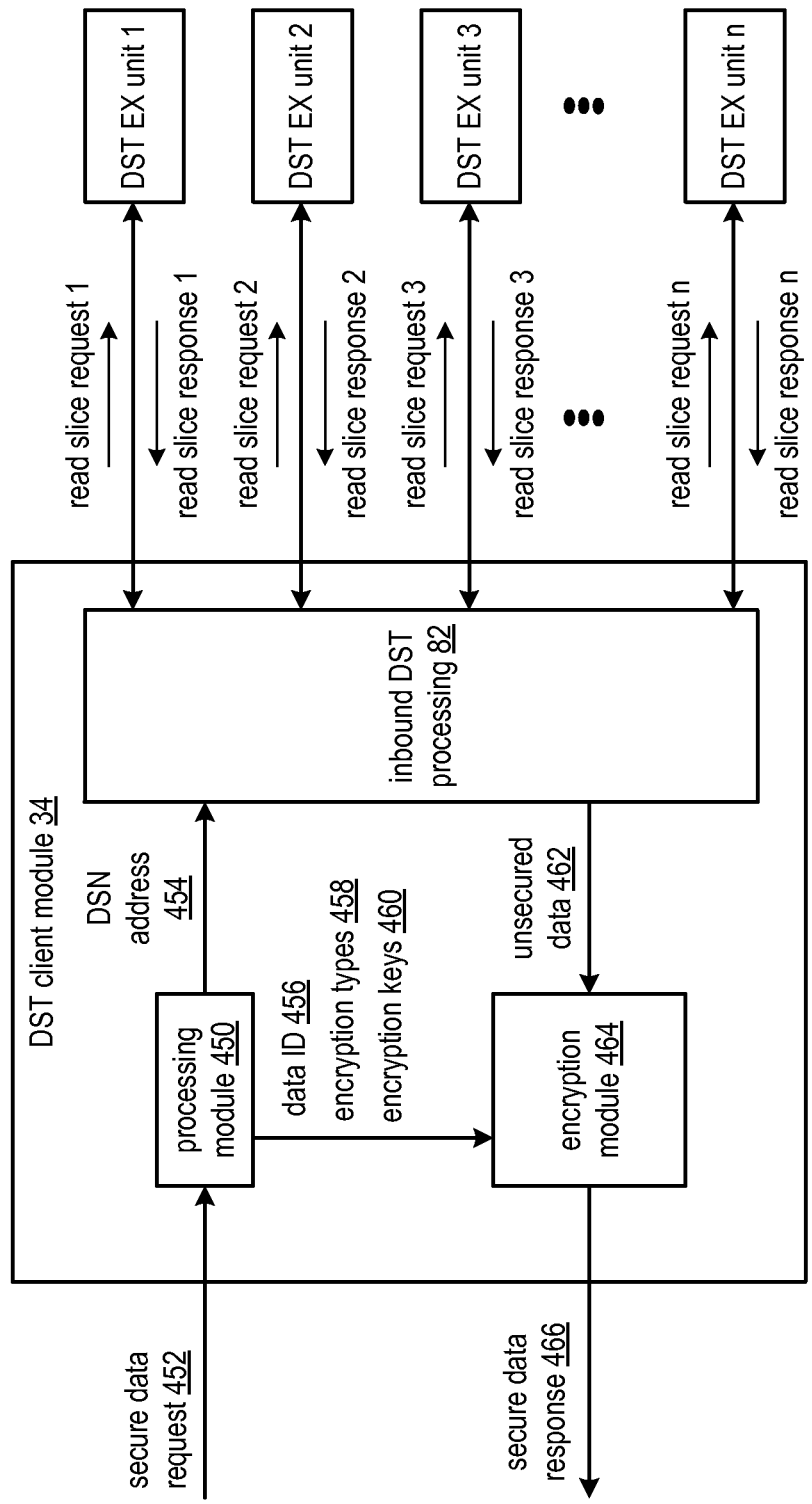
FIG. 46A is a schematic block diagram of another embodiment of a dispersed storage network in accordance with the present invention.

FIG. 46A is a schematic block diagram of another embodiment of a dispersed storage network that includes the distributed storage and task (DST) client module 34 and a set of DST execution units 1-n of FIG. 1. The DST client module 34 includes the inbound DST processing 82 of FIG. 3, a processing module 450, and an encryption module 464. The system functions to securely provide data recovered from the set of DST execution units 1-n. In an example of operation, the processing module 450 receives a secure data request 452. The secure data request 452 includes one or more of a data identifier (ID) 456 of the data, and encryption type 458 for securing the data, a key derivation algorithm ID, a key length, and key derivation information (e.g., a password). The processing module 450 generates a DSN address 454 based on the data ID 456. For example, the processing module 450 accesses at least one of a dispersed hierarchical index and a dispersed storage network (DSN) directory using the data ID 456 to retrieve the DSN address 454.

The inbound DST processing 82 retrieves at least a decode threshold number of encoded data slices for each set of encoded data slices of the data from the set of DST execution units 1-n using the DSN address 454. For example, the inbound DST processing 82, for each set of encoded data slices, generates a set of slice names based on the DSN address 454, issues at least a read threshold number of read slice requests that includes a corresponding read threshold number of slice names to the set of DST execution units, and receives at least a decode threshold number of read slice responses that includes the decode threshold number of encoded data slices. For each set of encoded data slices, the inbound DST processing 82 decodes the decode threshold number of encoded data slices to reproduce unsecured data 462.

The processing module 450 generates a first encryption key 460 based on the secure data request 452. The generating includes performing a key derivation algorithm using key derivation information of the request in accordance with the key length of the request to produce the first encryption key 460. For example, the processing module 450 performs a deterministic function on the password and the data ID 456 to generate the first encryption key 460. The deterministic function includes one or more of a hashing function, a hash-based message authentication code function, a mask generating function, and a sponge function. The processing module 450 generates a second encryption key 460 based on the secure data request 452. The generating of the second encryption key includes performing another key derivation algorithm using the key derivation information of the request in accordance with a second key length of the request to produce the second encryption key 460. For example, the processing module 450 performs another deterministic function on the password and the data ID 456 in accordance with the second key length of the request to produce the second encryption key 460.

The encryption module 464 encrypts the data ID 456 using the first encryption key 460 in accordance with a first encryption algorithm type of the request to produce an encrypted data ID. The encryption module 464 encrypts the encrypted data ID and the unsecured data 462 using the second encryption key in accordance with a second encryption algorithm type of the request to produce an encrypted container. The encryption module issues a secure data response 466 to a requesting entity that includes the encrypted container.

Figure 46B:
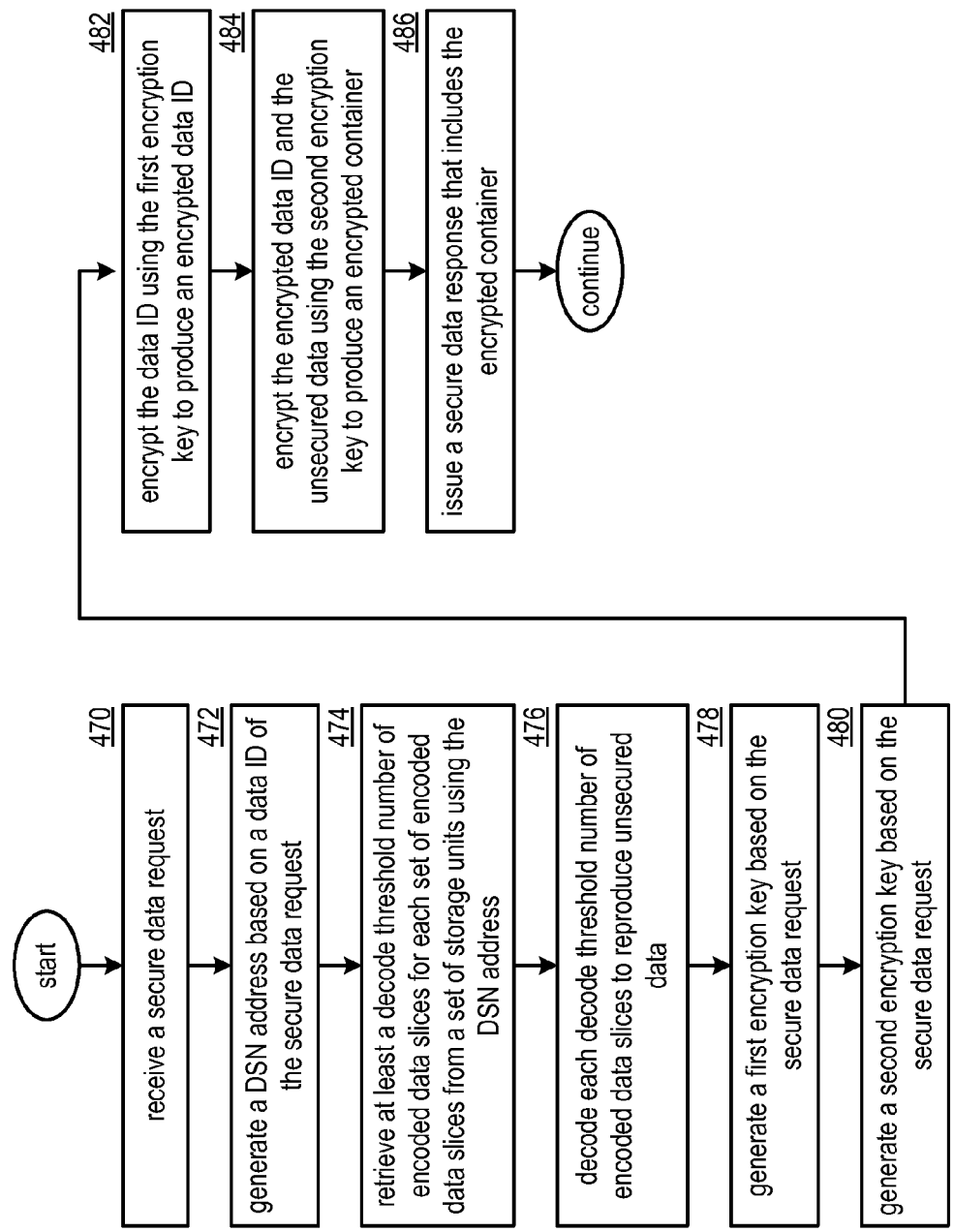
FIG. 46B is a flowchart illustrating an example of securely receiving data in accordance with the present invention.

FIG. 46B is a flowchart illustrating an example of securely receiving data. The method includes step 470 where a processing module (e.g., of a distributed storage and task (DST) client module) receives a secure data request. The method continues at step 472 where the processing module generates a DSN address based on a data identifier (ID) of the secure data request. The method continues at step 474 where the processing module retrieves at least a decode threshold number of encoded data slices for each set of encoded data slices from a set of storage units using the DSN address.

The method continues at step 476 where the processing module decodes each decode threshold number of encoded data slices using a dispersed storage error coding function to reproduce unsecured data. The method continues at step 478 where the processing module generates a first encryption key based on the secure data request. The generating includes extracting the data ID, a key derivation algorithm, a key length, and key derivation information including a password from the secure data request. The method continues at step 480 where the processing module generates a second encryption key based on the secure data request.

The method continues at step 482 where the processing module encrypts the data ID using the first encryption key to produce an encrypted data ID. Encryption includes encrypting the data ID utilizing a first encryption algorithm type of the secure data request. The method continues at step 484 where the processing module encrypts the encrypted data ID and the unsecured data using the second encryption key to produce an encrypted container. The encryption includes encrypting the encrypted data ID and the unsecured data utilizing a second encryption algorithm type of the secure data request. The second encryption algorithm type may be substantially the same as the first encryption algorithm type. The method continues at step 486 where the processing module issues a secure data response to a requesting entity that includes the encrypted container. As such, the secure data response does not include a visible data ID.

Figure 47A:
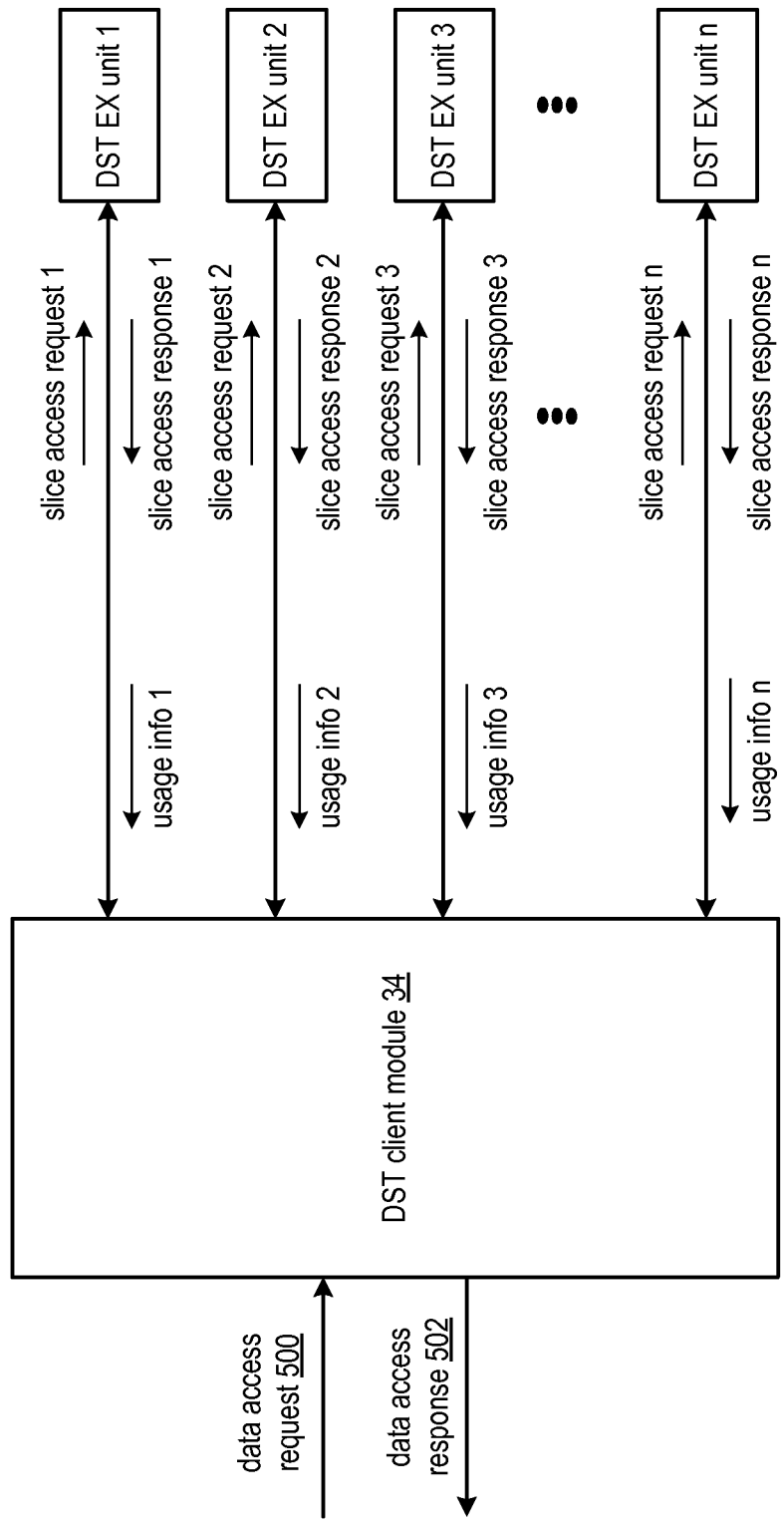
FIG. 47A is a schematic block diagram of another embodiment of a dispersed storage network in accordance with the present invention.

FIG. 47A is a schematic block diagram of another embodiment of a dispersed storage network includes the distributed storage and task (DST) client module 34 and a set of DST execution units 1-n of FIG. 1. Alternatively, or in addition to, the network may include two or more sets of DST execution units. In an embodiment, the dispersed storage and task (DST) processing unit 16 includes at least one module, when operable within a computing device, that causes the computing device to perform the following method steps: receiving a data access request; determining an estimated end of life for a plurality of DST execution units; selecting a subset of the plurality of DST execution units, based on a threshold number associated with the data access request and further based on the estimated end of life for the subset of the plurality of DST execution units; and executing the data access request via the subset of the plurality of DST execution units.

The step of determining the estimated end of life for the plurality of DST execution units can include: obtaining usage information for the plurality of DST execution units to determine an amount of operation time used for the plurality of DST execution units; and determining the estimated end of life for the plurality of DST execution units based on a difference between an estimated service life and the amount of operation time used for the plurality of DST execution units. The estimated end of life for the plurality of DST execution units can be determined based on historical records.

The step of determining the estimated end of life for the plurality of DST execution units can include: sending a query to the plurality of DST execution units; and receiving estimated life data from the plurality of DST execution units. The step of determining the estimated the estimated end of life for the plurality of DST execution units can include: sending a query to the plurality of DST execution units; and receiving estimated life data from the plurality of DST execution units. The estimate life data can include at least one of: usage information, or an estimated amount of operation time to end of life.

Selecting the subset of the plurality of DST execution units can include determining ones of the plurality of DST execution units having a highest amount of time remaining until the estimated end of life. Selecting the subset of the plurality of DST execution units can include selecting ones of the plurality of DST execution units in proportion to an amount of time remaining until the estimated end of life.

The method described above in conjunction with the DST processing unit 16 can alternatively be performed by other modules of a dispersed storage network, of a dispersed storage and tracking network or by other devices. In addition, at least one memory section that stores operational instructions can, when executed by one or more processing modules of one or more computing devices of a dispersed storage network (DSN), cause the one or more computing devices to perform any or all of the method steps described above.

In an example of operation, the DST client module 34 receives a data access request 500 (e.g., write, read, etc.). The DST client module 34 identifies one or more sets of DST execution units that includes the set of DST execution units 1-n, where the one or more sets of DST execution units are associated with storage of multiple sets of encoded data slices. Data objects sharing at least one common attribute are encoded using a dispersed storage error coding function to produce each of the multiple sets of encoded data slices. The common attribute includes at least one of a common identifier (ID), a common owner, associated with a common virtual storage vault, associated with multiple generations of a common data object, and associated with multiple versions of the common data object.

The DST client module 34 obtains usage information from the one or more sets of DST execution units. For each DST execution unit, the usage information includes one or more of an amount of cumulative operational time of the DST execution unit, a rated life expectancy amount of time for the DST execution unit, and estimated amount of operational time until end-of-life of the DST execution unit. The obtaining includes at least one of initiating a query, receiving usage information, interpreting historical records, and receiving an error message. The DST client module 34 determines an estimated amount of time to end-of-life for each DST execution unit based on the usage information.

The DST client module 34 determines a threshold number of required DST execution units to process the data access request. For example, the DST client module 34 indicates a read threshold number of DST execution units are required when the data access request includes a read request. As another example, the DST client module 34 indicates a write threshold number of DST execution units are required when the data access request includes a write request. The DST client module 34 selects the threshold number of DST execution units from a common set of DST execution units of the one or more DST execution units based on the threshold number and an associated estimated amount of time to end-of-life in accordance with a selection scheme. For example, the DST client module 34 selects the threshold number of DST execution units associated with a maximum estimated amount of time to end-of-life when the selection scheme includes maximizing time to end-of-life.

As another example, the DST client module 34 selects the threshold number of DST execution units in accordance with a pattern where the pattern includes selection in proportion to an associated estimated amount of time to end-of-life. For instance, if a first DST execution unit is utilizing memory devices that have used 3,000 out of a total of 5,000 supported hours of active use and a second DST execution unit is using memory devices that have used 4,000 of 10,000 hours of active use, the DST client module 34 utilizes a pattern to reach the maximum level of wear at around the same time for all the drives. In particular, a first DST execution unit has (5,000-3,000)=2,000 hours left and the second DST execution unit has (10,000-4,000)=6,000 hours left. As such, the DST client module 34 sends access requests to the second DST execution unit three times as frequently (e.g., 3=6000/2000).

With the threshold number of DST execution units selected, the DST client module 34 facilitates processing of the data access request by the selected threshold number of DST execution units. For example, the DST client module 34 generates DSN addressing information based on the selected set of DST execution units that includes the threshold number of DST execution units. Next the DST client module 34 issues slice access requests to the selected threshold number of DST execution units using the DSN addressing information. The DST client module 34 receives slice access responses from at least some of the selected threshold number of DST execution units. The DST client module 34 issues a data access response 502 to a requesting entity based on the received slice access responses (e.g., write status, recovered data).

Figure 47B:
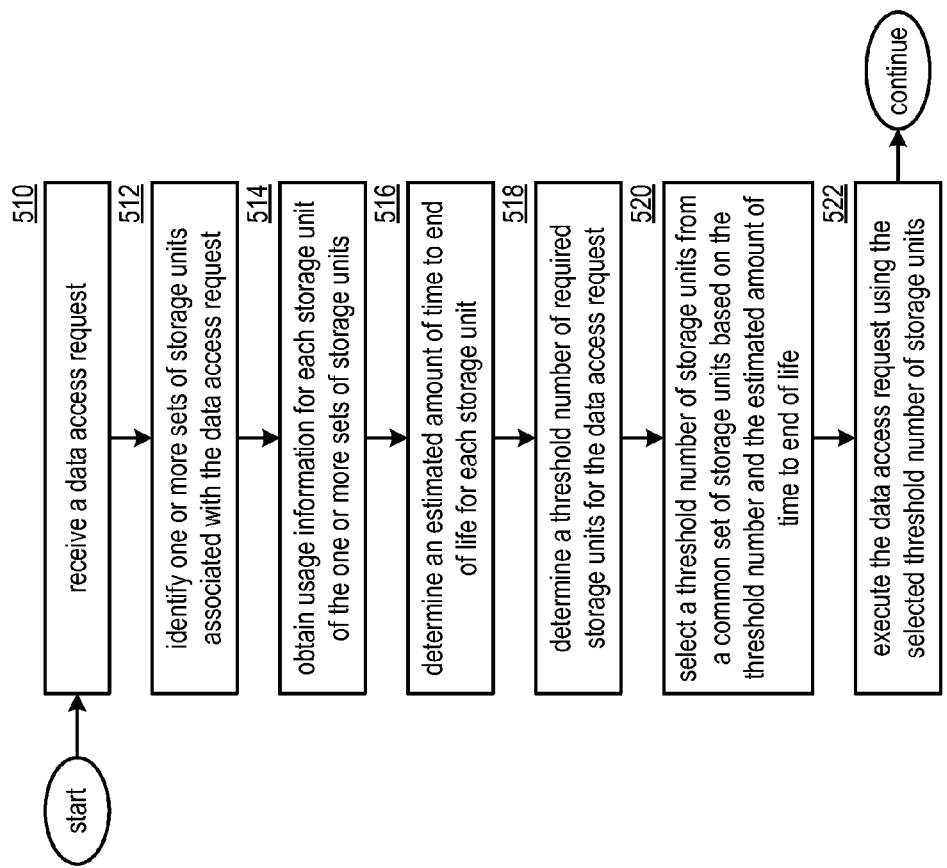
FIG. 47B is a flowchart illustrating an example of balancing storage unit utilization in accordance with the present invention.

FIG. 47B is a flowchart illustrating an example of balancing storage unit utilization. The method includes step 510 where a processing module (e.g., of a distributed storage and task (DST) client module) receives a data access request. The method continues at step 512 where the processing module identifies one or more sets of storage units associated with the data access requests. For example, the processing module utilizes a data identifier of the data access request to access a dispersed storage network (DSN) directory to retrieve a DSN address. Next, the processing module identifies the one or more sets of storage units based on the DSN address, where each set is associated with a portion of the DSN address (e.g., a generation number).

The method continues at step 514 where the processing module obtains usage information for each storage unit of the one or more sets of storage units. The method continues at step 516 where the processing module determines an estimated amount of time to end-of-life for each storage unit. As a specific example, the processing module obtains estimated service life and calculates a difference between estimated service life and an amount of operational time utilized so far to produce the estimated amount of time to end-of-life. As another specific example, the processing module receives the estimated amount of time to end-of-life from the storage unit. As yet another specific example, the processing module estimates the estimated amount of time to end-of-life for the storage unit based on historical records.

The method continues at step 518 where the processing module determines a threshold number of required storage units for the data access request. As a specific example, the processing module accesses registry information for a vault associated with the DSN address to identify dispersal parameters that includes a write threshold and a read threshold. The processing module selects the write threshold as the threshold number when the data access request includes a write request and selects the read threshold as the threshold number when the data access request includes a read request.

The method continues at step 520 where the processing module selects a threshold number of storage units from a common set of storage units based on the threshold number and the estimated amount of time to end-of-life in accordance with a selection scheme. As a specific example, the processing module selects the threshold number of storage units from a first set of storage units where each of the selected threshold number of storage units is associated with an estimated amount of time to end-of-life that is greater than estimated amount of time to end-of-life for other storage units. The method continues at step 522 where the processing module executes the data access request using the selected threshold number of storage units. As a specific example, the processing module modifies the DSN address based on the selected threshold number of storage units (e.g., in accordance with an associated generation number) to produce a modified DSN address and issues a threshold number of slice access requests to the selected threshold number of storage units utilizing the modified DSN address. The processing module receives slice access responses from at least some of the selected threshold number of storage units. Having received a sufficient number of slice access responses, the processing module issues a data access response to the requesting entity based on the received slice access responses.

Figure 48A:
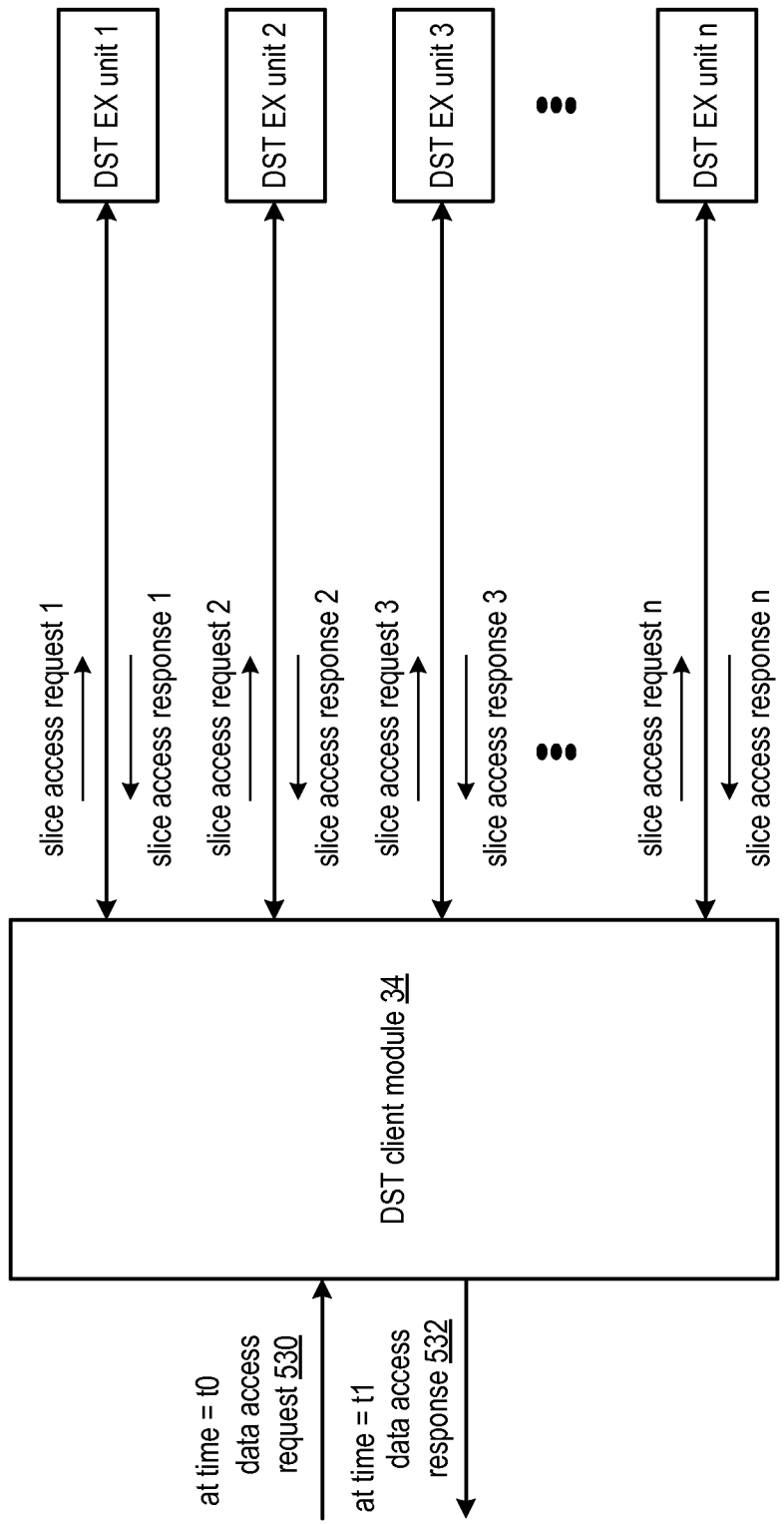
FIG. 48A is a schematic block diagram of another embodiment of a dispersed storage network in accordance with the present invention.

FIG. 48A is a schematic block diagram of another embodiment of a dispersed storage network includes the distributed storage and task (DST) client module 34 and a set of DST execution units 1-n of FIG. 1. In an example of operation, at a time t0, the DST client module 34 receives a data access request 530 (e.g., write, read, etc.). The DST client module 34 determines an access performance level of one or more previous data access requests. The access performance level includes at least one of a rolling average response time between receiving the previous data access request and responding with a previous data access response (e.g., 10 msec) and a standard deviation of the response time (e.g., 95% of response times are within 8-12 msec). For instance, a response time for the present data access request includes a difference between outputting of a corresponding data access response at time t1 and the receipt of the data access request at time t0. The DST client module 34 performs the determining based on one or more of initiating a query, receiving a query response, interpreting historical record, and performing a test.

Having determined the access performance level, the DST client module 34 schedules processing of the data access request in accordance with the access performance level and a desired access performance level. The scheduling includes identifying a subsequent time frame to initiate processing of the data access request. As a specific example, the DST client module schedules the processing of the data access request with the desired access performance levels to include no more than 99% of the circle response times are to be longer than 120 ms. Such scheduling may constrain throughput of data access request processing in favor of improved access performance.

When the scheduling indicates that the data access is to be executed, the DST client module 34 facilitates execution of the data access request 530. For example, the DST client module 34 issues a set of slice access requests 1-n to the set of DST execution units, receives slice access responses of a set of slice access responses 1-n, and issues the data access response to a requesting entity at time t1 based on the received slice access responses. When the DST client module 34 detects that the access performance level does not achieve the desired access performance level for a given timeframe (e.g., a performance difference is outside of a performance difference threshold level), the DST client module 34 implements an alternate throughput scheme based on the performance difference. For example, the DST client module implements one or more throughput reduction procedures when the access performance level is less than the desired access performance level (e.g., response time greater than desired, standard deviation response time greater than desired). The one or more throughput reduction procedures includes rejecting a future data access request, redirecting at least one data access request to another DST client module, and delaying the issuing of the data access response 532 to the requesting entity.

Figure 48B:
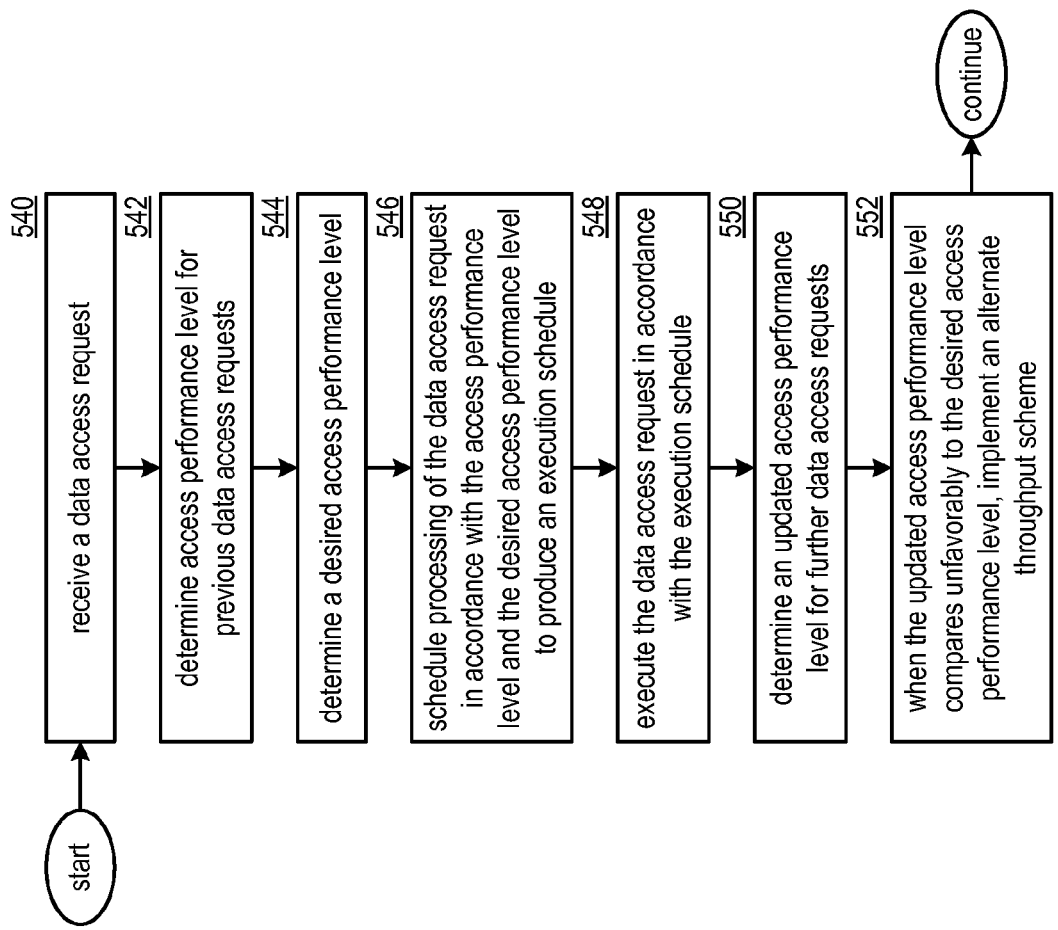
FIG. 48B is a flowchart illustrating an example of adjusting data access throughput in accordance with the present invention.

FIG. 48B is a flowchart illustrating an example of adjusting data access throughput, which include similar steps to FIG. 47B. The method begins with the step 540 of FIG. 47B where a processing module (e.g., of a distributed storage and task (DST) client module) receives a data access request. The method continues at step 542 where the processing module determines access performance level for previous data access requests. The method continues at step 544 where the processing module determines a desired access performance level. The determining includes at least one of utilizing a predetermination, receiving a user input, obtaining a requesting entity input, and utilizing an access performance level associated with a previous data access request.

The method continues at step 546 where the processing module schedules processing of the data access request in accordance with the access performance level and the desired access performance level to produce an execution schedule. The method continues at step 548 where the processing module executes the data access request in accordance with the execution schedule. The method continues at step 550 where the processing module determines an updated access performance level for further data access requests. As a specific example, the processing module determines the updated access performance level for a wider selection of data access requests. As another specific example, the processing module determines the updated access performance level for a narrower selection of data access requests. As yet another specific example, the processing module determines the updated access performance level for previous data access requests including a data access request.

When the updated access performance level compares unfavorably to the desired access performance level, the method continues at step 552 where the processing module implements an alternate throughput scheme. As a specific example, the processing module indicates that the updated access performance level compares unfavorably to the desired access performance level when the updated access performance level is less than the desired access performance level. The implementing includes determining whether to increase or decrease throughput of data access requests being processed into data access responses. As a specific example, the processing module determines to increase throughput (e.g., to schedule more data access requests within a given timeframe) when the updated access performance level is greater than the desired access performance level by a performance difference threshold level. As another specific example, the processing module determines to decrease throughput (e.g., to schedule fewer data access requests within the given timeframe) when the updated access performance level is less than the desired access performance level by the performance difference threshold level.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that steps presented can optionally be incorporated in or otherwise used in conjunction with other routines. In this context, "start" indicates the beginning of the first step presented and may be preceded by other activities not specifically shown. Further, the "continue" indication reflects that steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a dispersed storage and task (DST) network, the method comprises:
   receiving, via the DST network, a data access request from another computing device, wherein the data access request corresponds to a data object;
   determining an estimated end of life for a plurality of DST execution units that store a plurality of encoded data slices (EDSs) associated with the data object, wherein the data object is segmented into a plurality of data segments, wherein a data segment of the plurality of data segments is dispersed error encoded in accordance with dispersed storage error encoding function parameters to produce a set of encoded data slices (EDSs) of the plurality of EDSs, wherein the set of EDSs are distributedly stored among at least some of the plurality of DST execution units, wherein a decode threshold number of EDSs within the set of EDSs are needed to recover the data segment, wherein a read threshold number of EDSs within the set of EDSs provides for retrieval of the data segment, and wherein a write threshold number of EDSs within the set of EDSs provides for storage of the data segment;

selecting a subset of the plurality of DST execution units, based on a threshold number associated with the data access request and further based on the estimated end of life for the subset of the plurality of DST execution units; wherein the threshold number corresponds to at least one of the decode threshold number, the read threshold number, or the write threshold number; and executing the data access request via the subset of the plurality of DST execution units including transmitting, via the DST network, the data access request to the subset of the plurality of DST execution units to be processed by the subset of the plurality of DST execution units and receiving responses from the plurality of DST execution units based on the subset of the plurality of DST execution units processing the data access request.

2. The method of claim 1 wherein determining the estimated end of life for the plurality of DST execution units includes:

obtaining usage information for the plurality of DST execution units to determine an amount of operation time used for the plurality of DST execution units; and determining the estimated end of life for the plurality of DST execution units based on a difference between an estimated service life and the amount of operation time used for the plurality of DST execution units.

3. The method of claim 1 wherein the estimated end of life for the plurality of DST execution units is determined based on historical records.

4. The method of claim 1 wherein determining the estimated end of life for the plurality of DST execution units includes:

sending a query to the plurality of DST execution units; and receiving estimated life data from the plurality of DST execution units.

5. The method of claim 1 wherein determining the estimated end of life for the plurality of DST execution units includes:

sending a query to the plurality of DST execution units; and receiving estimated life data from the plurality of DST execution units; and wherein the estimate life data includes at least one of: usage information, or an estimated amount of operation time to end of life.

6. The method of claim 1 wherein selecting the subset of the plurality of DST execution units includes determining ones of the plurality of DST execution units having a highest amount of time remaining until the estimated end of life.

7. The method of claim 1 wherein selecting the subset of the plurality of DST execution units includes selecting ones of the plurality of DST execution units in proportion to an amount of time remaining until the estimated end of life.

8. A dispersed storage and task (DST) processing unit comprises:

at least one module, when operable within a computing device, that causes the computing device to:

receive, via a dispersed storage and task (DST) network, a data access request from a computing device, wherein the data access request corresponds to a data object;

determine an estimated end of life for a plurality of DST execution units that store a plurality of encoded data slices (EDSs) associated with the data object, wherein the data object is segmented into a plurality of data segments, wherein a data segment of the plurality of data segments is dispersed error encoded in accordance with dispersed storage error encoding function parameters to produce a set of encoded data slices (EDSs) of the plurality of EDSs, wherein the set of EDSs are distributedly stored among at least some of the plurality of DST execution units, wherein a decode threshold number of EDSs within the set of EDSs are needed to recover the data segment, wherein a read threshold number of EDSs within the set of EDSs provides for retrieval of the data segment, and wherein a write threshold number of EDSs within the set of EDSs provides for storage of the data segment;

select a subset of the plurality of DST execution units, based on a threshold number associated with the data access request and further based on the estimated end of life for the subset of the plurality of DST execution units; wherein the threshold number corresponds to at least one of the decode threshold number, the read threshold number, or the write threshold number; and execute the data access request via the subset of the plurality of DST execution units including to transmit, via the DST network, the data access request to the subset of the plurality of DST execution units to be processed by the subset of the plurality of DST execution units and receive responses from the plurality of DST execution units based on the subset of the plurality of DST execution units processing the data access request.

9. The DST processing unit of claim 8 wherein determining the estimated end of life for the plurality of DST execution units includes:

obtaining usage information for the plurality of DST execution units to determine an amount of operation time used for the plurality of DST execution units; and determining the estimated end of life for the plurality of DST execution units based on a difference between an estimated service life and the amount of operation time used for the plurality of DST execution units.

10. The DST processing unit of claim 8 wherein the estimated end of life for the plurality of DST execution units is determined based on historical records.

11. The DST processing unit of claim 8 wherein determining the estimated end of life for the plurality of DST execution units includes:

sending a query to the plurality of DST execution units; and receiving estimated life data from the plurality of DST execution units.

12. The DST processing unit of claim 8 wherein determining the estimated end of life for the plurality of DST execution units includes:

sending a query to the plurality of DST execution units; and receiving estimated life data from the plurality of DST execution units; and wherein the estimate life data includes at least one of: usage information, or an estimated amount of operation time to end of life.

13. The DST processing unit of claim 8 wherein selecting the subset of the plurality of DST execution units includes determining ones of the plurality of DST execution units having a highest amount of time remaining until the estimated end of life.

14. The DST processing unit of claim 8 wherein selecting the subset of the plurality of DST execution units includes selecting ones of the plurality of DST execution units in proportion to an amount of time remaining until the estimated end of life.

15. A non-transitory computer readable storage medium comprises:
- at least one memory section that stores operational instructions that, when executed by one or more processing modules of one or more computing devices of a dispersed storage and task (DST) network, causes the one or more computing devices to:
- receive, via the DST network, receive a data access request from another computing device, wherein the data access request corresponds to a data object;
- determine an estimated end of life for a plurality of DST execution units that store a plurality of encoded data slices (EDSs) associated with the data object, wherein the data object is segmented into a plurality of data segments, wherein a data segment of the plurality of data segments is dispersed error encoded in accordance with dispersed storage error encoding function parameters to produce a set of encoded data slices (EDSs) of the plurality of EDSs, wherein the set of EDSs are distributedly stored among at least some of the plurality of DST execution units, wherein a decode threshold number of EDSs are needed to recover the data segment, wherein a read threshold number of EDSs provides for a read favorable number of EDSs for retrieval of the data segment, wherein a write threshold number of EDSs provides for a write favorable number of the set of EDSs;
- select a subset of the plurality of DST execution units, based on a threshold number associated with the data access request and further based on the estimated end of life for the subset of the plurality of DST execution units; wherein the threshold number corresponds to at least one of the decode threshold number, the read threshold number, or the write threshold number; and
- execute the data access request via the subset of the plurality of DST execution units including to transmit, via the DST network, the data access request to the subset of the plurality of DST execution units to be processed by the subset of the plurality of DST execution units and to receive responses from the plurality of DST execution units based on the subset of the plurality of DST execution units processing the data access request.

16. The non-transitory computer readable storage medium of claim 15 wherein determining the estimated end of life for the plurality of DST execution units includes:
- obtaining usage information for the plurality of DST execution units to determine an amount of operation time used for the plurality of DST execution units; and
- determining the estimated end of life for the plurality of DST execution units based on a difference between an estimated service life and the amount of operation time used for the plurality of DST execution units.

17. The non-transitory computer readable storage medium of claim 15 wherein determining the estimated end of life for the plurality of DST execution units includes:
- sending a query to the plurality of DST execution units; and
- receiving estimated life data from the plurality of DST execution units.

18. The non-transitory computer readable storage medium of claim 15 wherein determining the estimated end of life for the plurality of DST execution units includes:
- sending a query to the plurality of DST execution units; and
- receiving estimated life data from the plurality of DST execution units; and
- wherein the estimate life data includes at least one of: usage information, or an estimated amount of operation time to end of life.

19. The non-transitory computer readable storage medium of claim 15 wherein selecting the subset of the plurality of DST execution units includes determining ones of the plurality of DST execution units having a highest amount of time remaining until the estimated end of life.

20. The non-transitory computer readable storage medium of claim 15 wherein selecting the subset of the plurality of DST execution units includes selecting ones of the plurality of DST execution units in proportion to an amount of time remaining until the estimated end of life.

* * * * *